(12) United States Patent
Sugahara et al.

(10) Patent No.: US 11,507,316 B2
(45) Date of Patent: Nov. 22, 2022

(54) MEMORY DEVICE

(71) Applicant: Kioxia Corporation, Tokyo (JP)

(72) Inventors: Akio Sugahara, Yokohama Kanagawa (JP); Yuji Nagai, Sagamihara Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 34 days.

(21) Appl. No.: 17/091,005

(22) Filed: Nov. 6, 2020

(65) Prior Publication Data

US 2021/0055887 A1 Feb. 25, 2021

Related U.S. Application Data

(63) Continuation of application No. 16/245,445, filed on Jan. 11, 2019, now Pat. No. 10,860,250, which is a continuation of application No. PCT/JP2016/070741, filed on Jul. 13, 2016.

(51) Int. Cl.
| | | |
|---|---|---|
| *G06F 3/06* | (2006.01) | |
| *G06F 12/06* | (2006.01) | |
| *G11C 16/06* | (2006.01) | |
| *G06F 12/02* | (2006.01) | |
| *G11C 7/10* | (2006.01) | |
| *G11C 16/08* | (2006.01) | |
| *G11C 16/12* | (2006.01) | |
| *G11C 16/26* | (2006.01) | |

(52) U.S. Cl.
CPC ........ *G06F 3/0659* (2013.01); *G06F 12/0246* (2013.01); *G06F 12/06* (2013.01); *G11C 7/109* (2013.01); *G11C 7/1063* (2013.01); *G11C 16/06* (2013.01); *G11C 16/08* (2013.01); *G11C 16/12* (2013.01); *G11C 16/26* (2013.01)

(58) Field of Classification Search
CPC .................................................. G06F 12/046
See application file for complete search history.

(56) References Cited

U.S. PATENT DOCUMENTS

| | | | |
|---|---|---|---|
| 10,249,377 B2 | 4/2019 | Kasai et al. | |
| 2007/0198782 A1* | 8/2007 | Sved | G06F 13/1642 |
| | | | 711/154 |
| 2009/0267128 A1 | 10/2009 | Maejima | |
| 2009/0268522 A1 | 10/2009 | Maejima | |

(Continued)

FOREIGN PATENT DOCUMENTS

| | | |
|---|---|---|
| JP | 2011222084 A | 11/2011 |
| TW | 201437812 A | 10/2014 |
| TW | 201616274 A | 5/2016 |

OTHER PUBLICATIONS

International Search Report (ISR) dated Oct. 18, 2016 issued in International Application No. PCT/JP2016/070741.

(Continued)

*Primary Examiner* — Edward J Dudek, Jr.
(74) *Attorney, Agent, or Firm* — Hotz, Holtz & Volek PC

(57) ABSTRACT

A memory device includes a memory cell array configured to store data, a control circuit configured to control the memory cell array in response to a command; and a receiver configured to be placed in an active state based on a first signal, a second signal, or an operation result of an address and the command, and be enabled to receive a command or data.

20 Claims, 52 Drawing Sheets

(56) References Cited

U.S. PATENT DOCUMENTS

| | | |
|---|---|---|
| 2010/0207195 A1 | 8/2010 | Fukuzumi et al. |
| 2011/0161568 A1 | 6/2011 | Bruce et al. |
| 2011/0249512 A1 | 10/2011 | Mochizuki et al. |
| 2011/0284946 A1 | 11/2011 | Kiyotoshi |
| 2014/0036604 A1 | 2/2014 | Hah et al. |
| 2014/0347942 A1* | 11/2014 | Kim ............. G11C 16/08 365/193 |
| 2016/0126953 A1 | 5/2016 | Ishii et al. |
| 2020/0202958 A1 | 6/2020 | Sugahara et al. |

OTHER PUBLICATIONS

Written Opinion dated Oct. 18, 2016 issued in International Application No. PCT/JP2016/070741.

* cited by examiner

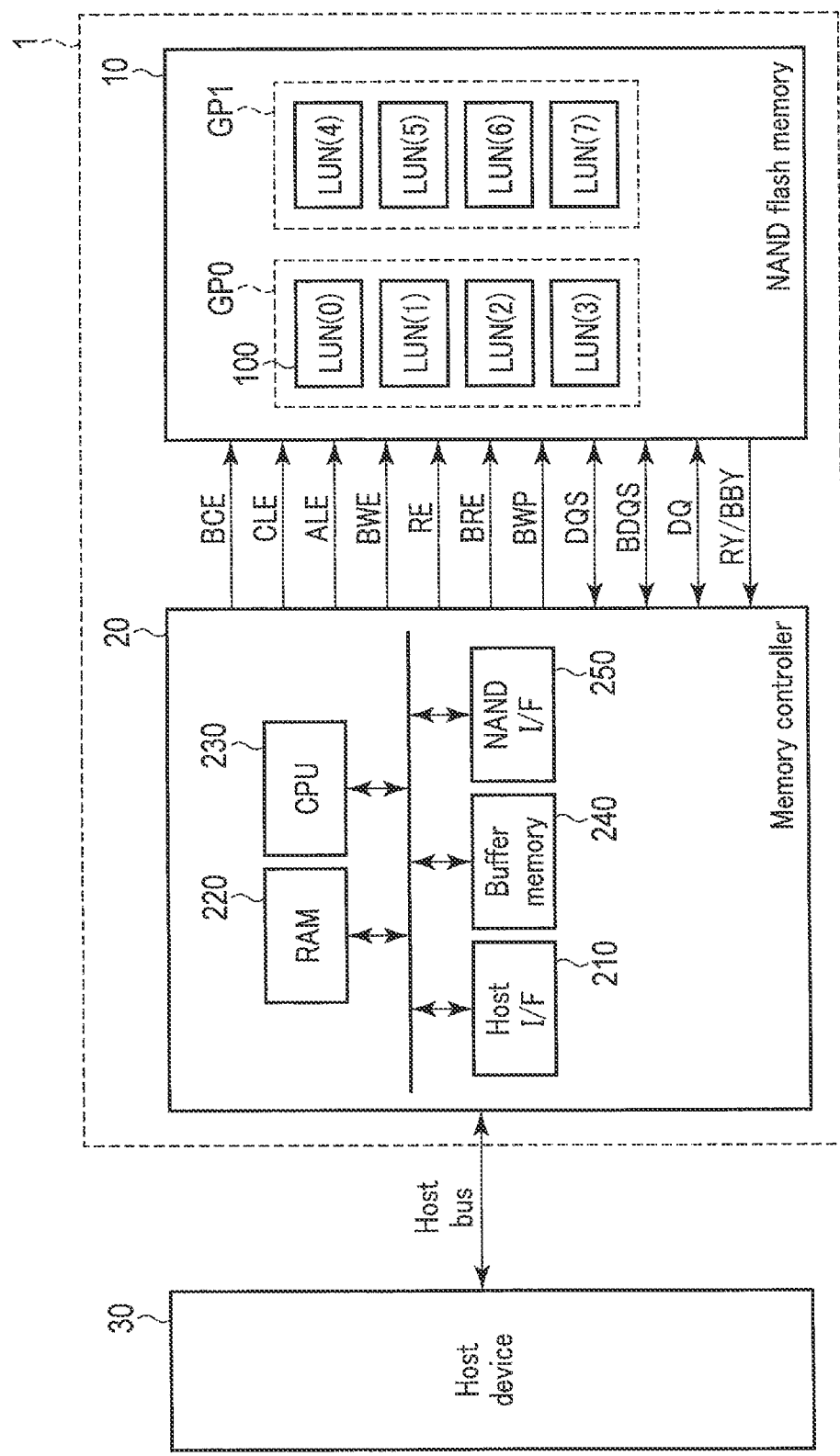
F I G. 1

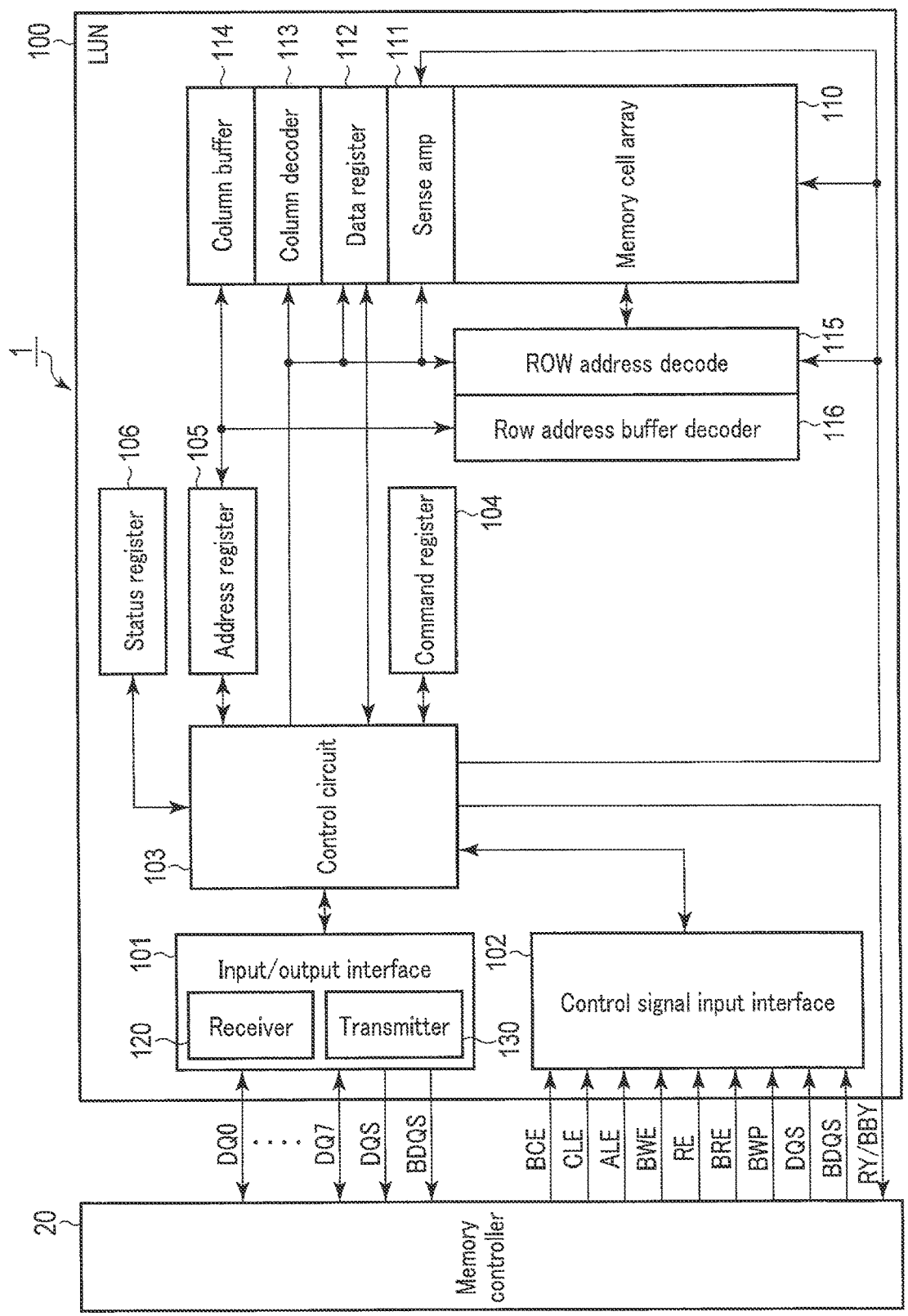
F I G. 2

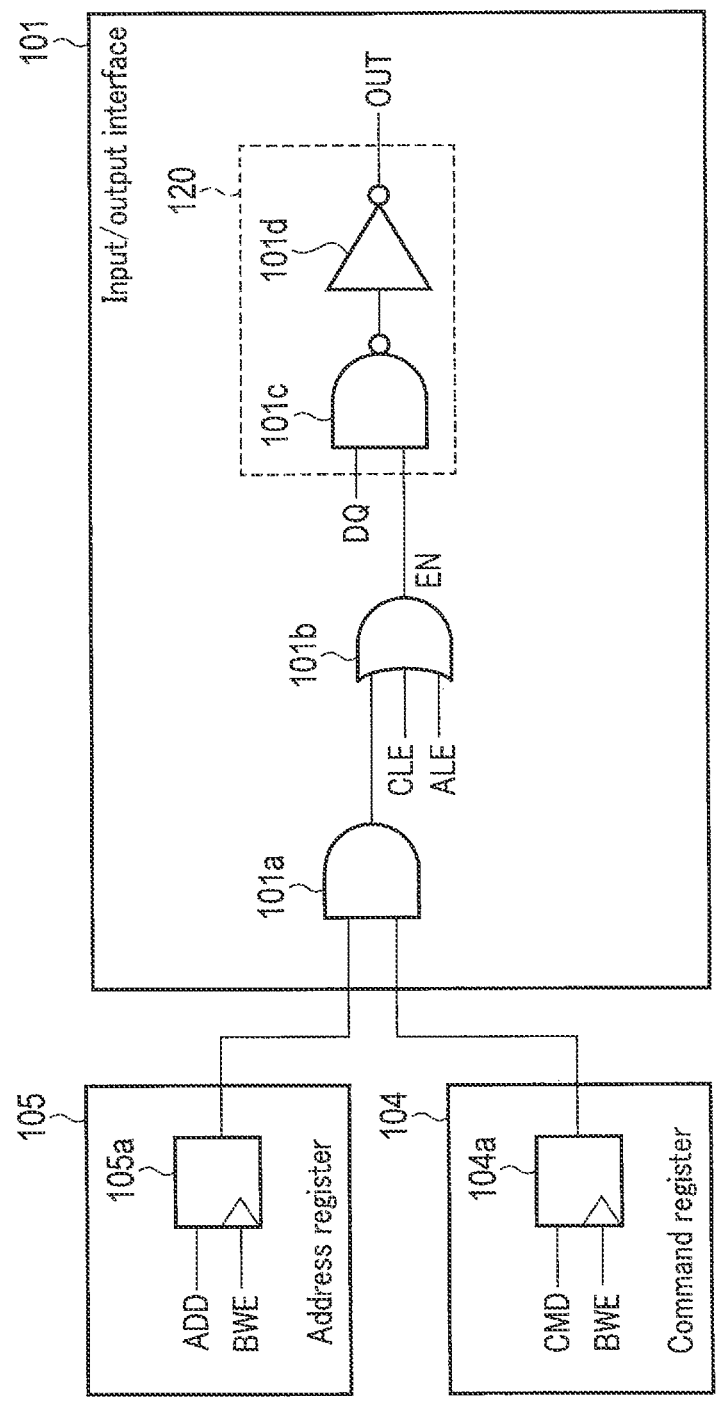
F I G. 3

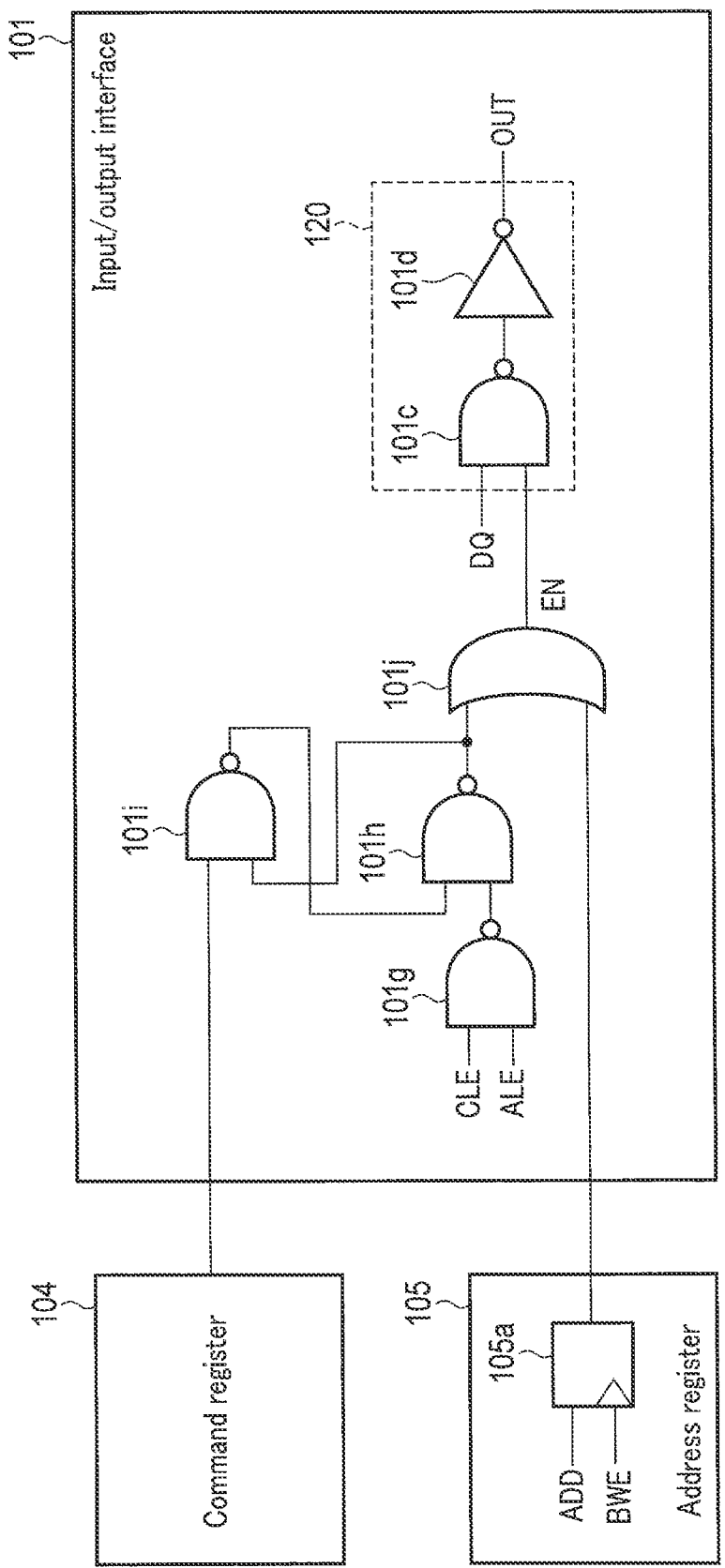
F I G. 7

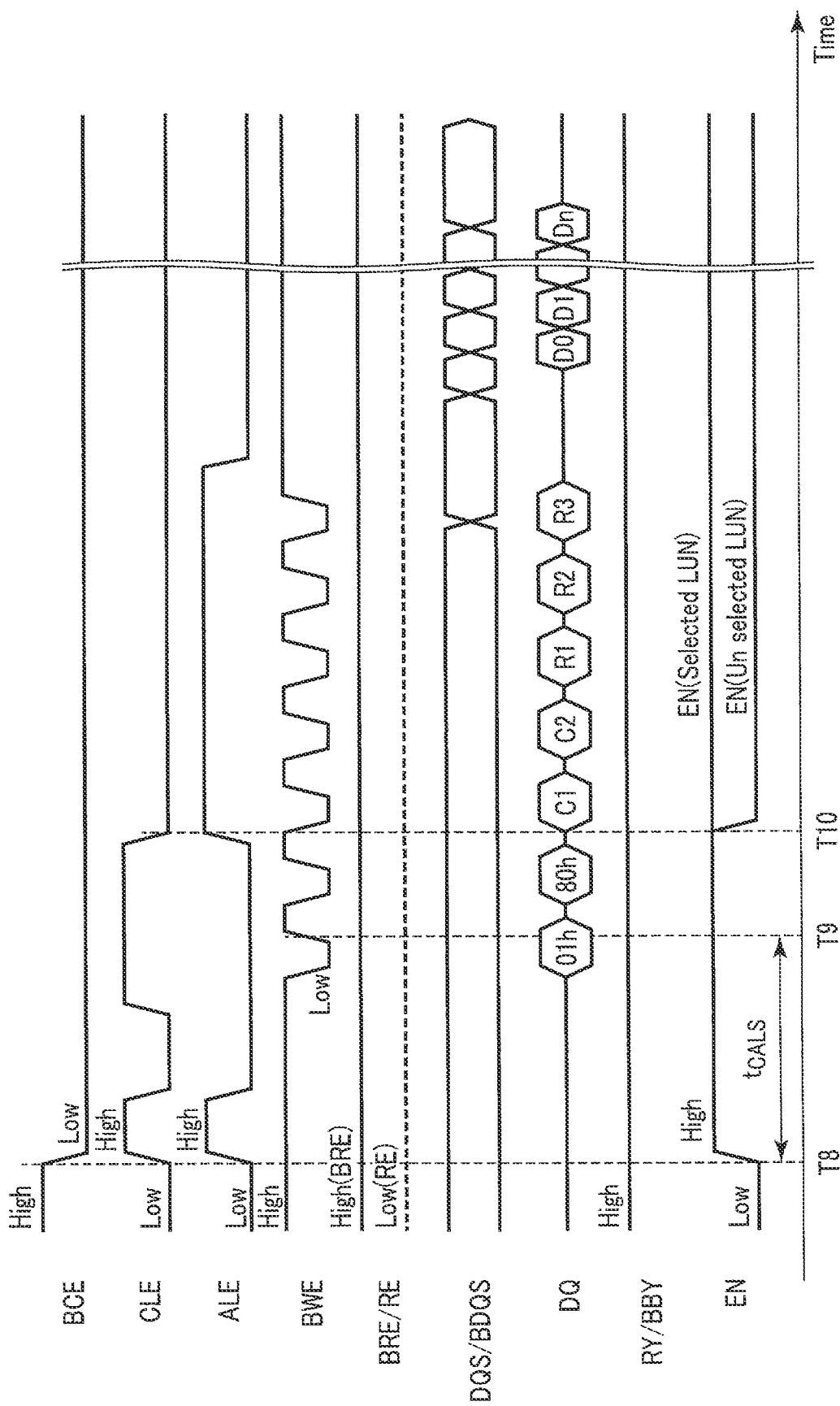
F I G. 8

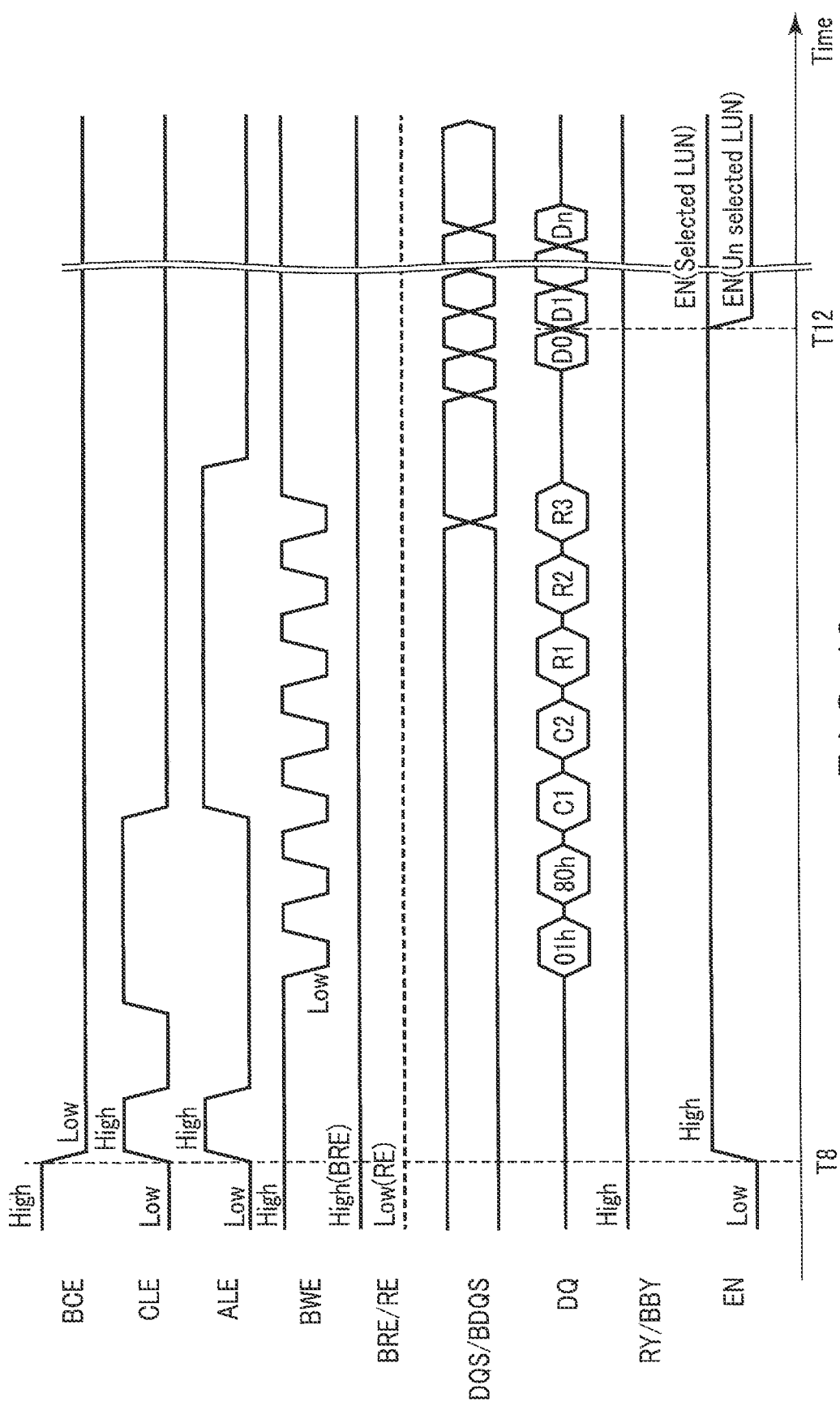
F I G. 10

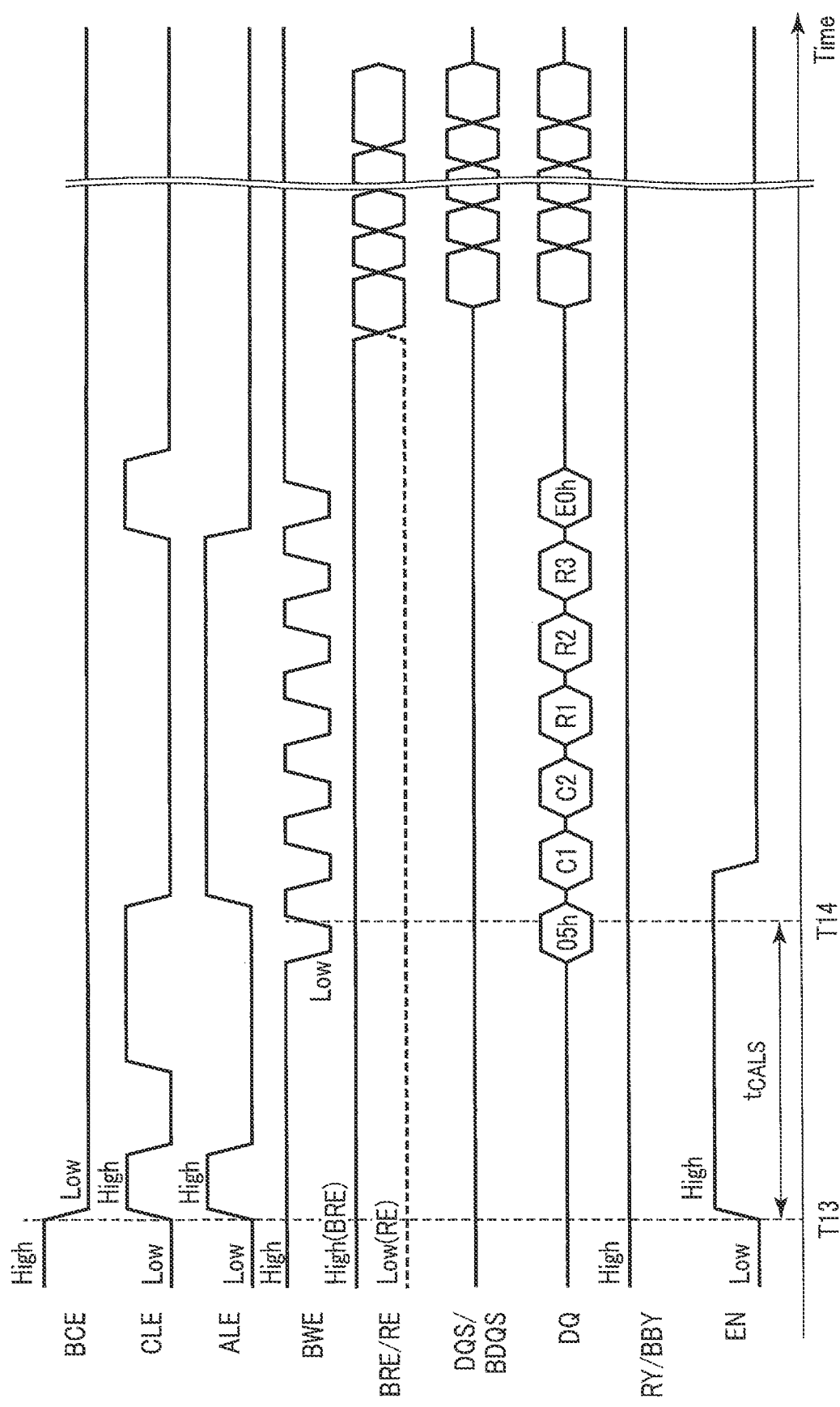
F I G. 11

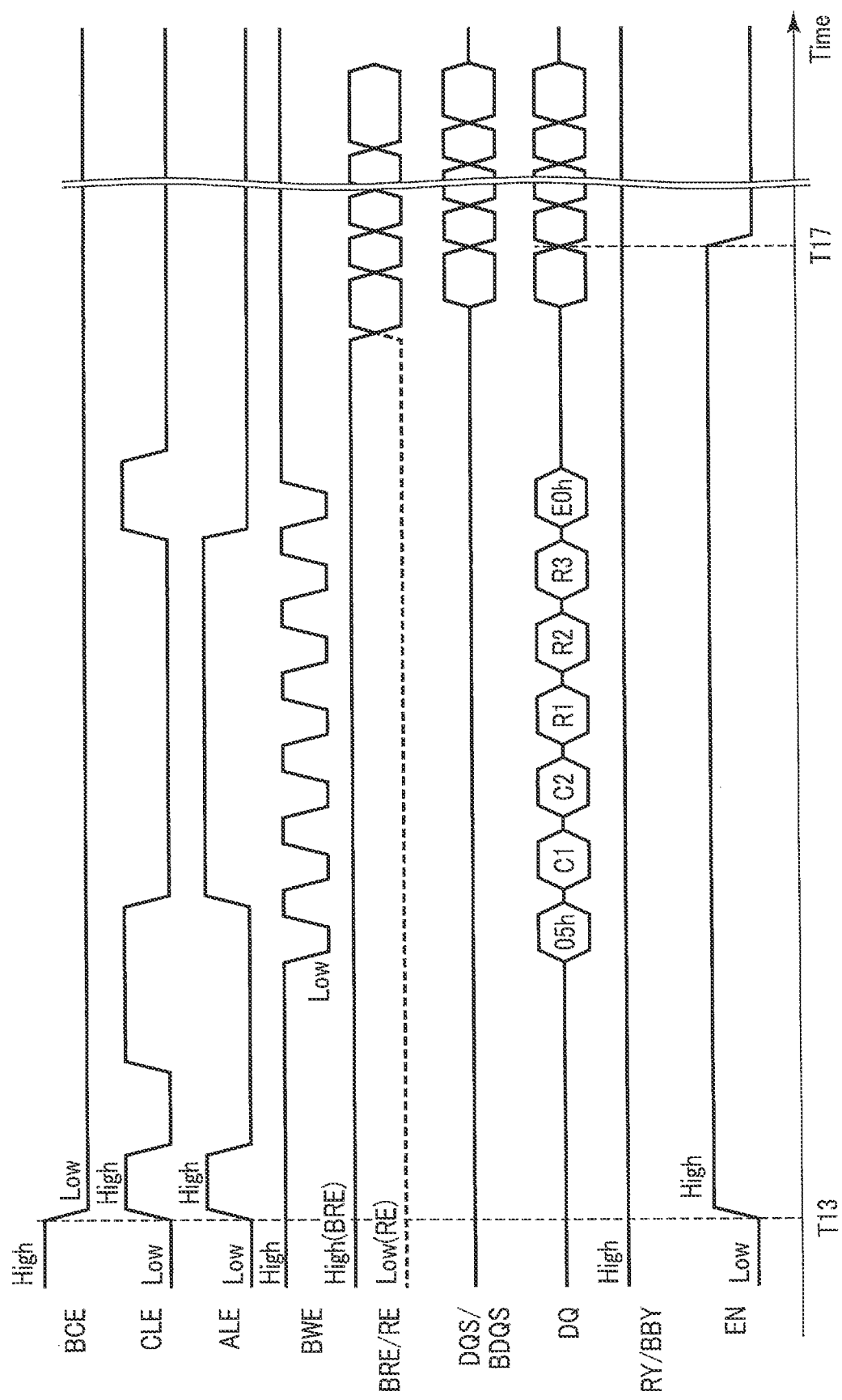
F I G. 14

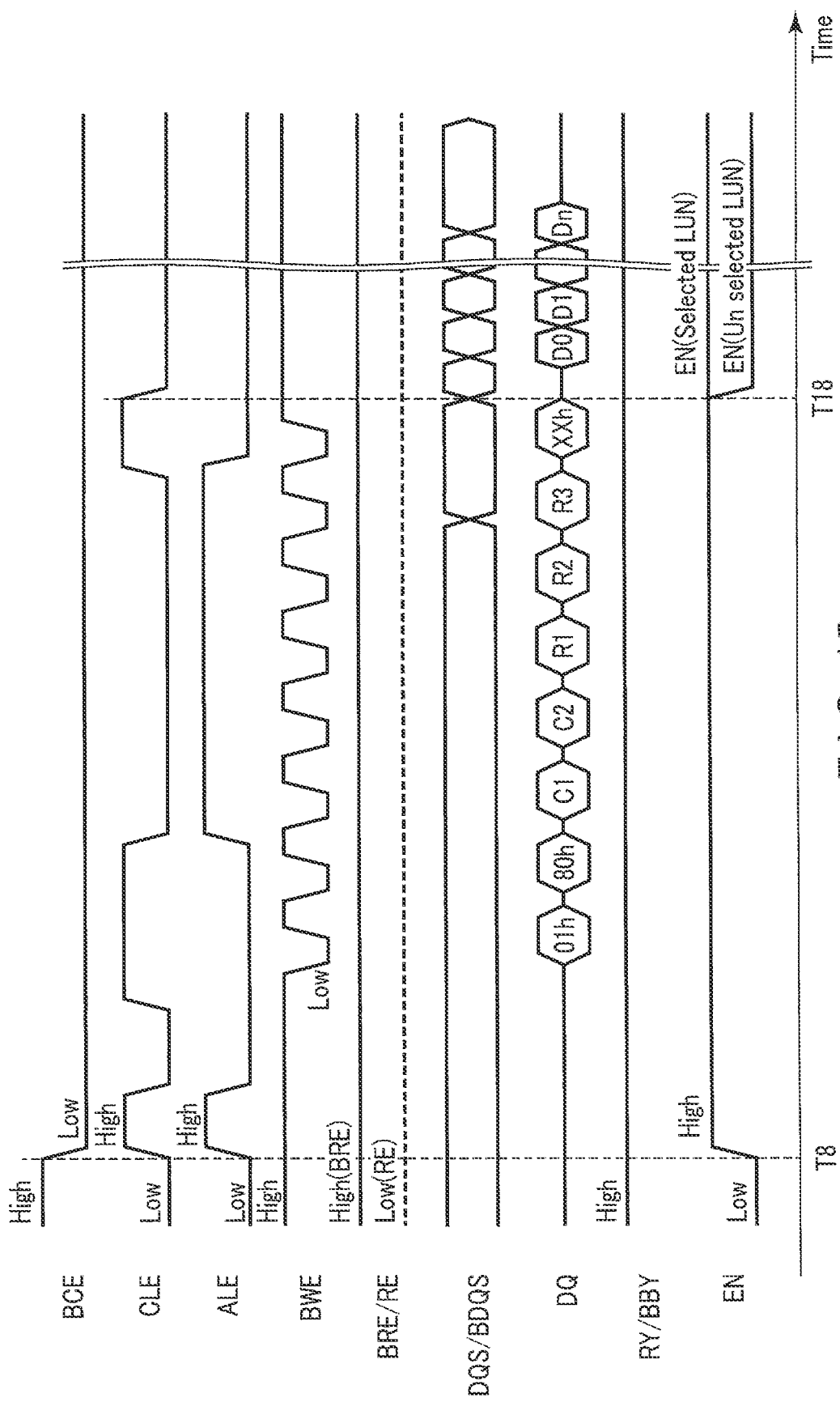
F I G. 15

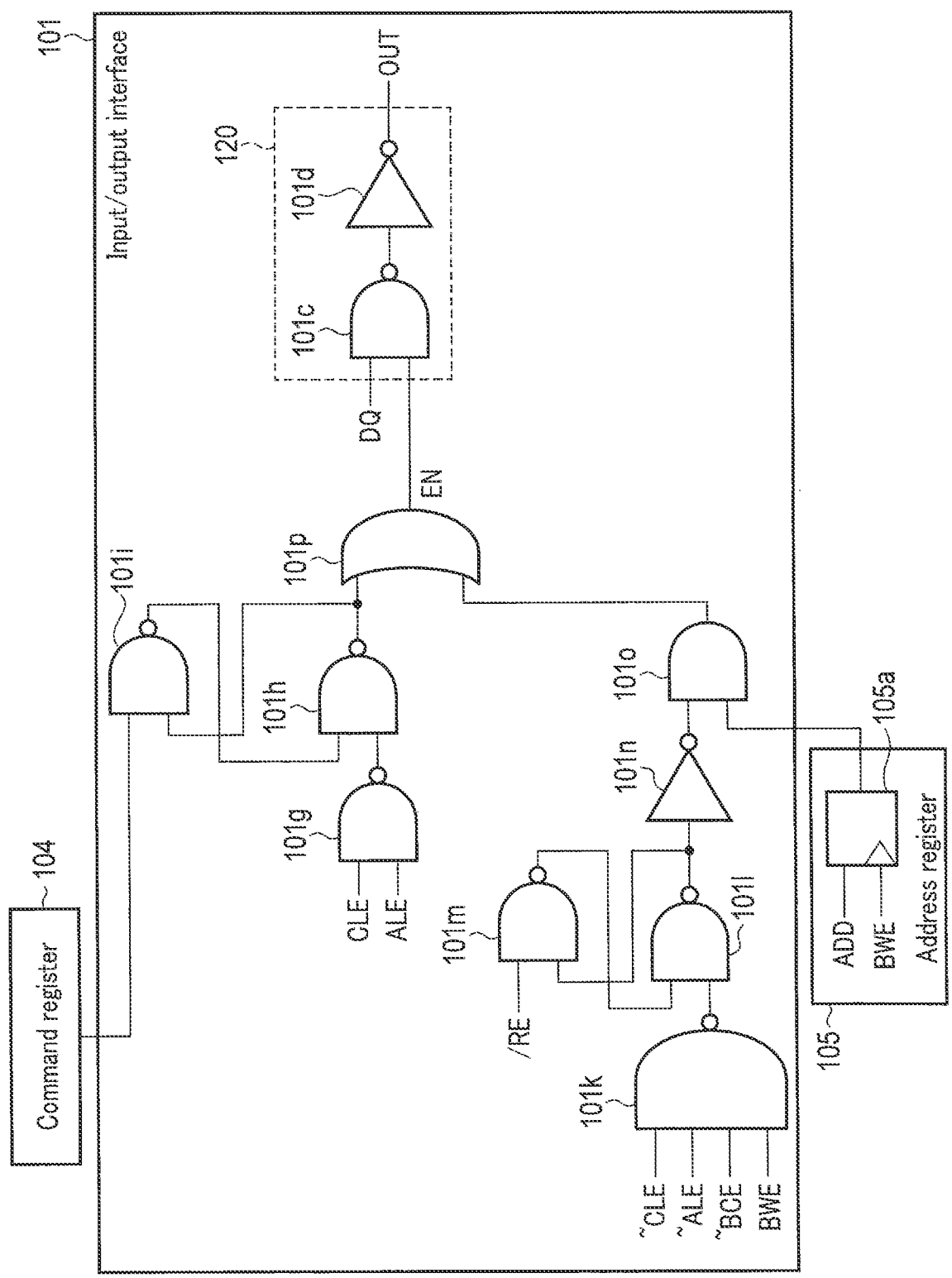
F I G. 17

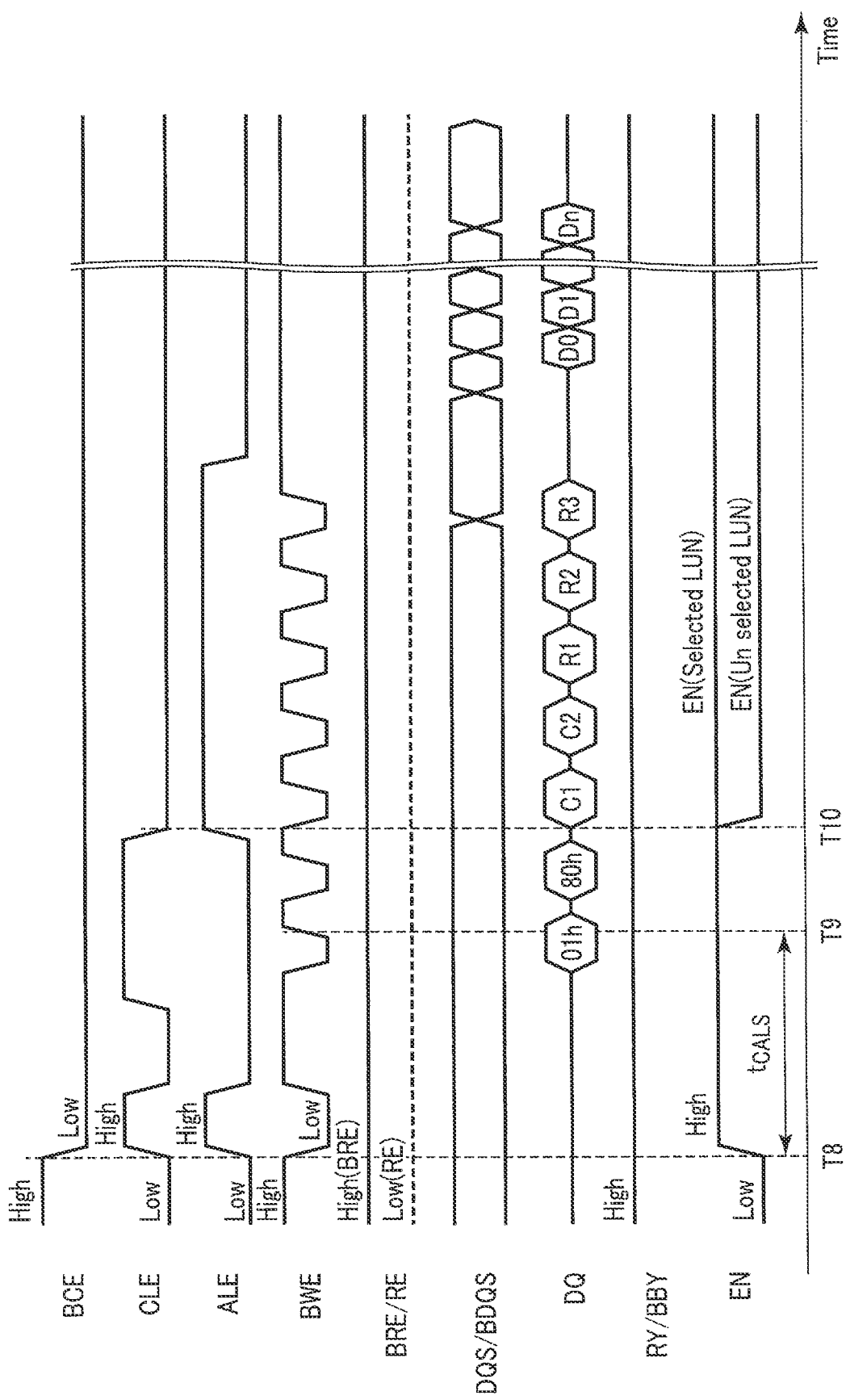
F I G. 19

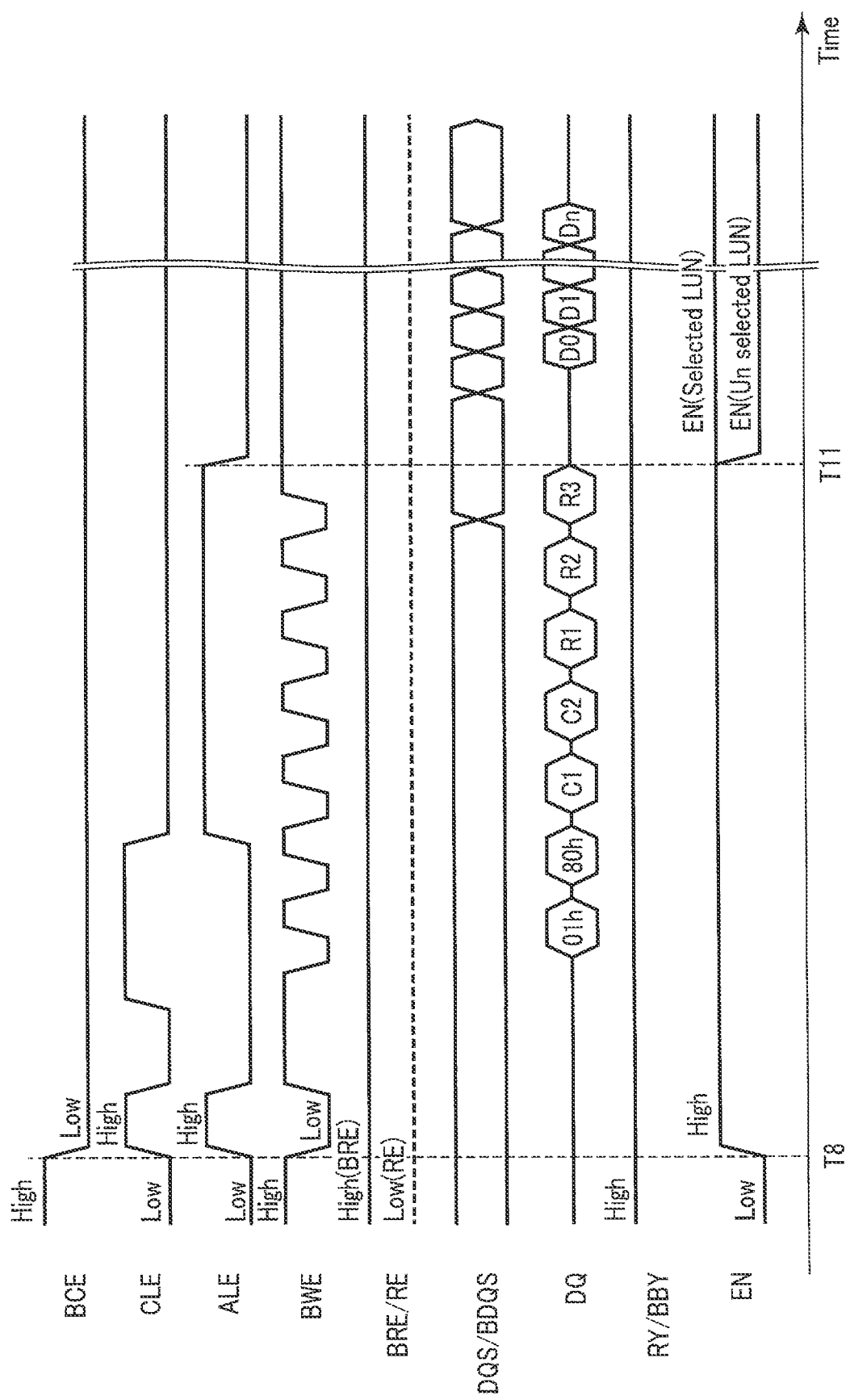
F I G. 20

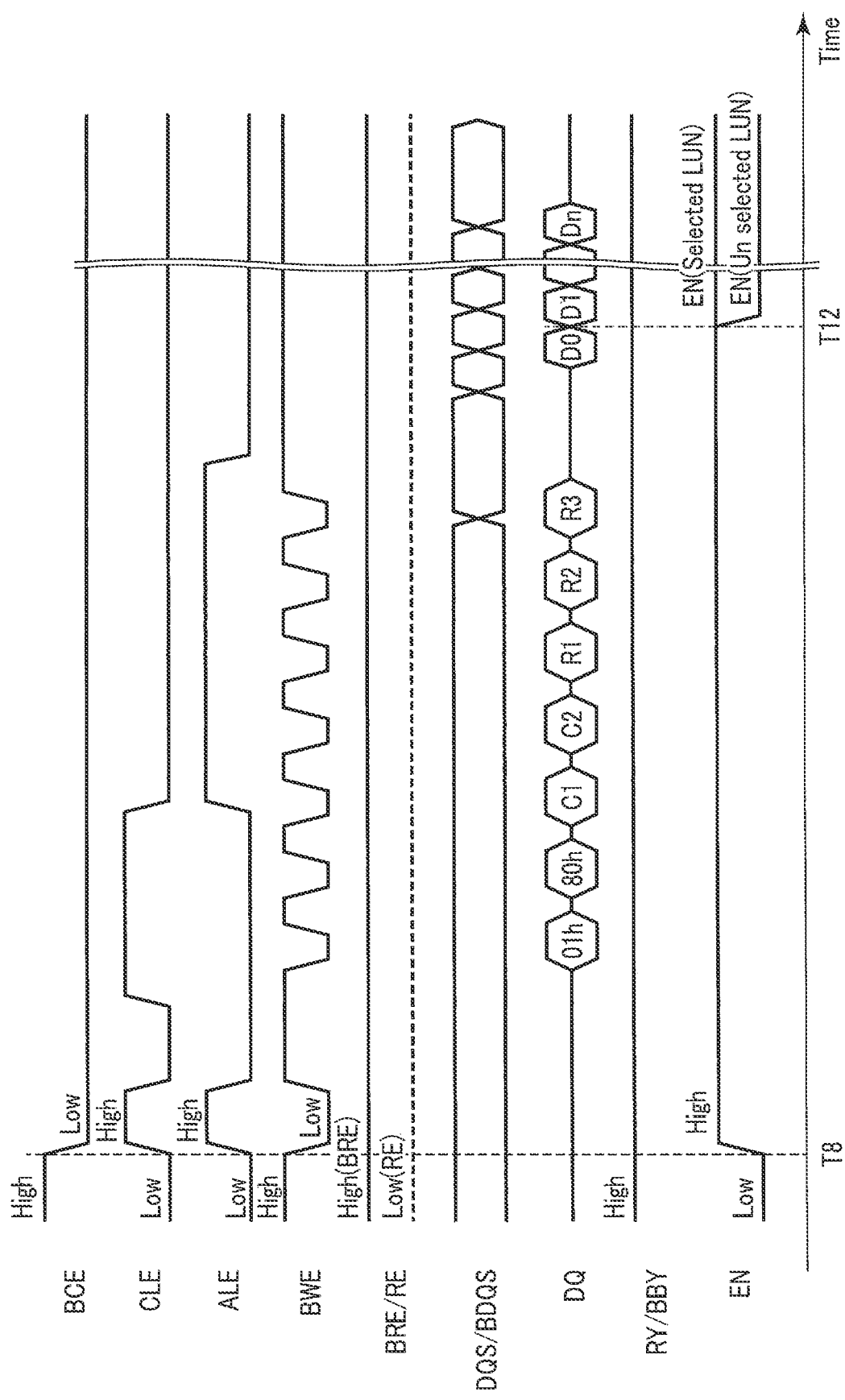
F I G. 21

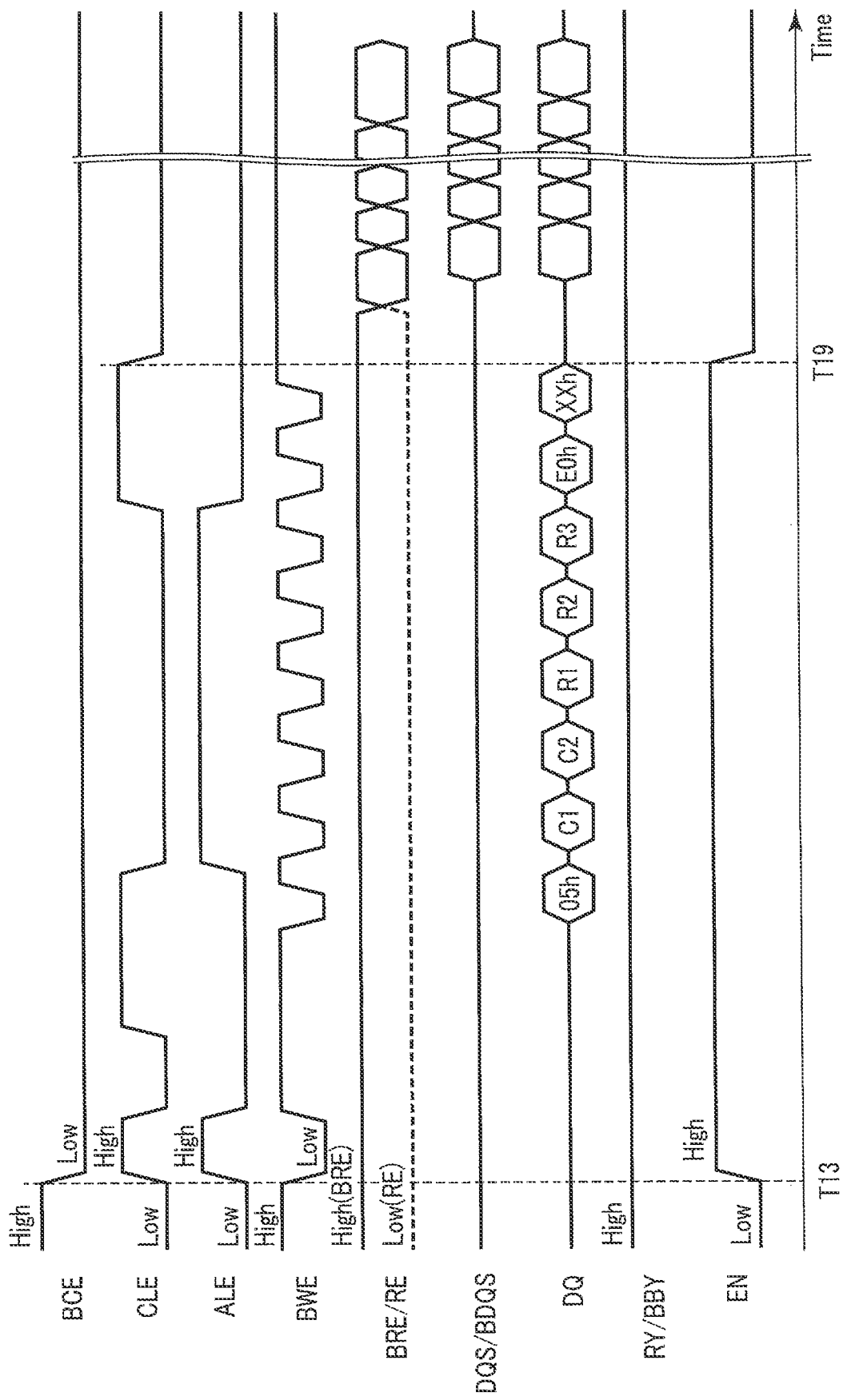
F I G. 27

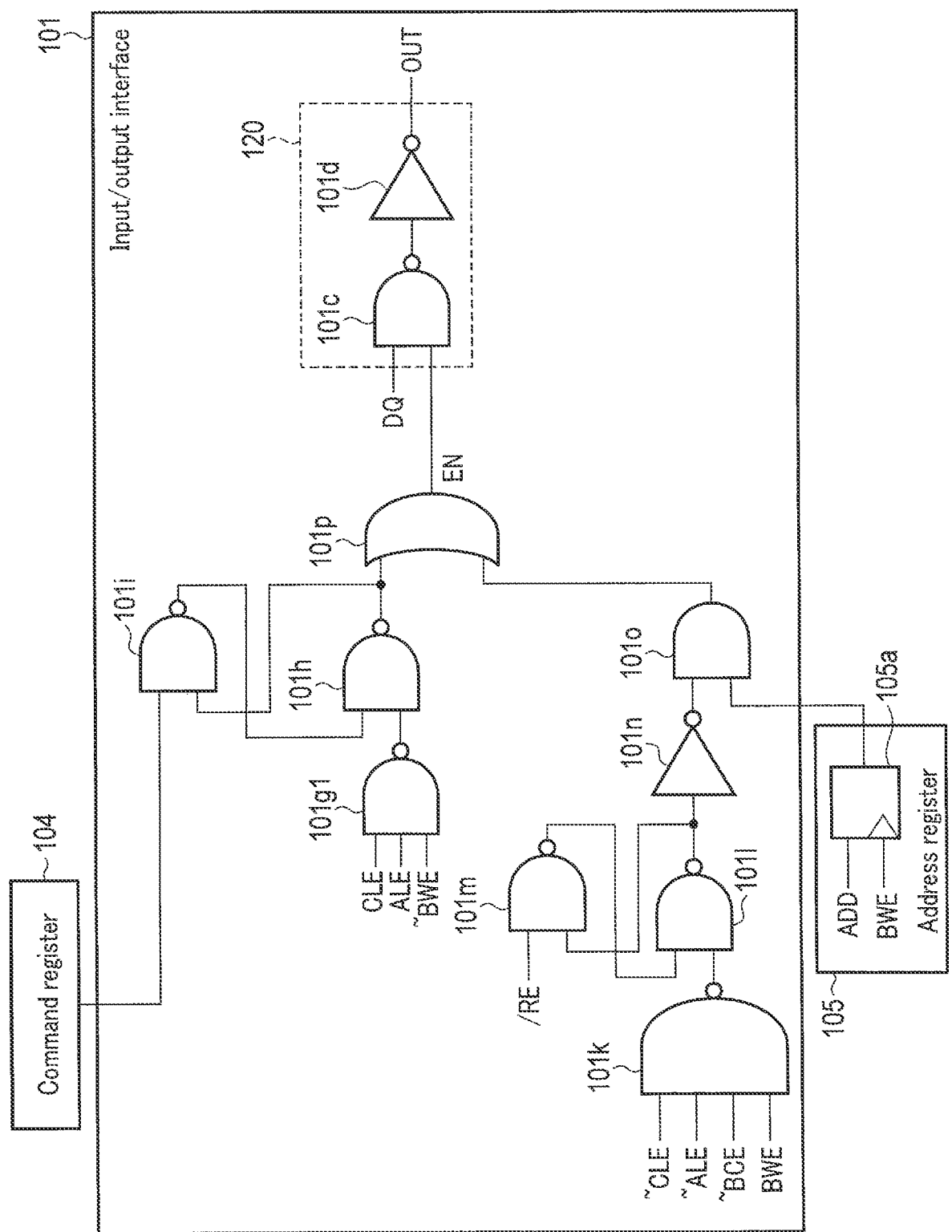
F I G. 28

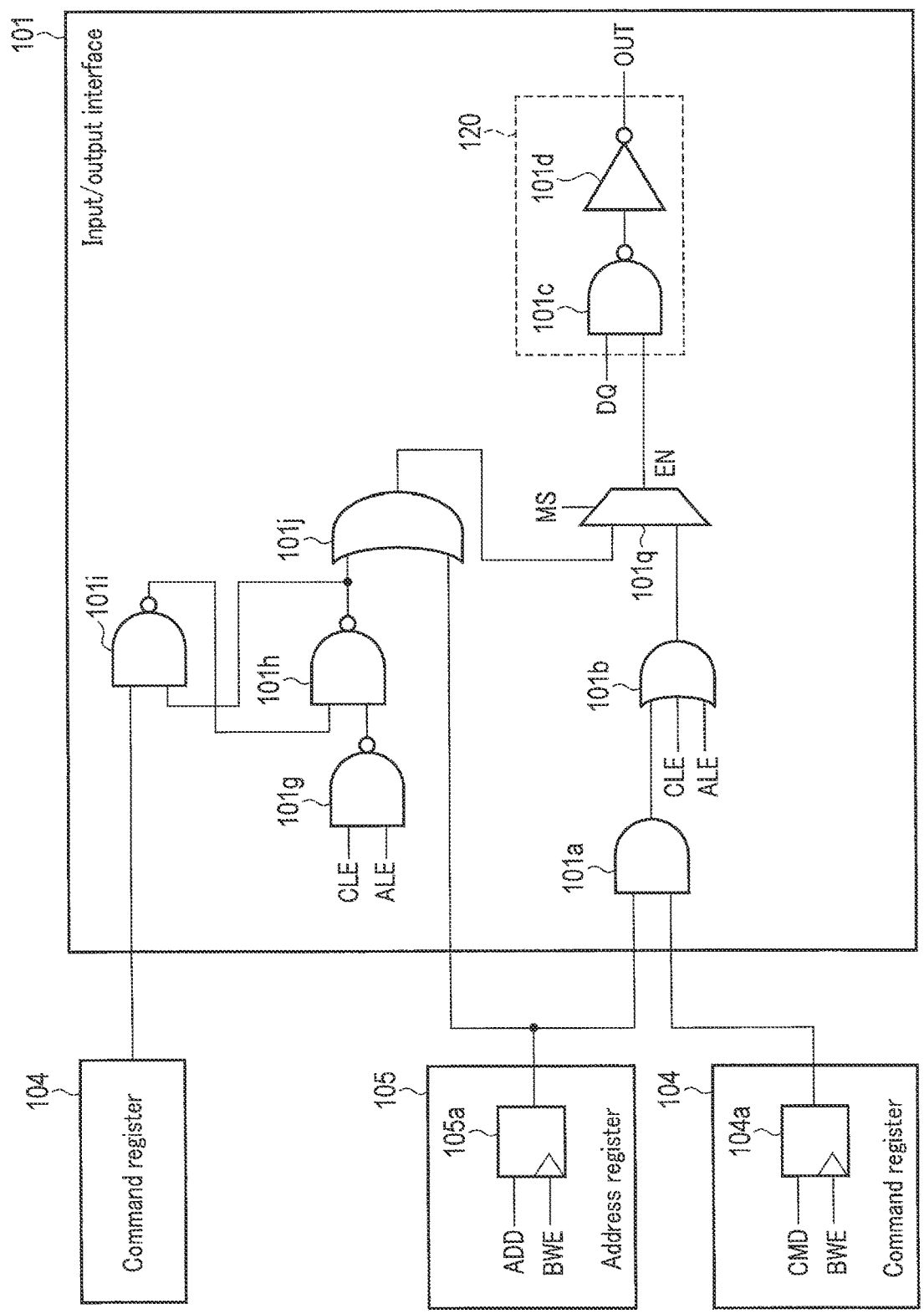
F I G. 29

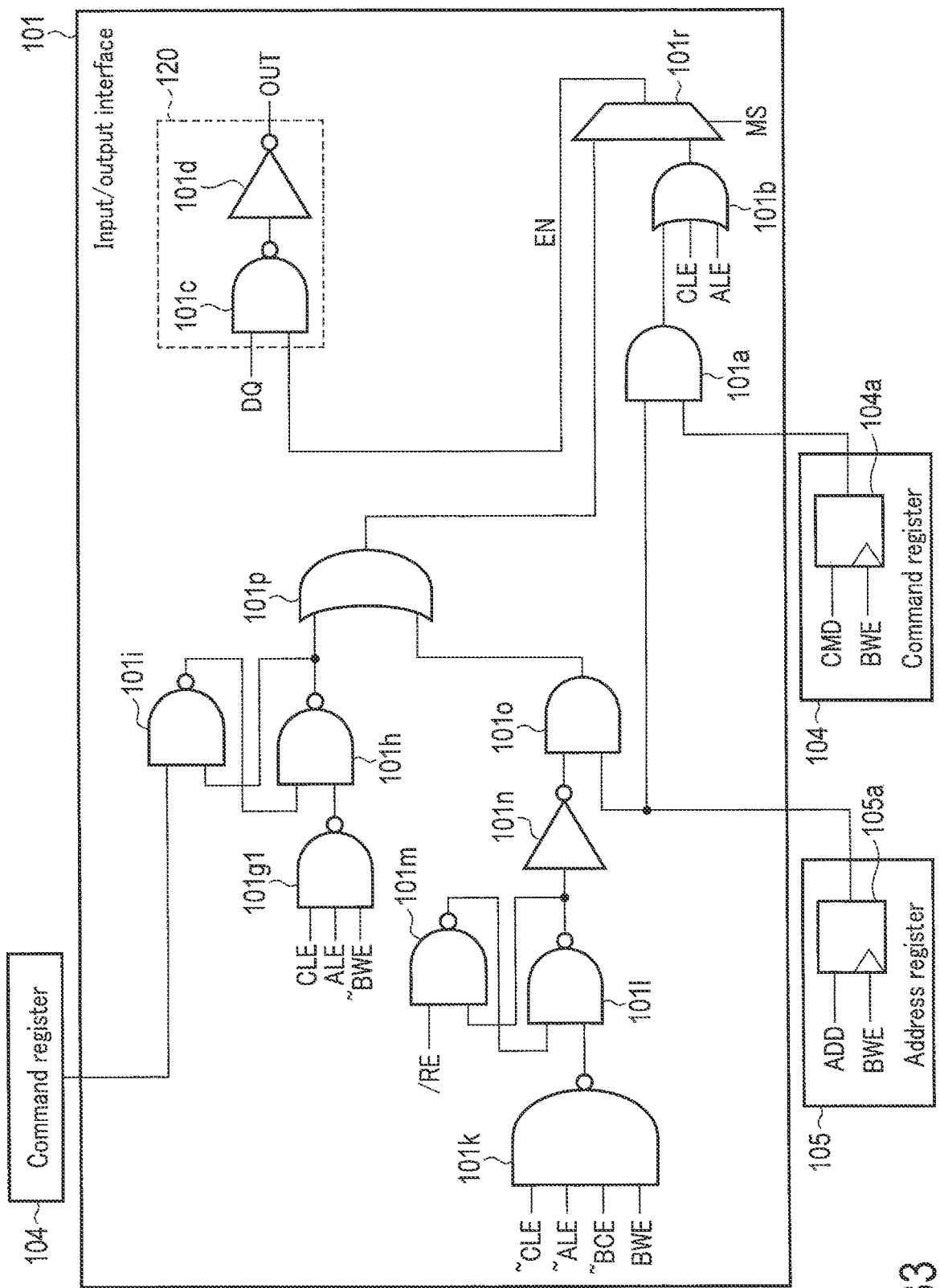
F I G. 33

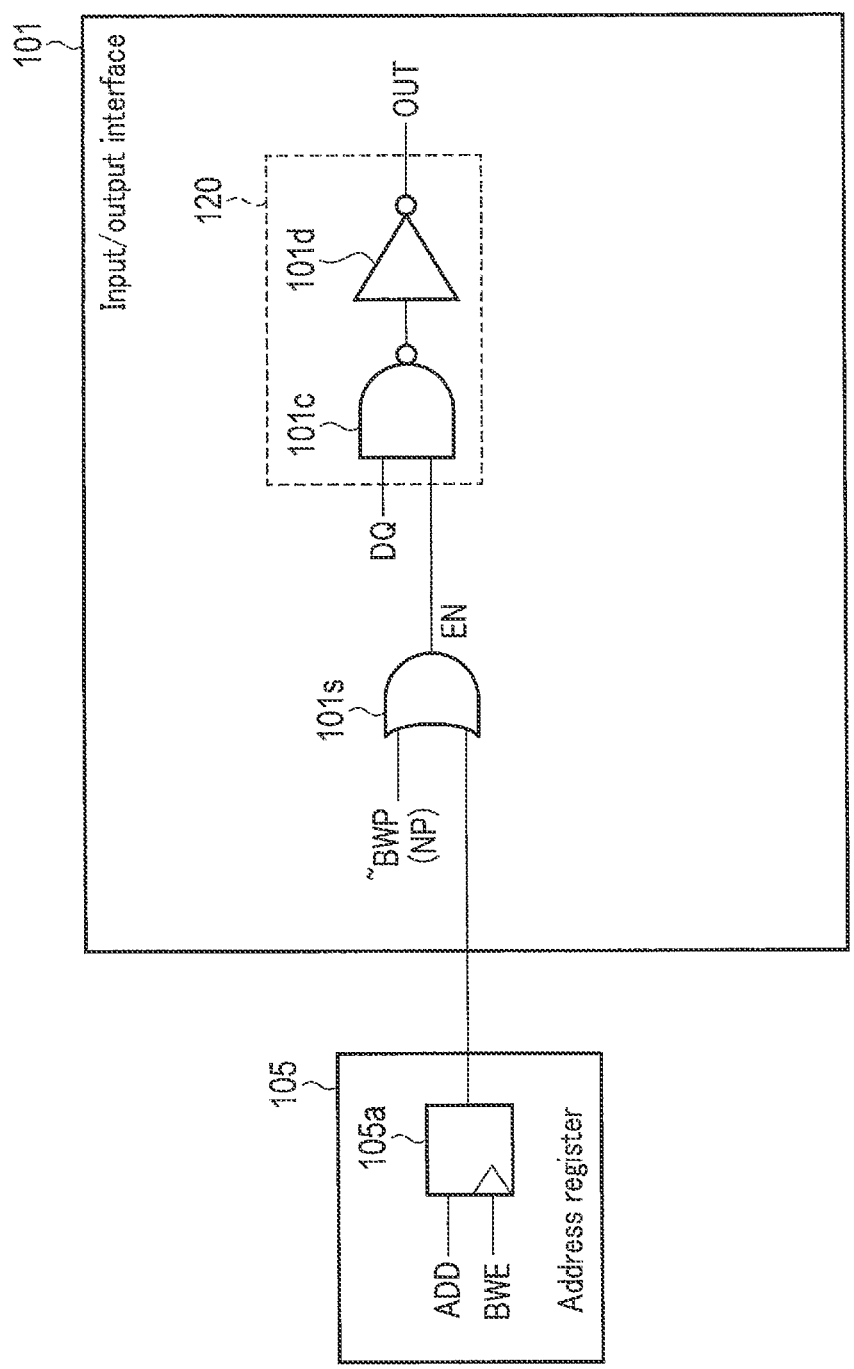
F I G. 34

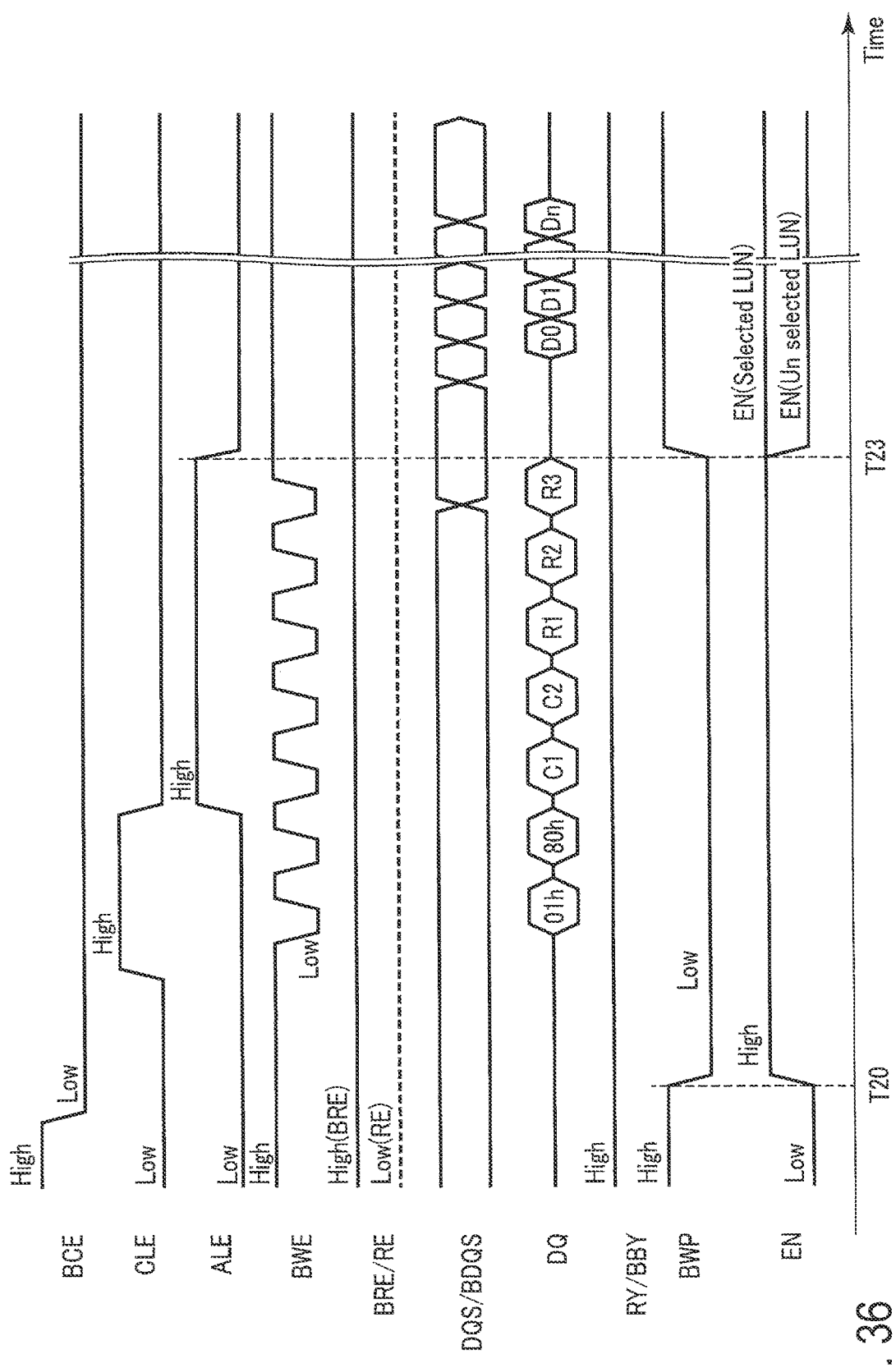
F I G. 36

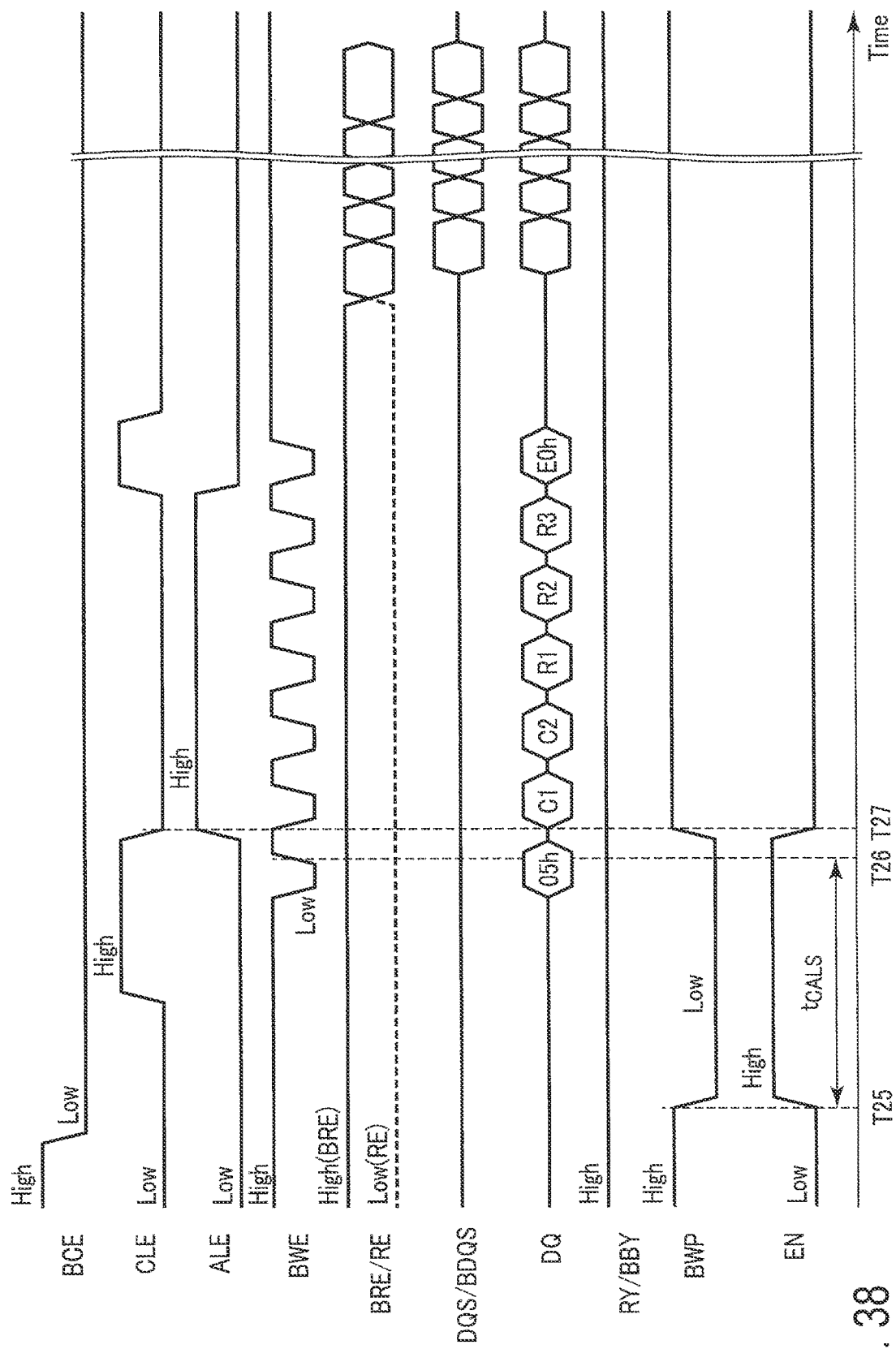
F I G. 38

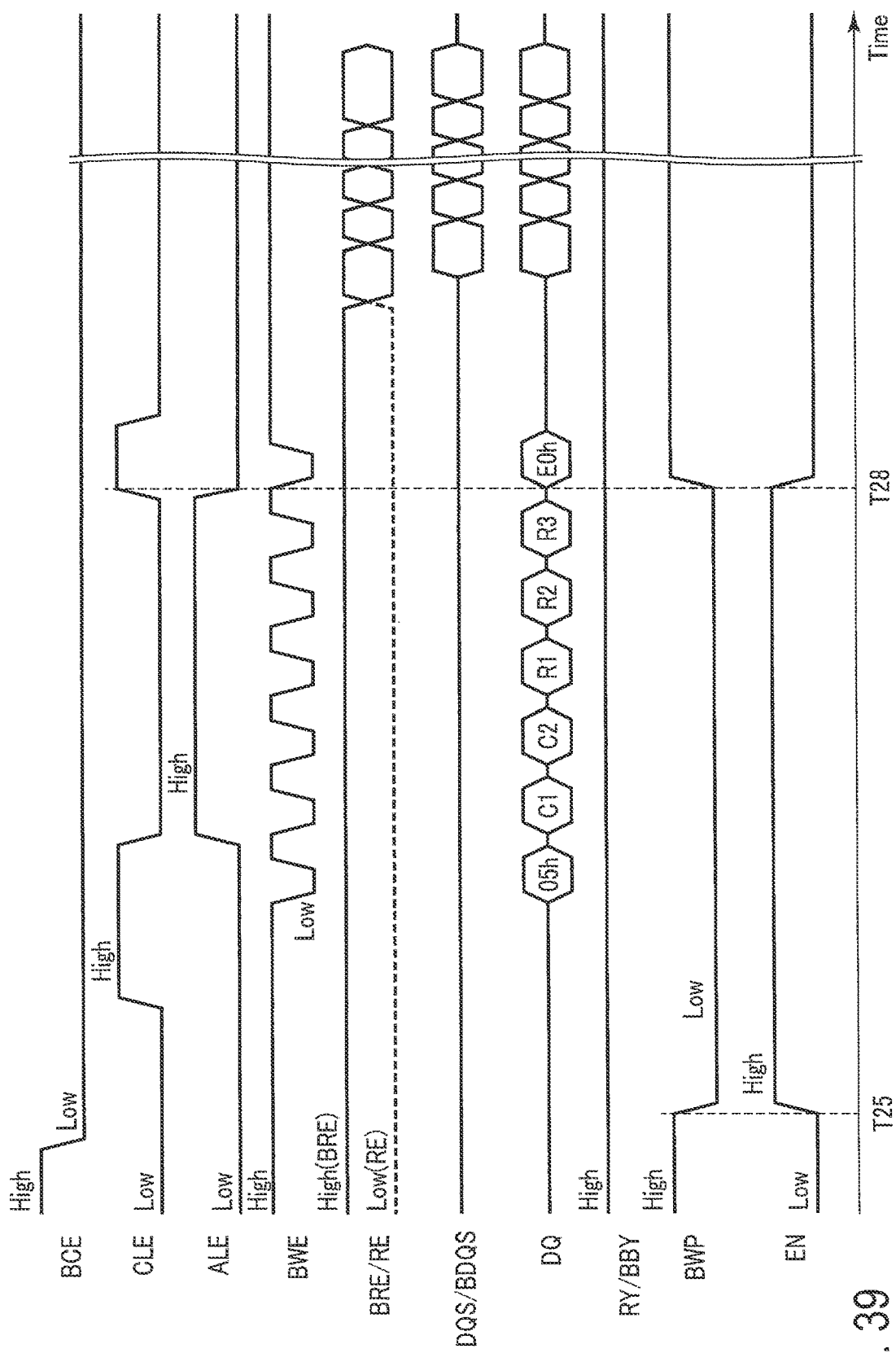
F I G. 39

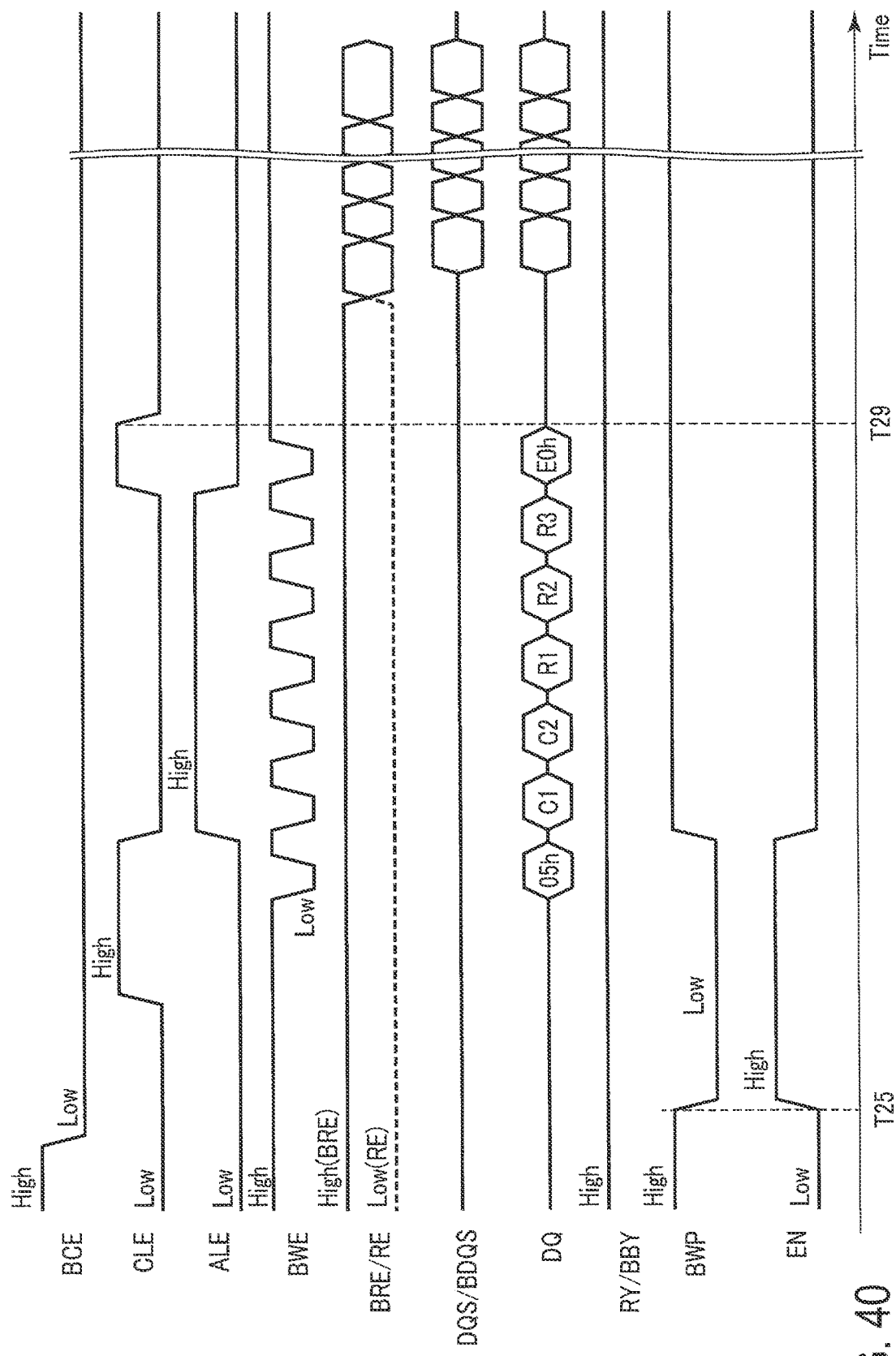
F I G. 40

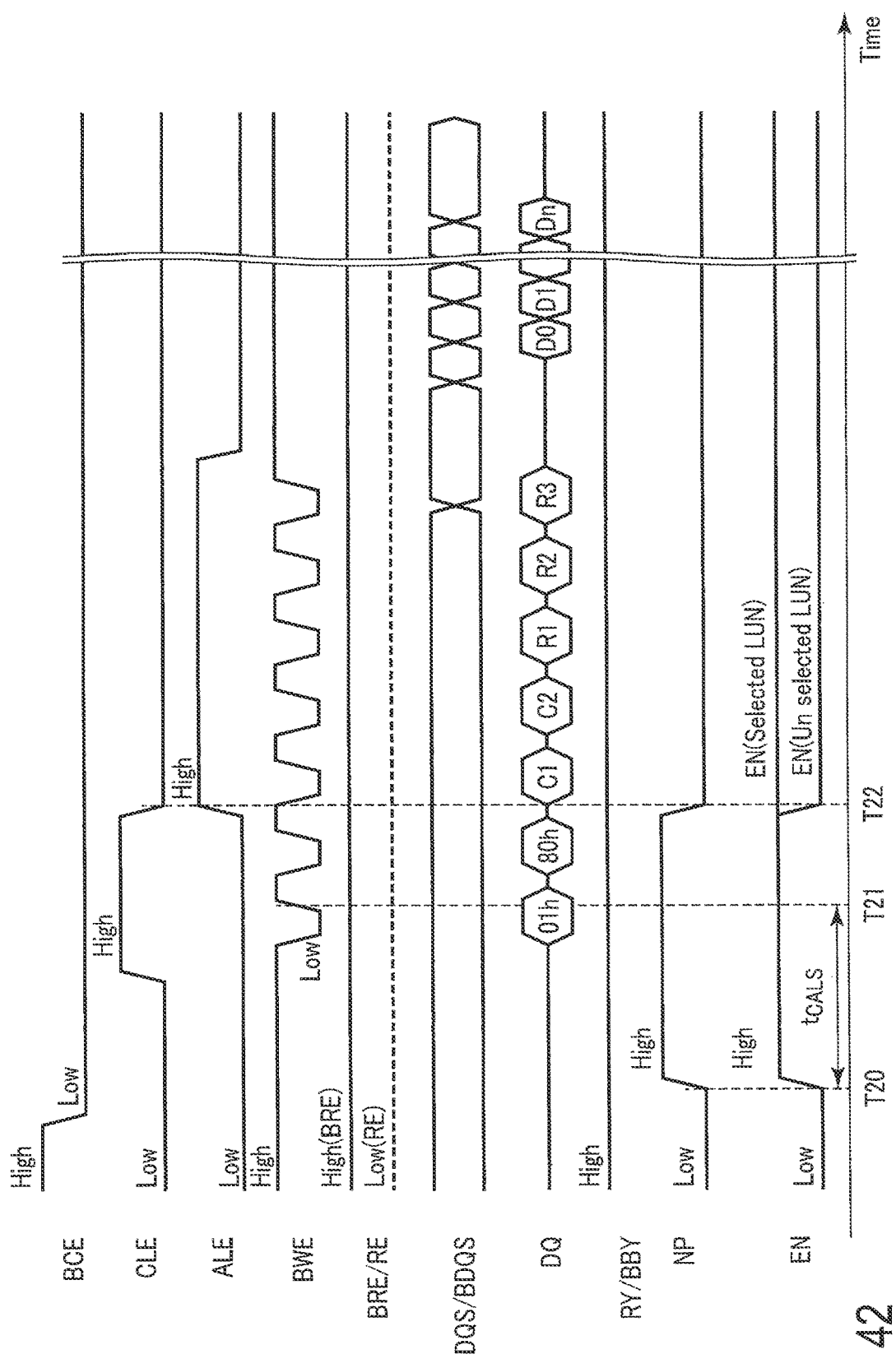
F I G. 42

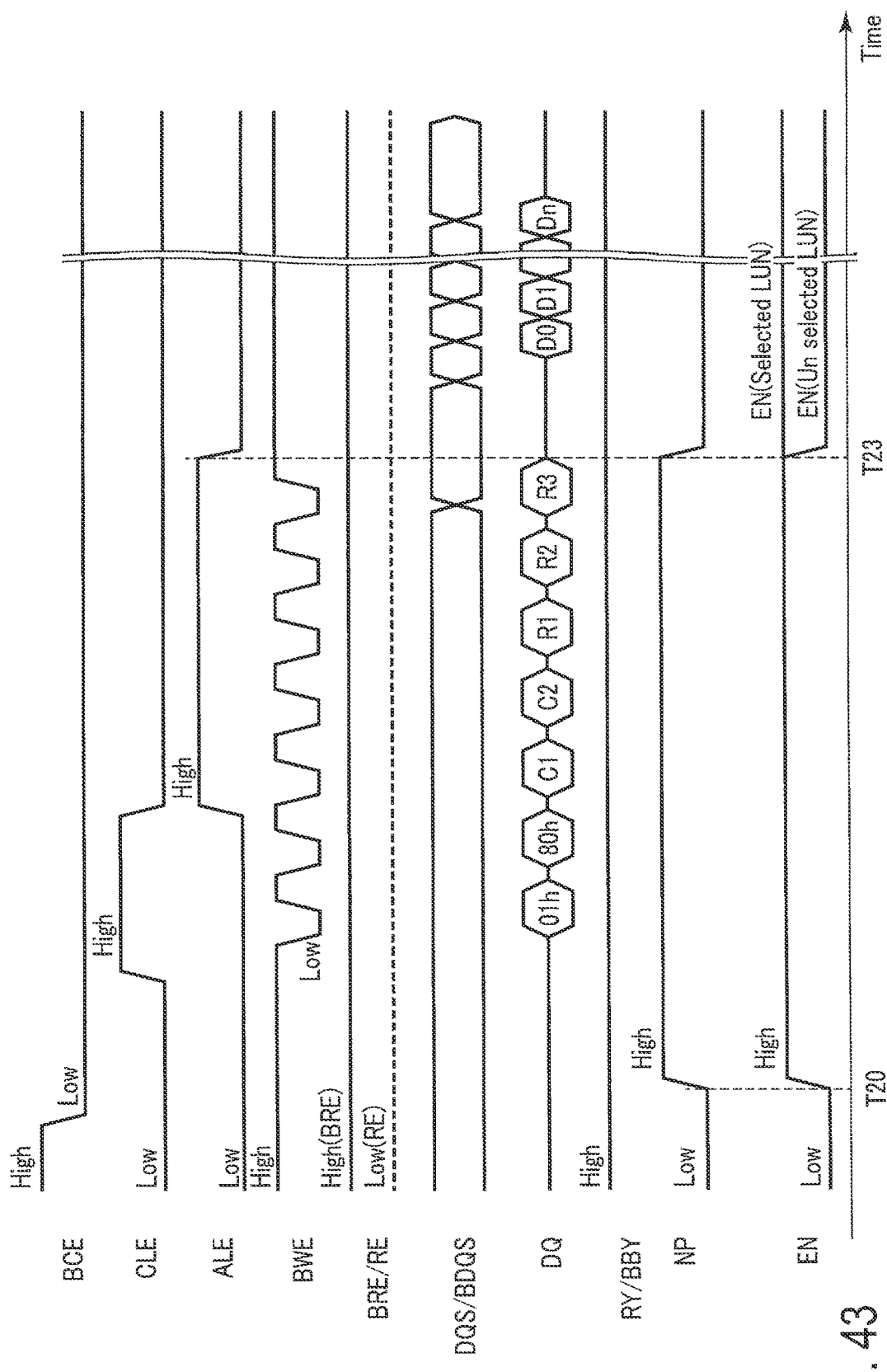
F I G. 43

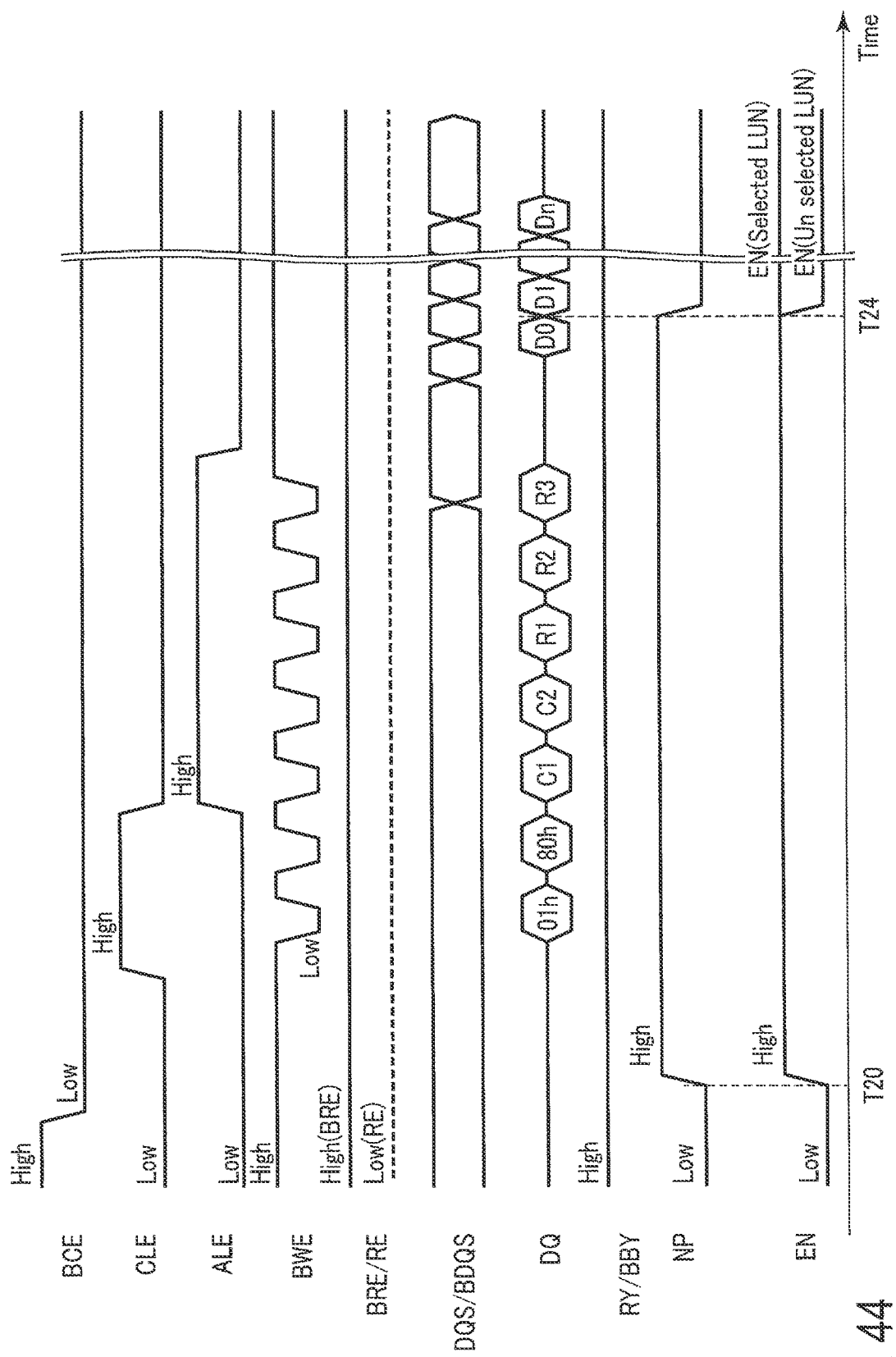
F I G. 44

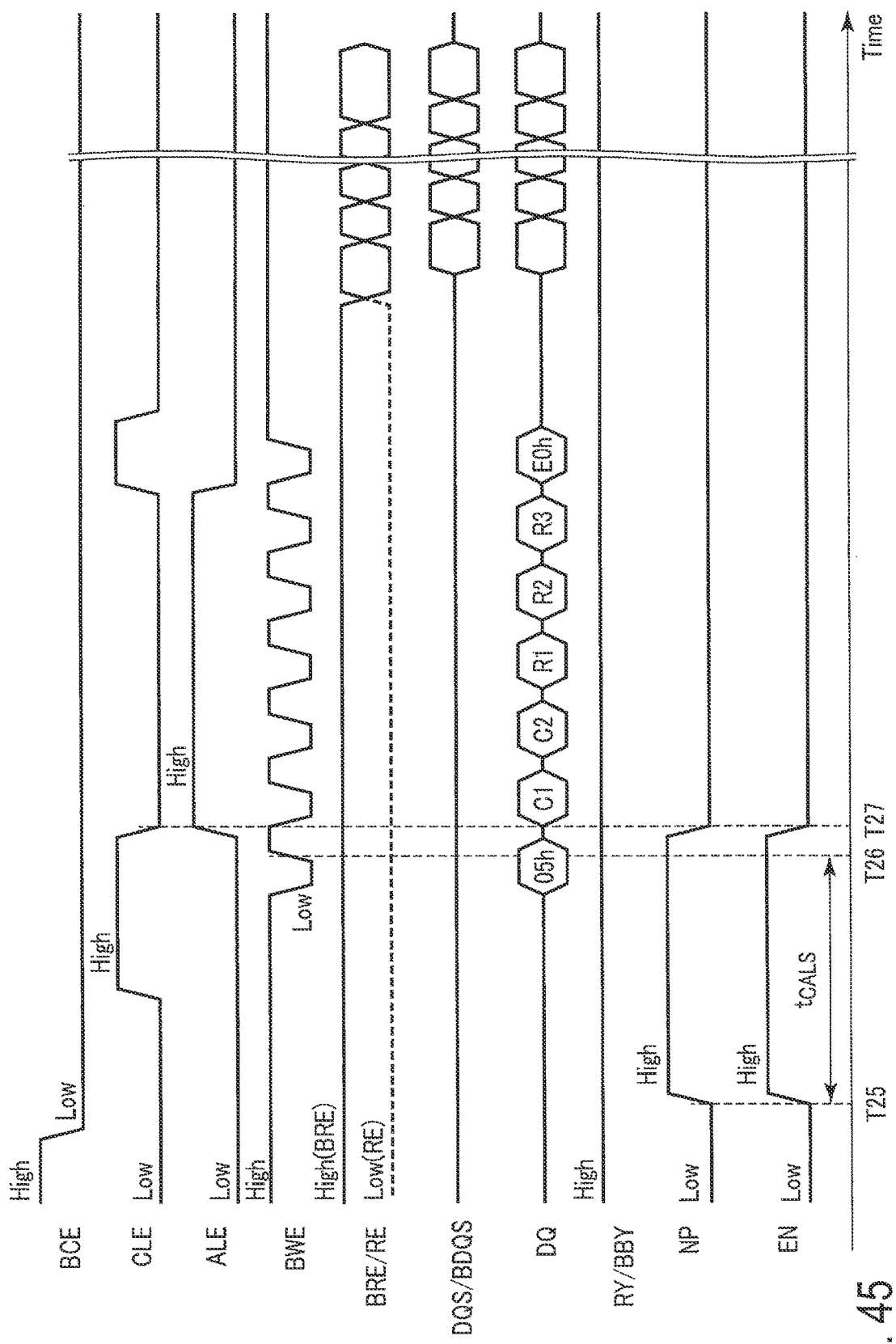
F I G. 45

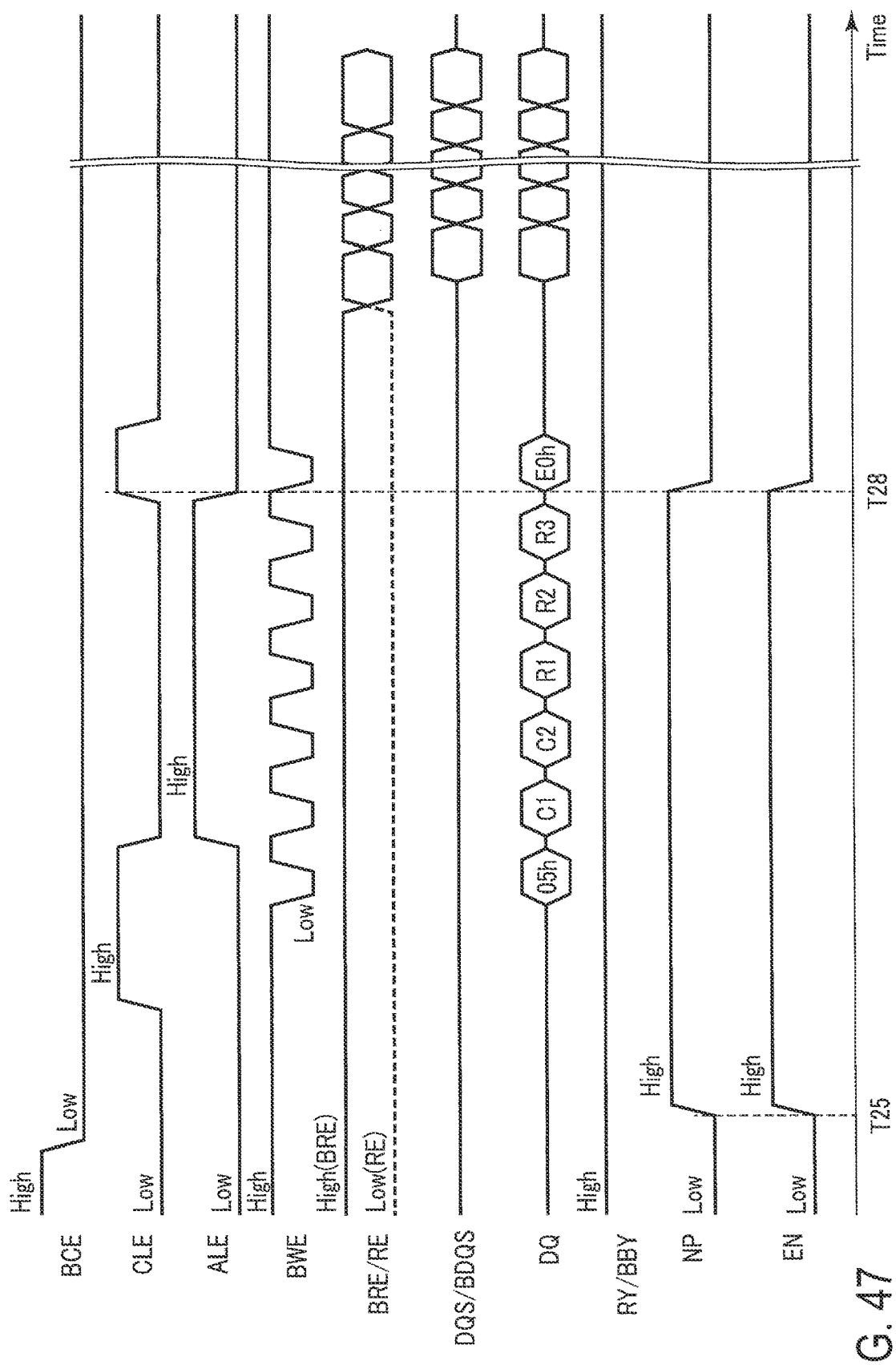
F I G. 47

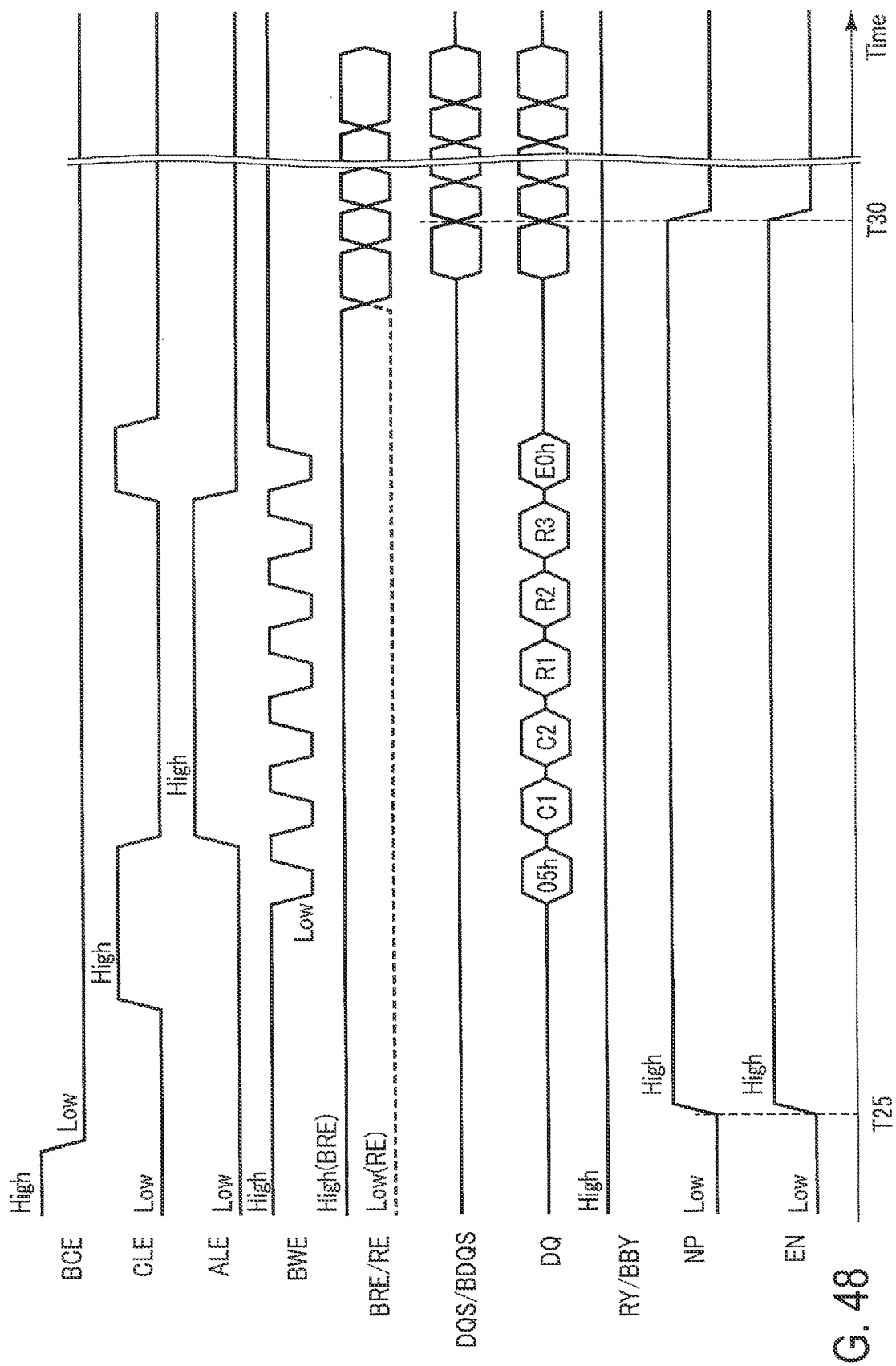
F I G. 48

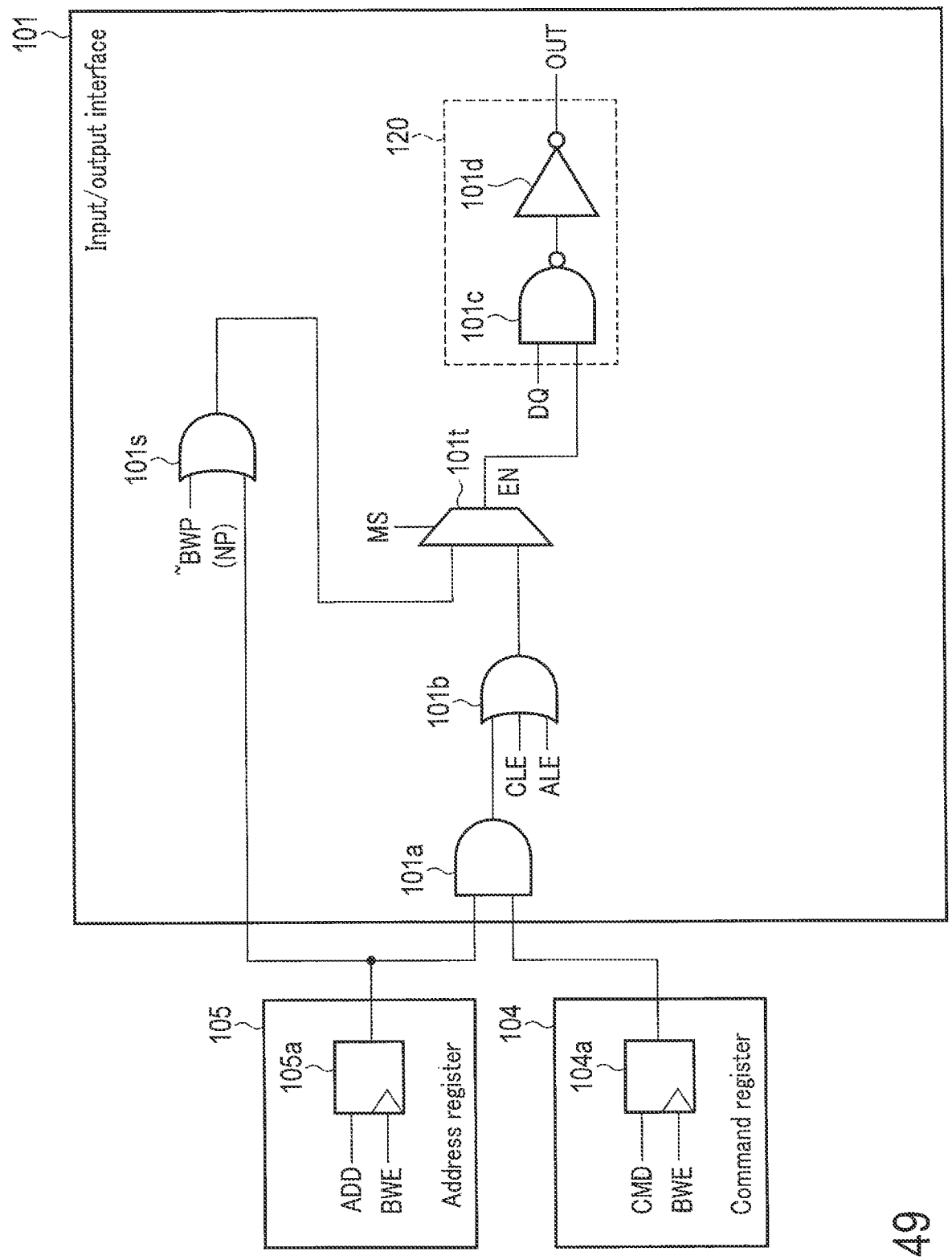
F I G. 49

| CLE | ALE | BCE | BWE | BRE | DQS | BWP | | Mode |
|---|---|---|---|---|---|---|---|---|
| H | L | L | ↓↑ | H | X[1] | X | Read Mode | Command Input |
| L | H | L | ↓↑ | H | X | X | Read Mode | Address Input (5 cycles)[3] |
| H | L | L | ↓↑ | H | X | H | Write Mode | Command Input |
| L | H | L | ↓↑ | H | X | H | Write Mode | Address Input (5 cycles)[3] |
| L | L | L | H | H | ↓↑ | H | | Data Input |
| L | L | L | H | ↓↑ | ↓↑ | X | | Data Output |
| X | X | X | X | H | X | X | | During Read (Busy) |
| X | X | X | X | X | X | H | | During Program (Busy) |
| X | X | X | X | X | X | H | | During Erase (Busy) |
| X | X | H | X | X | X | L | | Write Protect |
| X | X | L | H | H | X | H/L[2] | | Stand-by |
| L | L | L | L | H | H/L | H | | Bus Idle |
| L | H | L | X | X | X | X | | All LUN active (first embodiment) |
| H | L | L | X | X | X | X | | All LUN active (first embodiment) |
| H | H | L | X | X | X | X | | All LUN active (second embodiment) |
| H | H | L | ↓↑ | X | X | X | | All LUN active (third embodiment) |
| X | X | L | X | X | X | L | | All LUN active (fifth embodiment) |

F I G. 53

MEMORY DEVICE

CROSS-REFERENCE TO RELATED APPLICATIONS

This application is a Continuation application of U.S. application Ser. No. 16/245,445, filed on Jan. 11, 2019, which is a Continuation Application of PCT Application No. PCT/JP2016/070741, filed Jul. 13, 2016, the entire contents all of which are incorporated herein by reference.

FIELD

Embodiments described herein relate to a memory device.

BACKGROUND

As a memory device, a NAND flash memory is known.

BRIEF DESCRIPTION OF THE DRAWINGS

FIG. 1 is a block diagram of the memory system according to the first embodiment.

FIG. 2 is a block diagram of the LUN of the memory system according to the first embodiment.

FIG. 3 is a circuit diagram of the input/output interface of the memory system according to the first embodiment.

FIG. 7 is a circuit diagram of the input/output interface of the memory system according to the second embodiment.

FIG. 8 is a timing chart showing a write operation example of the memory system according to the second embodiment.

FIG. 10 is a timing chart showing a write operation example of the memory system according to the second embodiment.

FIG. 11 is a timing chart showing a read operation example of the memory system according to the second embodiment.

FIG. 14 is a timing chart showing a read operation example of the memory system according to the second embodiment.

FIG. 15 is a timing chart showing a write operation example of the memory system according to modification 1 of the second embodiment.

FIG. 17 is a circuit diagram of the input/output interface of the memory system according to modification 2 of the second embodiment.

FIG. 19 is a timing chart showing a write operation example of the memory system according to the third embodiment.

FIG. 20 is a timing chart showing a write operation example of the memory system according to the third embodiment.

FIG. 21 is a timing chart showing a write operation example of the memory system according to the third embodiment.

FIG. 27 is a timing chart showing a read operation example of the memory system according to the third embodiment.

FIG. 28 is a circuit diagram of the input/output interface of the memory system according to a modification of the third embodiment.

FIG. 29 is a circuit diagram of the input/output interface of the memory system according to the fourth embodiment.

FIG. 33 is a circuit diagram of the input/output interface of the memory system according to modification 3 of the fourth embodiment.

FIG. 34 is a circuit diagram of the input/output interface of the memory system according to the fifth embodiment.

FIG. 36 is a timing chart showing a write operation example of the memory system according to the fifth embodiment.

FIG. 38 is a timing chart showing a read operation example of the memory system according to the fifth embodiment.

FIG. 39 is a timing chart showing a read operation example of the memory system according to the fifth embodiment.

FIG. 40 is a timing chart showing a read operation example of the memory system according to the fifth embodiment.

FIG. 42 is a timing chart showing a write operation example of the memory system according to a modification of the fifth embodiment.

FIG. 43 is a timing chart showing a write operation example of the memory system according to the modification of the fifth embodiment.

FIG. 44 is a timing chart showing a write operation example of the memory system according to the modification of the fifth embodiment.

FIG. 45 is a timing chart showing a read operation example of the memory system according to the modification of the fifth embodiment.

FIG. 47 is a timing chart showing a read operation example of the memory system according to the modification of the fifth embodiment.

FIG. 48 is a timing chart showing a read operation example of the memory system according to the modification of the fifth embodiment.

FIG. 49 is a circuit diagram of the input/output interface of the memory system according to the sixth embodiment.

FIG. 53 is a diagram showing operation conditions of the memory system according to the first to fifth embodiments.

DETAILED DESCRIPTION

Figure 4:
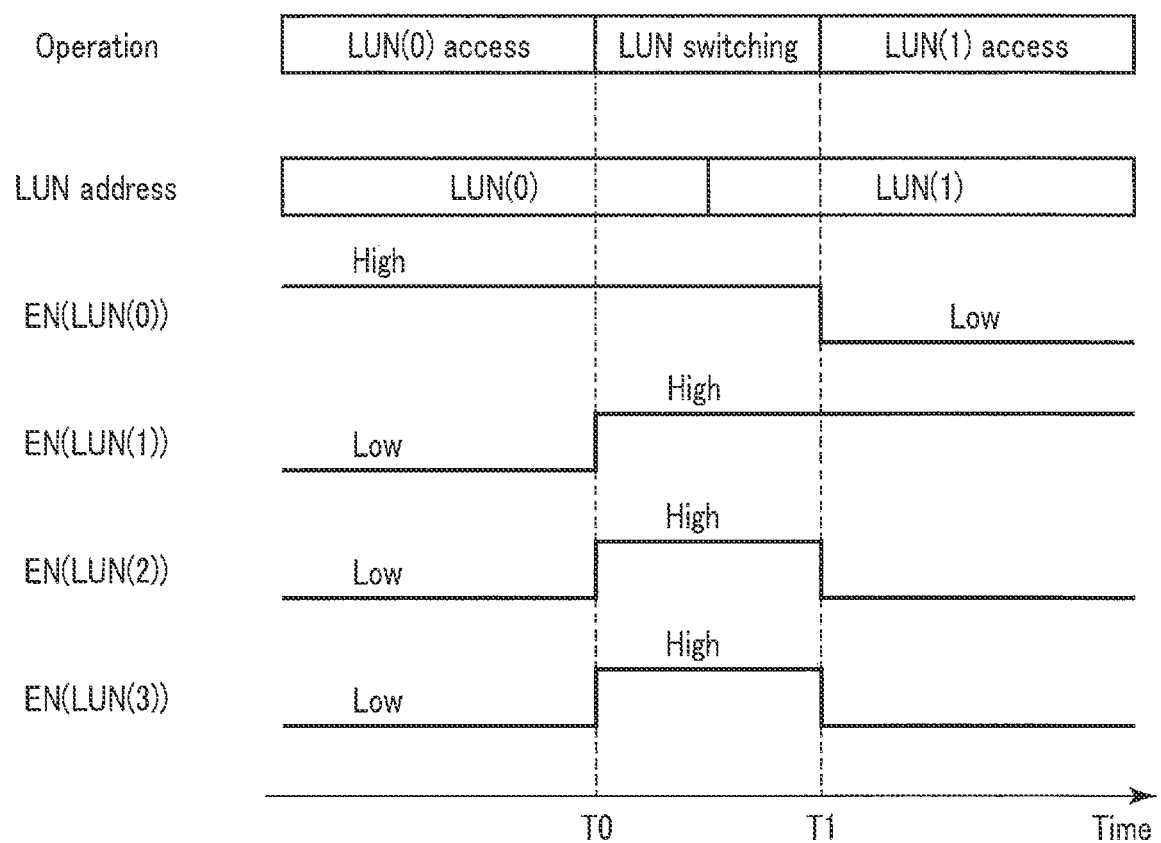
FIG. 4 is a schematic diagram of the operation of the memory system according to the first embodiment.

In general, according to one embodiment, a memory device according to the embodiments includes a memory cell array configured to store data, a control circuit configured to control the memory cell array in response to a command, and a receiver configured to be placed in an active state based on a first signal, a second signal, or an operation result of an address and the command, and be enabled to receive a command or data.

Hereinafter, embodiments will be described with reference to the drawings. In the description, common parts are assigned with common reference numerals throughout the drawings.

<1>First Embodiment

A semiconductor memory device according to the first embodiment will be described. The following description will be provided while using a NAND flash memory as an example of the semiconductor memory device.

<1-1>Configuration

<1-1-1>Overall Configuration of Memory System

First, a rough overall configuration of a memory system including the semiconductor memory device according to the present embodiment will be described with reference to FIG. 1. FIG. 1 is a block diagram of the memory system according to the present embodiment.

As shown in FIG. 1, a memory system 1 includes a NAND flash memory 10 and a memory controller 20. The NAND flash memory 10 and the memory controller 20 may form one semiconductor device in combination, for example. The semiconductor device is, for example, a memory card such as an SD card, or a solid state drive (SSD).

The NAND flash memory 10 includes a plurality of memory cell transistors, and non-volatilely stores data. The memory controller 20 is coupled to the NAND flash memory 10 by NAND buses, and is coupled to a host device 30 by a host bus. The memory controller 20 controls the NAND flash memory 10, and accesses the NAND flash memory 10 in response to a command received from the host device 30. The host device 30 is, for example, a digital camera or a personal computer, and the host bus is, for example, a bus compliant with an SD™ interface.

The NAND buses perform signal transmission/reception compliant with a NAND interface. Specific examples of this signal are a chip enable signal BCE, a command latch enable signal CLE, an address latch enable signal ALE, a write enable signal BWE, read enable signals RE and BRE, a write protect signal BWP, data strobe signals DQS and BDQS, an input/output signal DQ, and a ready/busy signal RY/BBY. Where the above signals are not distinguished, they may be simply described as a signal.

The chip enable signal BCE is a signal for selecting a logical unit number (LUN) 100 included in the NAND flash memory 10. The chip enable signal BCE is asserted ("low" level) when the LUN 100 is selected.

The command latch enable signal CLE is a signal for notifying the NAND flash memory 10 that the input/output signal DQ to the NAND flash memory 10 is a command. The command latch enable signal CLE is asserted ("high" level (low<high)) when causing the NAND flash memory 10 to take a command therein.

The address latch enable signal ALE is a signal for notifying the NAND flash memory 10 that the input/output signal DQ to the NAND flash memory 10 is an address. The address latch enable signal ALE is asserted ("high" level) when causing the NAND flash memory 10 to take an address therein.

The write enable signal BWE is a signal for causing the NAND flash memory 10 to take an input/output signal DQ therein. The write enable signal BWE is asserted ("low" level) when causing the NAND flash memory 10 to take an input/output signal DQ therein.

Read enable signal RE is a signal for reading an input/output signal DQ from the NAND flash memory 10. Read enable signal BRE is a complementary signal of RE. The read enable signals RE and BRE are asserted (RE="high" level, BRE="low" level) when an input/output signal DQ is read from the NAND flash memory 10.

The write protect signal BWP is a signal for protecting data from unexpected erasure or writing when an input signal is uncertain, such as when the NAND flash memory 10 is powered on or powered off. The write protect signal BWP is asserted ("low" level) when protecting data.

The input/output signal DQ is, for example, an 8-bit signal. The input/output signal DQ is a command, an address, write data, read data, or the like which is transmitted and received between the NAND flash memory 10 and the memory controller 20.

Data strobe signal DQS is a signal for transmitting and receiving an input/output signal DQ (data) between the memory controller 20 and the NAND flash memory 10. Data strobe signal BDQS is a complementary signal of DQS. The NAND flash memory 10 receives an input/output signal DQ (data) in accordance with the timings of the data strobe signals DQS and BDQS supplied from the memory controller 20. The memory controller 20 receives an input/output signal DQ (data) in accordance with the timings of the data strobe signals DQS and BDQS supplied from the NAND flash memory 10. The data strobe signals DQS and BDQS are asserted (DQS="low" level, BDQS="high" level) when transmitting and receiving an input/output signal DQ.

The ready/busy signal RY/BBY indicates whether the LUN 100 is in a ready state (a state where an instruction from the memory controller 20 can be received) or in a busy state (a state where an instruction from the memory controller 20 cannot be received). The ready/busy signal RY/BBY is at the "low" level when it is in the busy state.

<1-1-2>Configuration of Memory Controller

Details of the configuration of the memory controller 20 will be described with reference to FIG. 1. As shown in FIG. 1, the memory controller 20 includes a host interface (host I/F) 210, an embedded memory (random access memory (RAM)) 220, a processor (central processing unit (CPU)) 230, a buffer memory 240, and a NAND interface (NAND I/F) 250.

The host interface 210 is coupled to the host device 30 via the host bus, and transfers an instruction and data received from the host device 30 to the processor 230 and the buffer memory 240, respectively. In response to an instruction of the processor 230, the host interface 210 transfers data in the buffer memory 240 to the host device 30.

The processor 230 controls the operation of the entire memory controller 20. For example, upon receipt of a write instruction from the host device 30, the processor 230 issues, in response thereto, a write instruction to the NAND interface 250. Similar processing is performed at the time of reading or erasing. The processor 230 executes various processing, such as wear leveling, for managing the NAND flash memory 10.

The NAND interface 250 is coupled to the NAND flash memory 10 via the NAND buses, and controls communication with the NAND flash memory 10. Based on the instruction received from the processor 230, the NAND interface 250 outputs the chip enable signal BCE, the command latch enable signal CLE, the address latch enable signal ALE, the write enable signal BWE, the read enable signals RE and BRE, the write protect signal BWP, and the data strobe signals DQS BDQS to the NAND flash memory 10. At the time of writing, the NAND interface 250 transfers the write command issued by the processor 230 and the write data in the buffer memory 240 to the NAND flash memory 10 as input/output signals DQ. At the time of reading, the NAND interface 250 transfers the read command issued by the processor 230 to the NAND flash memory 10 as an input/output signal DQ, and receives the data read from the NAND flash memory 10 as an input/output signal DQ and transfers it to the buffer memory 240.

The buffer memory 240 temporarily holds write data and read data.

The embedded memory 220 is a semiconductor memory such as a dynamic random access memory (DRAM), and is used as a work area of the processor 230. The embedded memory 220 holds firmware for managing the NAND flash memory 10, various management tables, and the like.

<1-1-3>NAND Flash Memory

<1-1-3-1>Configuration of NAND Flash Memory

Next, a configuration of the NAND flash memory 10 will be described.

As shown in FIG. 1, the NAND flash memory 10 includes a plurality of memory groups (in the case of FIG. 1, GP0 and GP1 as an example).

The memory groups GP each include a plurality of LUNs 100 (in the case of FIG. 1, four as an example). When the LUNs 100 are distinguished from one another, each LUN is represented by LUN (m), where m is a given integer. Specifically, memory group GP0 includes LUN (0) to LUN (3), and memory group GP1 includes LUN (4) to LUN (7). The LUN 100 is a minimum unit that can be independently controlled. It suffices that the LUN 100 includes at least one memory chip, and the LUN 100 may include two or more memory chips. In the present embodiment, the case where the LUN 100 includes one memory chip will be described.

In the present embodiment, let us assume that an independent chip enable signal BCE is input for each memory group GP. In other words, the same chip enable signal BCE is input to the LUNs 100 in the same memory group GP.

In one memory group GP, one or more LUNs 100 may be operated.

<1-1-3-2>Configuration of LUN

Next, a configuration of the LUN 100 will be described with reference to FIG. 2.

The memory controller 20 is coupled to the LUN 100 via an input/output interface 101 and a control signal input interface 102.

The input/output interface 101 includes a receiver 120 and a transmitter 130. The receiver 120 inputs input/output signals (DQ0 to DQ7) via data input/output lines (of the NAND buses, lines for transmitting and receiving input/output signals DQ). The transmitter 130 outputs input/output signals (DQ0 to DQ7) via the data input/output lines.

When outputting the input/output signals (DQ0 to DQ7) from the data input/output lines, the input/output interface 101 outputs data strobe signals DQS and BDQS to the memory controller 20.

The control signal input interface 102 receives from the memory controller 20 the chip enable signal BCE, the command latch enable signal CLE, the address latch enable signal ALE, the write enable signal BWE, the read enable signals RE and BRE, the write protect signal BWP, and the data strobe signals DQS and BDQS.

Although not shown in FIG. 2, a Vcc/Vss/Vccq/Vssq terminal or the like for power supply is also provided in the LUN 100.

A control circuit 103 outputs data read from a memory cell array 110 to the memory controller 20 via the input/output interface 101. The control circuit 103 receives various commands, such as write, read, erase and status-read commands, addresses, and write data via the control signal input interface 102.

The control circuit 103 controls a command register 104, an address register 105, a status register 106, a sense amplifier (sense amp) 111, a data register 112, a column decoder 113, and a row address decoder 115.

The control circuit 103 supplies desired voltages to the memory cell array 110, the sense amplifier 111, and the row decoder 115 at the time of programming, verifying, reading, or erasing data.

The command register 104 stores a command input from the control circuit 103.

The address register 105 stores, for example, an address supplied from the memory controller 20. Then, the address register 105 converts the stored address into an internal physical address (a column address and a row address). The address register 105 supplies the column address to a column buffer 114, and supplies the row address to a row address buffer decoder 116.

The status register 106 is used to inform various internal states of the LUN 100 to the outside. The status register 106 includes, for example, a ready/busy register (not shown) for holding data indicating whether the LUN 100 is in the ready state or in the busy state, and a write status register (not shown) for holding data indicating pass or fail of writing.

The memory cell array 110 includes a plurality of bit lines BL, a plurality of word lines WL, and a source line SL. The memory cell array 110 is constituted by a plurality of blocks BLK, in each of which electrically-rewritable memory cell transistors (also simply called as memory cells) MC are arranged in a matrix. The memory cell transistor MC, for example, includes a stacked gate including a control gate electrode and a charge accumulation layer (such as a floating gate electrode), and stores binary, or multivalued, data based on a change of the threshold of the transistor, determined based on the amount of charge injected into the floating gate electrode. The memory cell transistor MC may have a metal-oxide-nitride-oxide-silicon (MONOS) structure which traps electrons by a nitride film.

The memory cell array 110 may have other configurations. That is, a configuration of the memory cell array 110 is described in, for example, U.S. patent application Ser. No. 12/407,403, entitled "Three-dimensional Stacked Nonvolatile Semiconductor Memory", filed on Mar. 19, 2009. It is also described in U.S. patent application Ser. No. 12/406,524, entitled "Three-dimensional Stacked Nonvolatile Semiconductor Memory", filed on Mar. 18, 2009, U.S. patent application Ser. No. 12/679,991, entitled "Nonvolatile Semiconductor Memory Device and Manufacturing Method Thereof", filed Mar. 25, 2010, and U.S. patent application Ser. No. 12/532,030, entitled "Semiconductor Memory and Manufacturing Method Thereof", filed on Mar. 23, 2009. The entire contents of those patent applications are incorporated herein by reference.

At the time of reading data, the sense amplifier 111 senses data read from the memory cell transistor MC out to the bit line.

The data register 112 is constituted by, for example, an SRAM. The data register 112 stores, for example, data supplied by the memory controller 20 and a verification result sensed by the sense amplifier 111.

The column decoder 113 decodes the column address signal stored in the column buffer 114, and outputs, to the sense amplifier 111, a select signal which selects one of the bit lines BL.

The column buffer 114 temporarily stores a column address signal input from the address register 105.

The row address decoder 115 decodes the row address signal input via the row address buffer decoder 116. Then, the row address decoder 115 selects and drives word lines WL and select gate lines SGD and SGS of the memory cell array 110.

The row address buffer decoder 116 temporarily stores the row address signal input from the address register 105.

<1-1-3-3>Configuration of Input/Output Interface

Next, a configuration of the input/output interface 101 will be specifically described with reference to FIG. 3.

As shown in FIG. 3, the input/output interface 101 performs input/output of an input/output signal DQ based on the command latch enable signal CLE, the address latch enable signal ALE, and the signal from the command register 104 or the address register 105.

Specifically, the command register 104 outputs a command CMD stored in storage unit 104a to an AND operation circuit 101a of the input/output interface 101 based on the write enable signal BWE. When outputting the command CMD, the command register 104 maintains the "high" level state until the next command is input. The address register 105 outputs an address ADD stored in storage unit 105a to the AND operation circuit 101a of the input/output interface 101 based on the write enable signal BWE. The address register 105 maintains the "high" level state when its own LUN 100 is selected.

The AND operation circuit 101a outputs an operation result to an OR operation circuit 101b based on the command CMD and the address ADD. The AND operation circuit 101a outputs a "high"-level signal only when both the command CMD and the address ADD are at the high level.

The OR operation circuit 101b generates signal EN based on the operation result of the AND operation circuit 101a, the command latch enable signal CLE, or the address latch enable signal ALE. The OR operation circuit 101b outputs "low"-level signal EN only when the operation result of the AND operation circuit 101a, the command latch enable signal CLE, and the address latch enable signal ALE are all at the "low" level. In other words, the OR operation circuit 101b outputs "high"-level signal EN when at least one of the operation results of the AND operation circuit 101a, the command latch enable signal CLE, or the address latch enable signal ALE is at the "high" level. In the following description, changing the level of signal EN from the "low" level to the "high" level may be referred to as "raising", and changing the level of signal EN from the "high" level to the "low" level may be referred to as "lowering".

The receiver 120 receives an input/output signal DQ in the LUN 100 based on signal EN and the input/output signal DQ. Specifically, a NAND operation circuit 101c generates a signal based on the signal EN supplied from the OR operation circuit 101b and the input/output signal DQ supplied from the memory controller 20. The NAND operation circuit 101c generates a "low"-level signal only when signal EN and the input/output signal DQ are both at the "high" level. Then, an inverter 101d inverts and outputs the operation result of the NAND operation circuit 101c. That is, the receiver 120 receives the input/output signal DQ in the LUN 100 only when signal EN and the input/output signal DQ are both at the "high" level.

In the following description, the state where "high"-level signal EN is input to the receiver 120 may be described as an "active state", and the state where "low"-level signal EN is input to the receiver 120 may be described as a "standby state". When the receiver 120 is in the active state, the receiver 120 is in a state capable of receiving input/output data DQ. When the receiver 120 is in the standby state, the receiver 120 is in a state incapable of receiving input/output data DQ.

<1-2>Operation

<1-2-1>Overview of Operation of Memory System

An overview of the operation of the memory system according to the present embodiment will be described with reference to FIG. 4.

In the description of FIG. 4, an overview of the operation of the case where the target of access (such as a write operation or a read operation) is changed from LUN (0) to LUN (1) will be described, while focusing on the operation of memory group GP0. As shown in FIG. 4, while LUN (0) is being accessed, signal EN in LUN (0) is brought to the "high" level, and signals EN in LUN (1) to LUN (3) are brought to the "low" level. That is, while LUN (0) is being accessed, the receiver 120 of LUN (0) is placed in the active state, and the receivers 120 of LUN (1) to LUN (3) are placed in the standby state.

Then, at time T0, the memory system 1 performs a LUN switching operation. At this time, signals EN in all the LUNs (LUN (0) to LUN (3)) in memory group GP0 are brought to the "high" level. That is, at the time of the LUN switching operation, at least the receivers 120 of all the LUNs (LUN (0) to LUN (3)) in memory group GP0 are placed in the active state.

If the address of LUN (1) is determined as the selected LUN address at time T1, access to LUN (1) is started. While LUN (1) is being accessed, signal EN in LUN (1) is brought to the "high" level, and signals EN in LUN (0), LUN (2), and LUN (3) are brought to the "low" level. That is, while LUN (1) is being accessed, the receiver 120 of LUN (1) is placed in the active state, and the receivers 120 of LUN (0), LUN (2), and LUN (3) are placed in the standby state.

<1-2-2>Write Operation Example 1

Write operation example 1 of the memory system 1 according to the present embodiment will be described with reference to FIG. 5. Here, a command sequence in memory group GP0 will be described.

At time T2, the memory controller 20 asserts the command latch enable signal CLE ("high" level). At time T2, the chip enable signal BCE has already been asserted ("low" level). When the command latch enable signal CLE is asserted, signal EN is brought to the "high" level as described with reference to FIG. 3.

The LUN 100 needs to wait for period $t_{CALS}$ as a period required for the setup for command input after the command latch enable signal CLE is asserted.

At time T3, which is period $t_{CALS}$ after time T2, the memory controller 20 issues commands "01h" and "80h".

Command "01h" is a command issued, for example, when the memory cell transistor MC can hold 3-bit data. More specifically, command "01h" is a command for designating the first page. Here, command "01h" is shown as an example, but the command is not limited to this. When the memory controller 20 designates another page, another command may be input. Command "80h" is a command for designating a write operation.

The memory controller 20 asserts the write enable signal BWE ("low" level) every time it issues a signal of a command, an address, data, or the like. Then, every time the write enable signal BWE is toggled, the signal is taken into the LUN 100.

Subsequently, the memory controller 20 issues addresses (C1, C2: column address, R1 to R3: row address), for example, over five cycles, and asserts the address latch enable signal ALE ("high" level).

When an address is issued, the command latch enable signal CLE is negated ("low" level), but the address latch enable signal ALE is asserted. When the address latch enable signal ALE is asserted, signal EN is brought to the "high" level as described with reference to FIG. 3. That is, at the time of receiving an address, the LUN 100 maintains signal EN at the "high" level.

In the meantime, a selected LUN address is included in, for example, row address R3, and a selected LUN 100 is determined by row address R3 being supplied to the LUNs 100. When the selected LUN 100 is determined, the address latch circuit 105 outputs a "high"-level signal in the selected LUN 100 as described with reference to FIG. 3. As a result, signal EN in the selected LUN 100 is maintained at the "high" level. On the other hand, in each non-selected LUN 100, the address latch circuit 105 outputs a "low"-level signal. As a result, signal EN in the selected LUN 100 is brought to the "low" level. In other words, the receiver 120 of the selected LUN 100 is maintained in the active state, and the receiver 120 of each non-selected LUN 100 is placed in the standby state.

Next, the memory controller 20 outputs write data (DO to Dn) over a plurality of cycles. During this period, signals ALE and CLE are negated ("L" level). The write data received by the LUN 100 is held in a page buffer in the sense amplifier 111.

Figure 5:
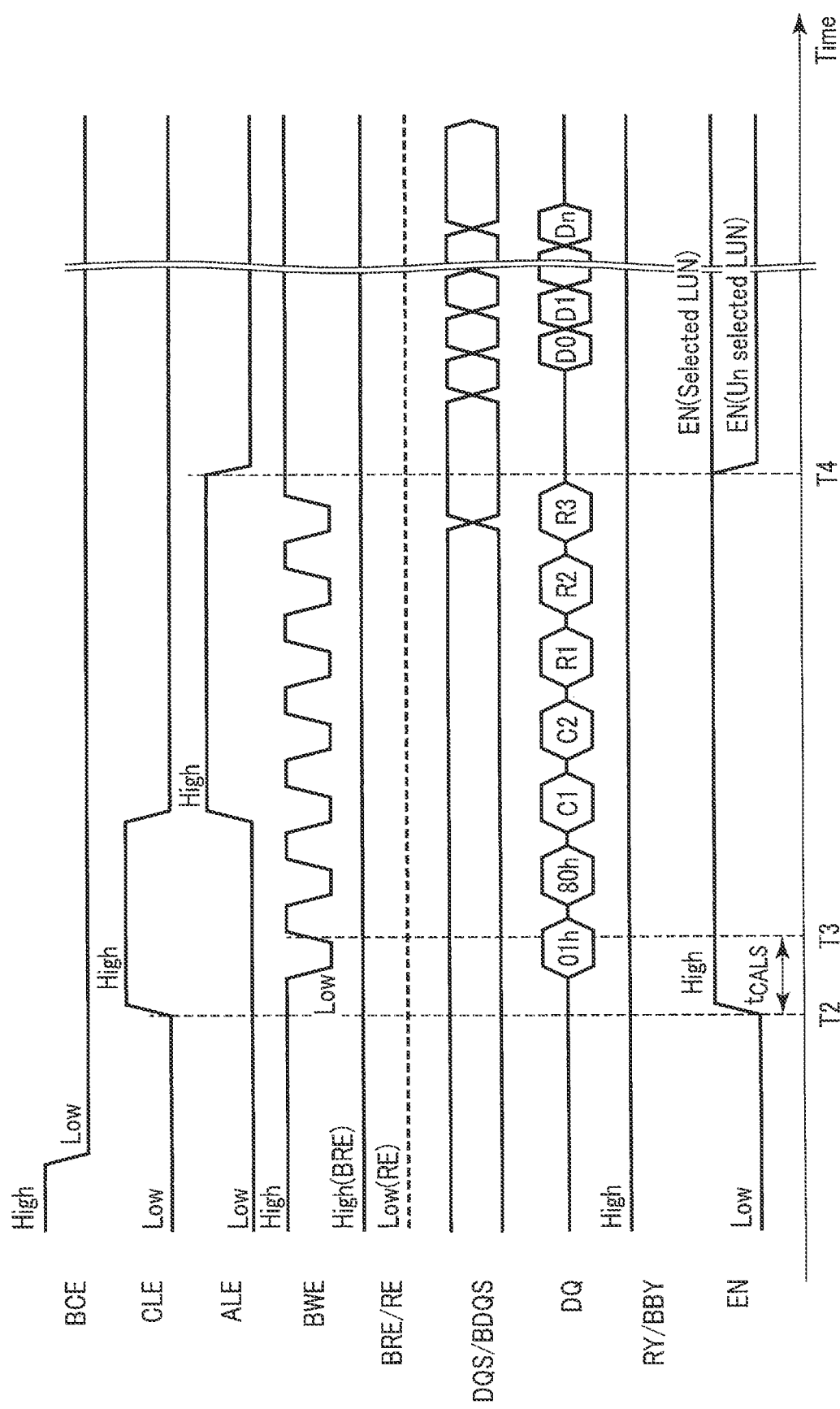
FIG. 5 is a timing chart showing a write operation example of the memory system according to the first embodiment.

Although not shown in FIG. 5, the memory controller 20 issues write command "10H", and asserts the command latch enable signal CLE. Upon receipt of command "10h", the control circuit 103 starts a write operation, and the LUN 100 is placed in the busy state (RY/BBY="low" level).

<1-2-3>Read Operation Example 1

Figure 6:
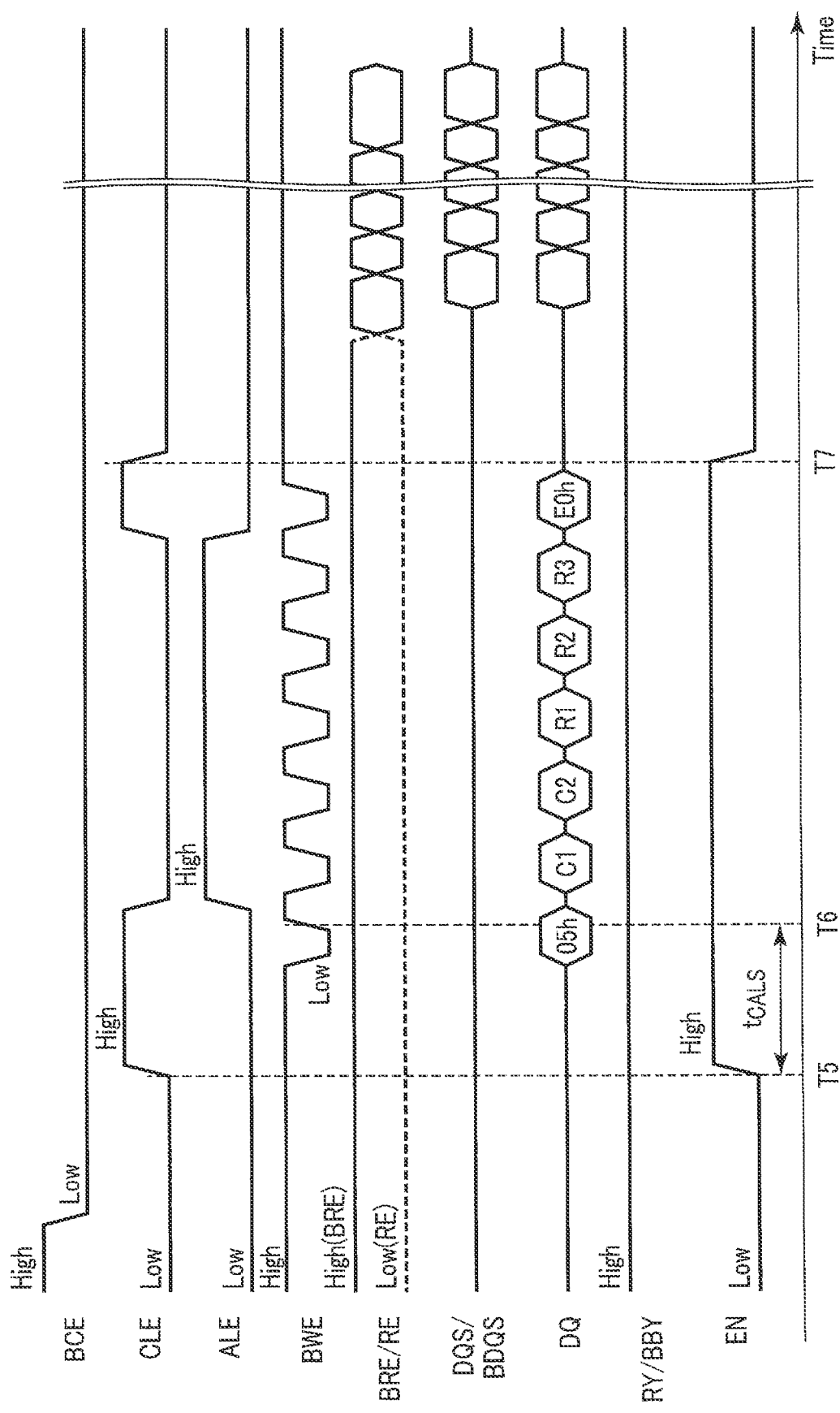
FIG. 6 is a timing chart showing a read operation example of the memory system according to the first embodiment.

Read operation example 1 of the memory system 1 according to the present embodiment will be described with reference to FIG. 6. Here, a command sequence in memory group GP0 will be described.

At time T5, the memory controller 20 asserts the command latch enable signal CLE. At time T5, the chip enable signal BCE has already been asserted. When the command latch enable signal CLE is asserted, signal EN is brought to the "high" level.

At time T6, which is period $t_{CALS}$ after time T5, the memory controller 20 issues read command "05h".

Subsequently, the memory controller 20 issues addresses (C1, C2: column address, R1 to R3: row address), for example, over five cycles, and asserts the address latch enable signal ALE ("high" level).

The memory controller 20 issues command "E0h". Upon receipt of command "E0h", the LUN 100 starts a read operation.

The command register 104 recognizes that the operation requested from the memory controller 20 is a read operation. Then, the command register 104 supplies a "low"-level signal to the AND operation circuit 101a (see FIG. 3). Consequently, signal EN is brought to the "low" level. That is, the receiver 120 is placed in the standby state.

<1-3>Effects

According to the above-described embodiment, the electrical coupling between each LUN 100 and the data input/output lines is appropriately controlled by using the address ADD, the command CMD, the command latch enable signal CLE, the address latch enable signal ALE, and the like.

For example, in the write operation, if the non-selected LUNs 100 receive write data, unnecessary current flows to the LUNs 100. However, by adopting the above-described embodiment, the operating current of the non-selected LUNs 100 can be suppressed.

Furthermore, in the read operation, the LUN 100 does not need to receive data. By adopting the above-described embodiment, the operating current of the LUN 100 can be suppressed.

<2>Second Embodiment

The second embodiment will be described. In the second embodiment, another configuration of the input/output interface will be described. The basic configuration and basic operation of the memory device according to the second embodiment are the same as those of the memory device according to the above-described first embodiment. Thus, descriptions of matters described in the first embodiment and matters inferable from the first embodiment will be omitted.

<2-1>Configuration of Input/Output Interface

Next, a configuration of the input/output interface 101 of a memory system according to the second embodiment will be specifically described with reference to FIG. 7.

As shown in FIG. 7, the input/output interface 101 performs input/output of an input/output signal DQ based on the command latch enable signal CLE, the address latch enable signal ALE, and the signal from the command register 104 or the address register 105.

Specifically, NAND operation circuit 101g outputs an operation result to NAND operation circuit 101h based on the command latch enable signal CLE and the address latch enable signal ALE. NAND operation circuit 101g generates a "low"-level signal only when the command latch enable signal CLE and the address latch enable signal ALE are both at the "high" level.

NAND operation circuit 101h and NAND operation circuit 101i constitute an RS flip-flop circuit. Specifically, NAND operation circuit 101h outputs an operation result based on operation results of NAND operation circuit 101g and NAND operation circuit 101i. NAND operation circuit 101i outputs the operation result of NAND operation circuit 101h and the signal (for example, command CMD) from the command register 104.

The operation of this RS flip-flop circuit will be briefly described. When the signal from NAND operation circuit 101g is at the "high" level, and the signal from the command register 104 is at the "low" level, NAND operation circuit 101h outputs a "low"-level signal. When the signal from NAND operation circuit 101g is at the "low" level, and the signal from the command register 104 is at the "high" level, NAND operation circuit 101h outputs a "high"-level signal. Even if the signal from NAND operation circuit 101g or the signal from the command register 104 changes in the state where the output signal of NAND operation circuit 101h is determined, the output signal of NAND operation circuit 101h is maintained.

The OR operation circuit 101j generates signal EN based on the operation result of NAND operation circuit 101h and the signal from the address register 105. The OR operation circuit 101j outputs "low"-level signal EN only when the operation result of NAND operation circuit 101h and the signal from the address register 105 are both at the "low" level. In other words, the OR operation circuit 101j outputs a "high"-level signal EN when at least one of the operation result of NAND operation circuit 101h or the signal from the address register 105 is at the "high" level.

The receiver 120 receives an input/output signal DQ in the LUN 100 only when signal EN and the input/output signal DQ are both at the "high" level.

<2-2>Operation

The difference between the operation described in the first embodiment and the operation in the second embodiment is the method of raising signal EN in the LUN 100.

In the memory system 1 according to the first embodiment, signal EN is raised based on the assertion of the command latch enable signal CLE. In the memory system 1 according to the second embodiment, signal EN is raised by simultaneously asserting the command latch enable signal CLE and the address latch enable signal ALE. The operation of simultaneously asserting the command latch enable signal CLE and the address latch enable signal ALE is an operation for raising signal EN.

<2-2-1>Write Operation Example 2

Write operation example 2 of the memory system 1 according to the present embodiment will be described with reference to FIG. 8. Here, a command sequence in memory group GP0 will be described.

At time T8, the memory controller 20 asserts the command latch enable signal CLE and the address latch enable signal ALE. Consequently, signal EN is brought to the "high" level as described with reference to FIG. 7. Thereafter, the memory controller 20 negates the command latch enable signal CLE and the address latch enable signal ALE. Thus, although the input signal of NAND operation circuit 101h changes, the input signal of NAND operation circuit 101i does not change; therefore, the output signal of NAND operation circuit 101h is maintained at the "high" level. As a result, signal EN is maintained at the "high" level.

At time T9, which is period $t_{CALS}$ after time T8, the memory controller 20 issues read commands "01h" and "80h".

When the selected LUN 100 is determined at time T10, the address latch circuit 105 outputs a "high"-level signal in the selected LUN 100 as described with reference to FIG. 7. As a result, signal EN in the selected LUN 100 is maintained at the "high" level. On the other hand, in each non-selected LUN 100, the address latch circuit 105 outputs a "low"-level signal. As a result, signal EN in the selected LUN 100 is brought to the "low" level. In other words, the receiver 120 of the selected LUN 100 is maintained in the active state, and each non-selected LUN 100 is placed in the standby state.

The memory controller 20 issues addresses (C1, C2: column address, R1 to R3: row address), for example, over five cycles, and asserts the address latch enable signal ALE ("high" level).

Next, the memory controller 20 outputs write data (D0 to Dn) over a plurality of cycles. During this period, signals ALE and CLE are negated. The write data received at the LUN 100 is held in the page buffer in the sense amplifier 130.

<2-2-2>Write Operation Example 3

Write operation example 3 of the memory system 1 according to the present embodiment will be described with reference to FIGS. 9 and 10. Here, a command sequence in memory group GP0 will be described.

Since the method of raising signal EN in write operation example 3 is the same as that in write operation example 2, the description thereof will be omitted. Here, the timing of lowering signal EN in each non-selected LUN 100 will be described.

For example, a selected LUN address is included in row address R3. A selected LUN 100 is determined by row address R3 being supplied to the LUNs 100. When the selected LUN 100 is determined, signal EN in the selected LUN 100 is maintained at the "high" level, and signal EN in each non-selected LUN 100 is brought to the "low" level. In other words, the receiver 120 of the selected LUN 100 is maintained in the active state, and each non-selected LUN 100 is placed in the standby state.

Figure 9:
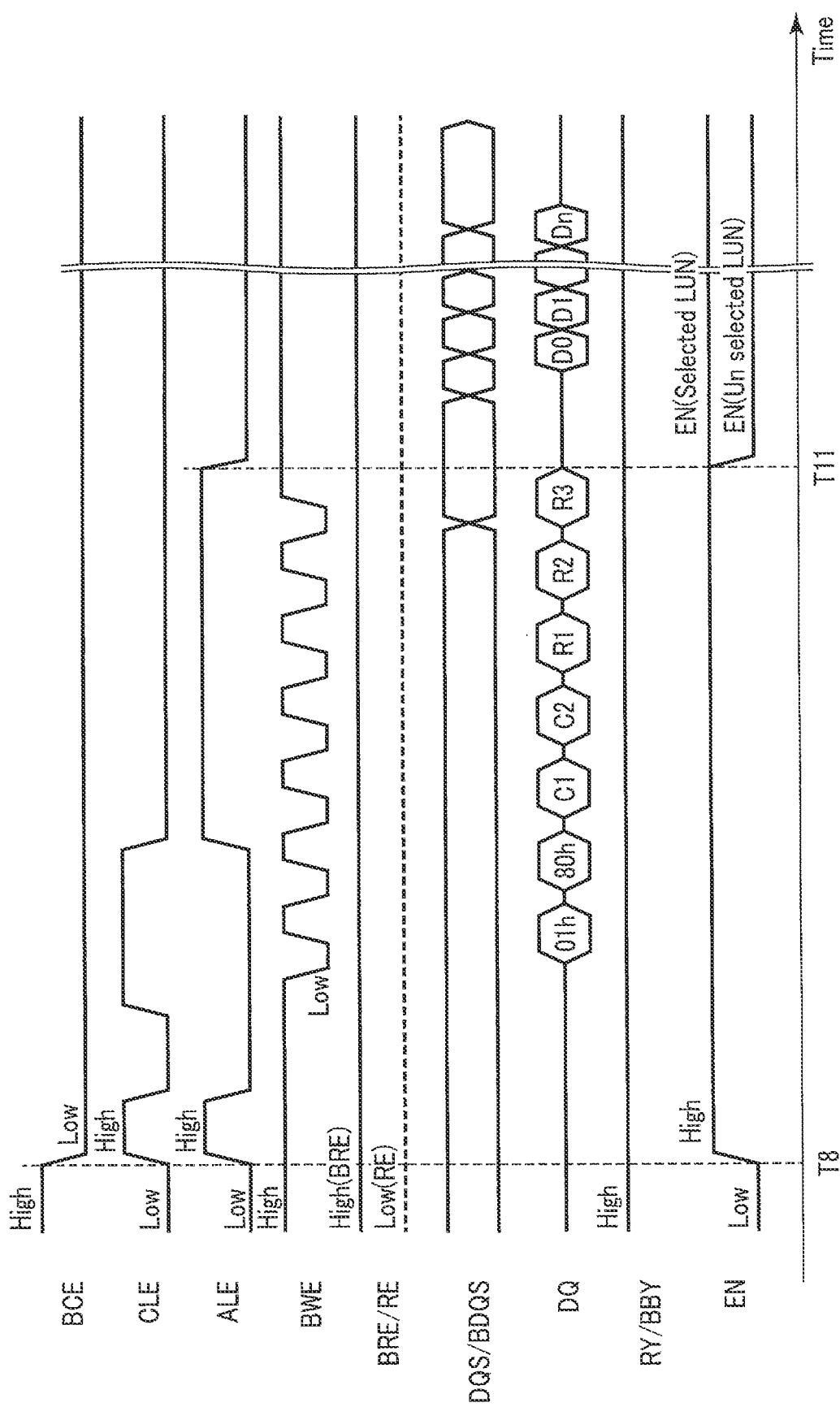
FIG. 9 is a timing chart showing a write operation example of the memory system according to the second embodiment.

As shown in FIG. 9, signal EN in each non-selected LUN 100 may be brought to the "low" level immediately after receipt of row address R3. As shown in FIG. 10, signal EN in each non-selected LUN 100 may be brought to the "low" level at timings before and after input/output of data.

<2-2-3>Read Operation Example 2

Read operation example 2 of the memory system 1 according to the present embodiment will be described with reference to FIG. 11. Here, a command sequence in memory group GP0 will be described.

The method of raising signal EN in read operation example 2 is the same as that in write operation example 2.

At time T13, the memory controller 20 asserts the command latch enable signal CLE and the address latch enable signal ALE. Consequently, signal EN is brought to the "high" level as described with reference to FIG. 7.

At time T14, which is period $t_{CALS}$ after time T13, read command "05h" is issued.

Upon receipt of "05h", the command register 104 recognizes that the operation requested from the memory controller 20 is a read operation. Then, the command register 104 supplies a "low"-level signal to the AND operation circuit 101a (see FIG. 3). Consequently, signal EN is brought to the "low" level. That is, the receiver 120 is placed in the standby state.

<2-2-4>Read Operation Example 3

Read operation example 3 of the memory system 1 according to the present embodiment will be described with reference to FIGS. 12 to 14. Here, a command sequence in memory group GP0 will be described.

Since the method of raising signal EN in read operation example 3 is the same as that in read operation example 2, the description thereof will be omitted. Here, the timing of lowering signal EN in the LUN 100 will be described.

The command register 104 recognizes that the operation requested from the memory controller 20 is a read operation. Then, the command register 104 supplies a "low"-level signal to the AND operation circuit 101a (see FIG. 3). Consequently, signal EN is brought to the "low" level. That is, the receiver 120 is placed in the standby state.

Figure 12:
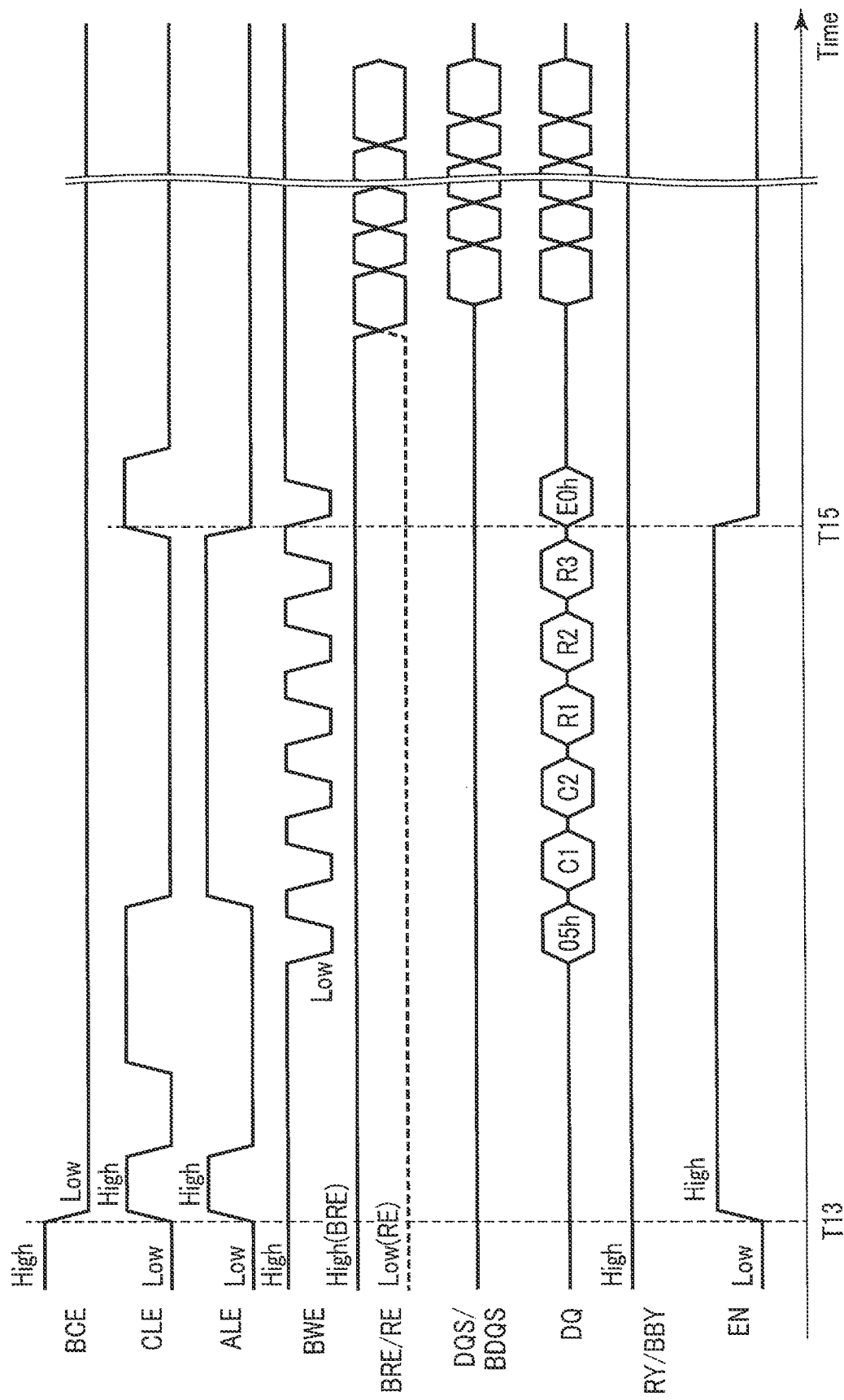
FIG. 12 is a timing chart showing a read operation example of the memory system according to the second embodiment.
Figure 13:
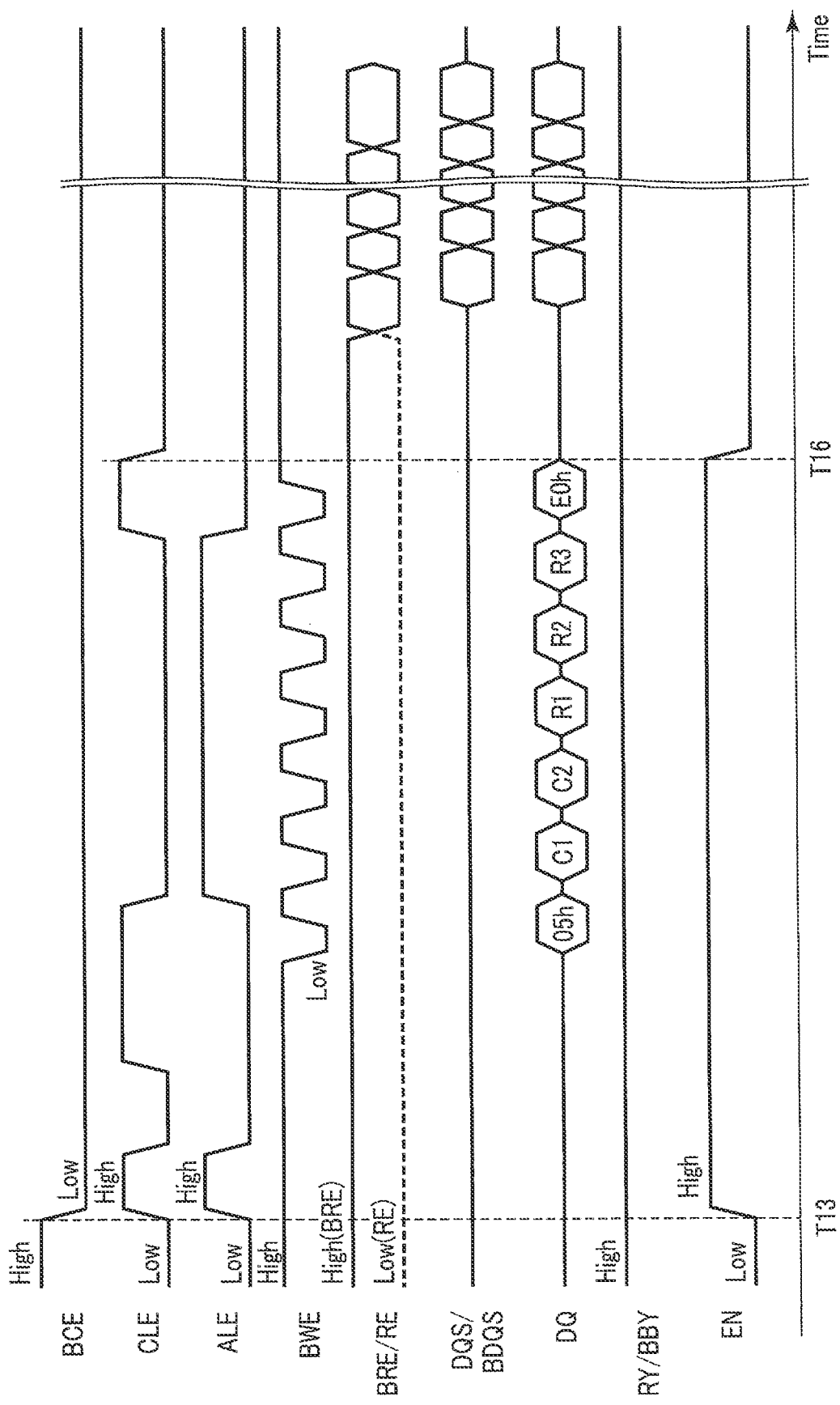
FIG. 13 is a timing chart showing a read operation example of the memory system according to the second embodiment.

As shown in FIG. 12, signal EN in the LUN 100 may be brought to the "low" level immediately after receipt of row address R3. Alternatively, as shown in FIG. 13, signal EN in the LUN 100 may be brought to the "low" level immediately after receipt of command "E0h". Alternatively, as shown in FIG. 14, signal EN in the LUN 100 may be brought to the "low" level at timings before and after input/output of data.

<2-3>Effects

According to the above-described embodiment, the receivers 120 of a plurality of LUNs 100 are placed in the active state by simultaneously asserting the command latch enable signal CLE and the address latch enable signal ALE.

As the data input/output speed increases, the command address input cycle needs to be speeded up. For example, in the case of the first embodiment, if the data input/output is speeded up, a problem that a sufficient time from the assertion of the command latch enable signal CLE cannot be secured for the setup for command input, and the setup cannot be performed in time may occur. In other words, a problem that the LUN 100 is not electrically coupled to the data input/output lines via the receiver 120 before a command is input, and that the LUN 100 can not properly receive the command may occur.

Therefore, in the present embodiment, the receiver 120 is brought into the active state before the command latch enable signal CLE is asserted for command input. This makes it possible to reduce the substantial period $t_{CALS}$ in comparison to the first embodiment. Consequently, a memory system capable of properly transmitting and receiving input/output signals DQ even when data input/output is speeded up can be provided.

<2-4>Modification 1 of Second Embodiment

<2-4-1>Write Operation Example 4

Write operation example 4 of the memory system 1 according to the present embodiment will be described with reference to FIG. 15. Here, a command sequence in memory group GP0 will be described.

Since the method of raising signal EN in write operation example 4 is the same as that in write operation example 2 in the second embodiment, the description thereof will be omitted. Here, the timing of lowering signal EN in each non-selected LUN 100 will be described.

For example, a selected LUN address is included in row address R3. A selected LUN 100 is determined by row address R3 being supplied to the LUNs 100. As shown in FIG. 7, when the selected LUN 100 is determined, and command "XXh" is further input, the output signal of the command register 104 is brought to the "low" level. On the other hand, in the selected LUN 100, the address register 105 maintains the "high"-level signal, and in each non-selected LUN 100, the address register 105 outputs a "low"-level signal. Therefore, signal EN in the selected LUN 100 is maintained at the "high" level, and signal EN in each non-selected LUN 100 is brought to the "low" level. In other words, the receiver 120 of the selected LUN 100 is maintained in the active state, and the receiver 120 of each non-selected LUN 100 is placed in the standby state.

<2-4-2>Read Operation Example 4

Figure 16:
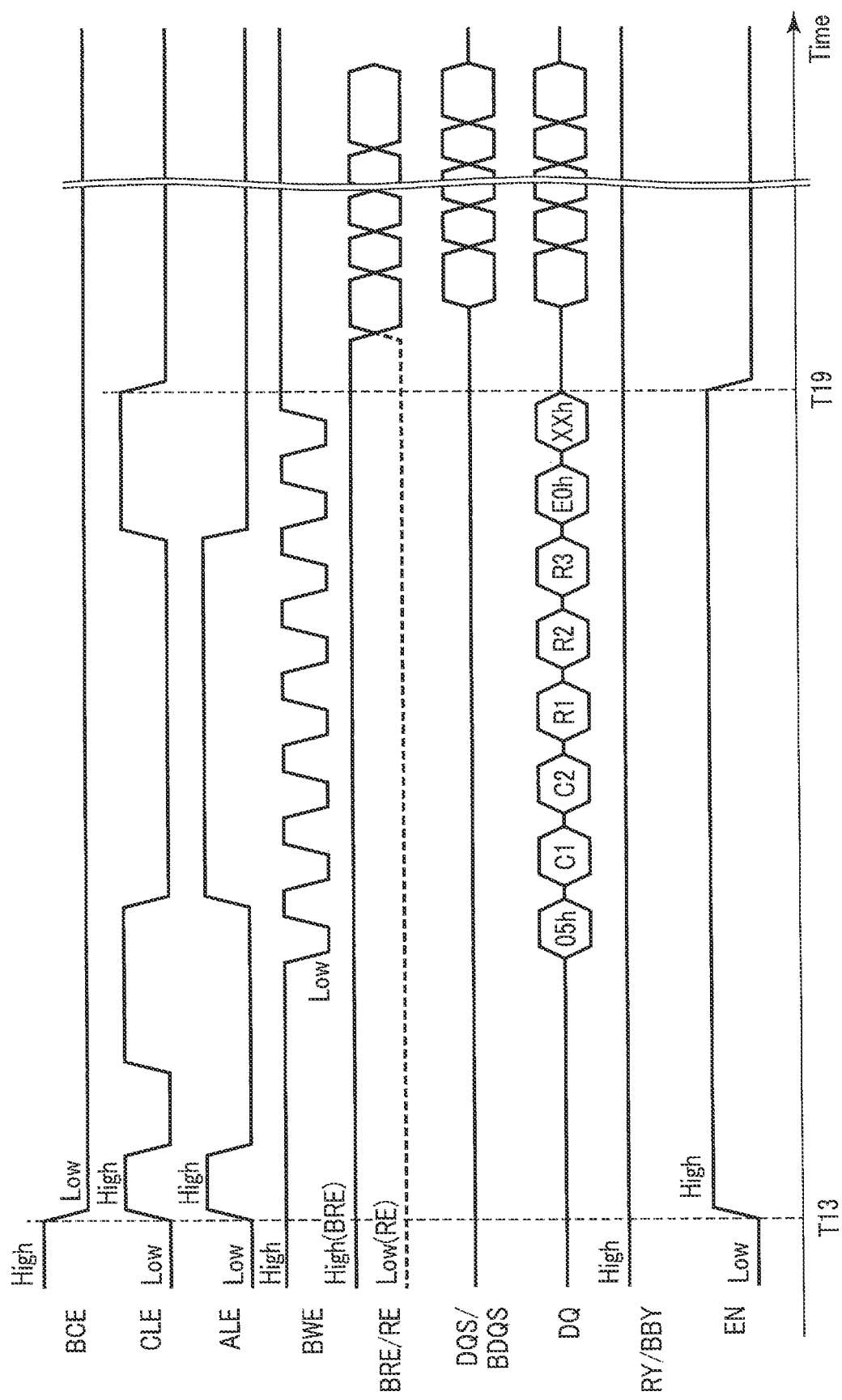
FIG. 16 is a timing chart showing a read operation example of the memory system according to modification 1 of the second embodiment.

Read operation example 4 of the memory system 1 according to the present embodiment will be described with reference to FIG. 16. Here, a command sequence in memory group GP0 will be described.

Since the method of raising signal EN in read operation example 4 is the same as that in read operation example 2 in the second embodiment, the description thereof will be omitted. Here, the timing of lowering signal EN in the LUN 100 will be described.

Upon receipt of "XXh", the command register 104 recognizes that the operation requested from the memory controller 20 is a read operation. Then, the command register 104 supplies a "low"-level signal to the AND operation circuit 101a (see FIG. 3). Consequently, signal EN is brought to the "low" level. That is, the receiver 120 is placed in the standby state.

<2-5>Modification 2 of Second Embodiment

A configuration of the input/output interface 101 of a memory system according to modification 2 of the second embodiment will be specifically described with reference to FIG. 17.

The input/output interface 101 shown in FIG. 17 includes a circuit for performing control to prevent the receiver 120 from being electrically coupled to the LUN 100 and to the data input/output lines at the time of data output.

Specifically, as shown in FIG. 17, the input/output interface 101 includes NAND circuit 101k. NAND operation circuit 101k outputs an operation result to NAND operation circuit 101l based on the inversion signal /CLE of the command latch enable signal CLE, the inversion signal /ALE of the address latch enable signal ALE, the inversion signal /BCE of the chip enable signal BCE, and the write enable signal BWE. NAND operation circuit 101k generates a "low"-level signal only when signals /CLE, /ALE, /BCE, and BWE are all at the "high" level.

NAND operation circuit 101l and NAND operation circuit 101m constitute an RS flip-flop circuit. Specifically, NAND operation circuit 101l outputs an operation result based on operation results of NAND operation circuit 101k and NAND operation circuit 101m. NAND operation circuit 101m outputs an operation result based on the operation result of NAND operation circuit 101l and the read enable signal BRE.

The operation of this RS flip-flop circuit will be briefly described. When the signal from NAND operation circuit 101k is at the "high" level, and the read enable signal BRE is at the "low" level, NAND operation circuit 101l outputs a "low"-level signal. Furthermore, when the signal from NAND operation circuit 101k is at the "low" level, and the read enable signal BRE is at the "high" level, NAND operation circuit 101l outputs a "high"-level signal. Even if the signal from NAND operation circuit 101k or the read enable signal BRE changes in the state where the output signal of NAND operation circuit 101l is determined, the output signal of NAND operation circuit 101l is maintained.

Then, the inverter 101n inverts the output signal of NAND operation circuit 101l and supplies it to the AND operation circuit 101o.

The AND operation circuit 101o outputs an operation result to the OR operation circuit 101p based on the output signal of the inverter 101n and the signal from the address register 105. The AND operation circuit 101o outputs a "high"-level signal only when the output signal of the inverter 101n and the signal from the address register 105 are both at the "high" level.

The OR operation circuit 101p generates signal EN based on operation results of the AND operation circuit 101o and NAND operation circuit 101h. The OR operation circuit 101p outputs "low"-level signal EN only when the operation results of the AND operation circuit 101o and NAND operation circuit 101h are both at the "low" level. In other words, when at least one of the operation results of the AND operation circuit 101o and NAND operation circuit 101h is at the "high" level, the OR operation circuit 101p outputs "high"-level signal EN.

In the data output period, signals /CLE, /ALE, /BCE, BWE, and BREA are all brought to the "high" level. As a result, the output signal of NAND operation circuit 101l outputs a "high"-level signal. As a result, signal EN is at the "low" level in the data output period.

As described above, the input/output interface 101 of the memory system according to modification 2 of the second embodiment can perform control to prevent the receiver 120 from being electrically coupled to the LUN 100 and the data input/output lines at the time of data output.

<3>Third Embodiment

The third embodiment will be described. In the third embodiment, another configuration of the input/output interface will be described. The basic configuration and basic operation of the memory device according to the third embodiment are the same as those of the memory devices according to the above-described first and second embodiments. Thus, descriptions of matters described in the first and second embodiments and matters inferable from the first and second embodiments will be omitted.

<3-1>Configuration of Input/Output Interface

Figure 18:
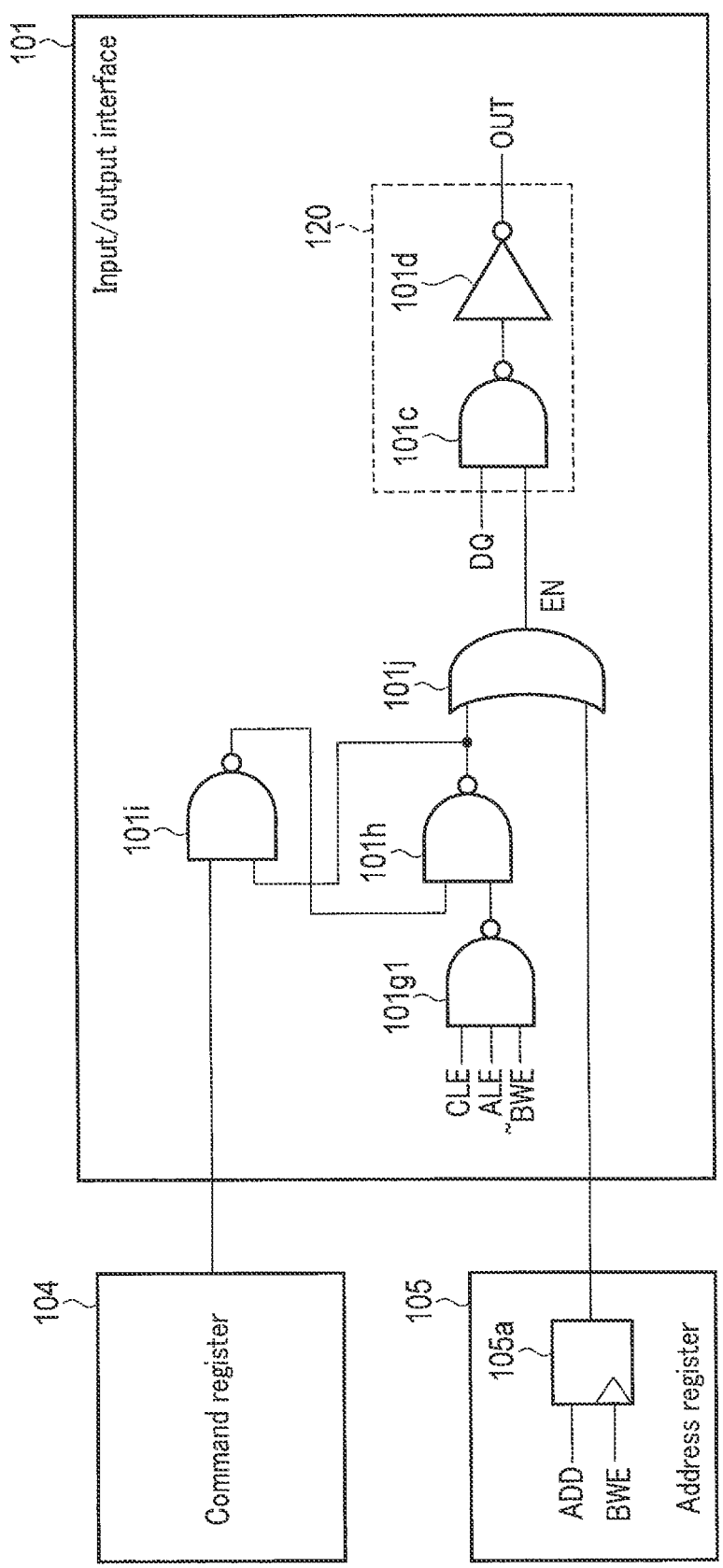
FIG. 18 is a circuit diagram of the input/output interface of the memory system according to the third embodiment.

Next, a configuration of the input/output interface 101 of a memory system according to the third embodiment will be specifically described with reference to FIG. 18. The input/output interface 101 of the memory system according to the third embodiment further performs input/output of an input/output signal DQ based on the inversion signal /BWE of the write enable signal BWE, in comparison to the input/output interface 101 of the memory system according to the second embodiment.

Specifically, NAND operation circuit 101g1 outputs an operation result to NAND operation circuit 101h based on signals CLE, ALE, and /BWE. NAND operation circuit 101g1 generates a "low"-level signal only when signals CLE, ALE, and /BWE are all at the "high" level.

<3-2>Operation

The difference between the operation described in the second embodiment and the operation in the third embodiment is the method of raising signal EN in the LUN 100.

In the memory system 1 according to the second embodiment, signal EN is raised by simultaneously asserting the command latch enable signal CLE and the address latch enable signal ALE. On the other hand, in the memory system 1 according to the third embodiment, signal EN is raised by simultaneously asserting the command latch enable signal CLE, the address latch enable signal ALE, and the write enable signal BWE. That is, the operation of simultaneously asserting signals CLE, ALE, and BWE is an operation for raising signal EN.

<3-2-1>Write Operation Example 5

Write operation example 5 of the memory system 1 according to the present embodiment will be described with reference to FIG. 19. Here, a command sequence in memory group GP0 will be described.

At time T8, the memory controller 20 asserts the command latch enable signal CLE, the address latch enable signal ALE, and the write enable signal BWE. Consequently, signal EN is brought to the "high" level as described with reference to FIG. 18. Thereafter, the memory controller 20 negates the command latch enable signal CLE, the address latch enable signal ALE, and the write enable signal BWE. Thus, although the input signal of NAND operation circuit 101h changes, the input signal of NAND operation circuit 101i does not change; therefore, the output signal of NAND operation circuit 101h is maintained at the "high" level. As a result, signal EN is maintained at the "high" level.

The operation after time T9 is the same as the operation described with reference to FIG. 8.

<3-2-2>Other Access Operations

As shown in FIG. 20, the method of raising signal EN of write operation example 5 may be applied to write operation example 3 described with reference to FIG. 9.

Similarly, as shown in FIG. 21, the method of raising signal EN of write operation example 5 may be applied to write operation example 3 described in FIG. 10.

Figure 22:
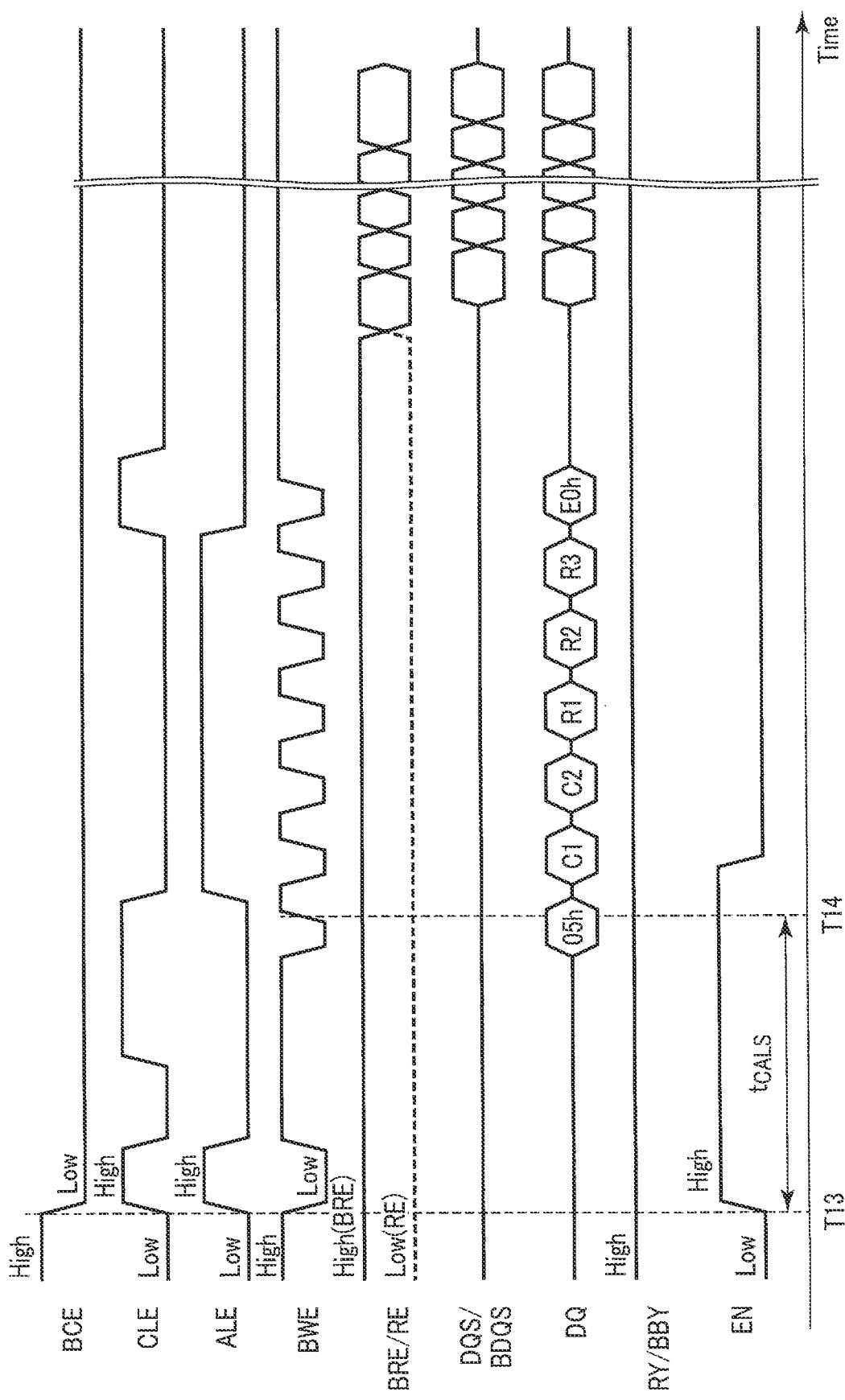
FIG. 22 is a timing chart showing a read operation example of the memory system according to the third embodiment.

As shown in FIG. 22, the method of raising signal EN of write operation example 5 may be applied to read operation example 2 described with reference to FIG. 11.

Figure 23:
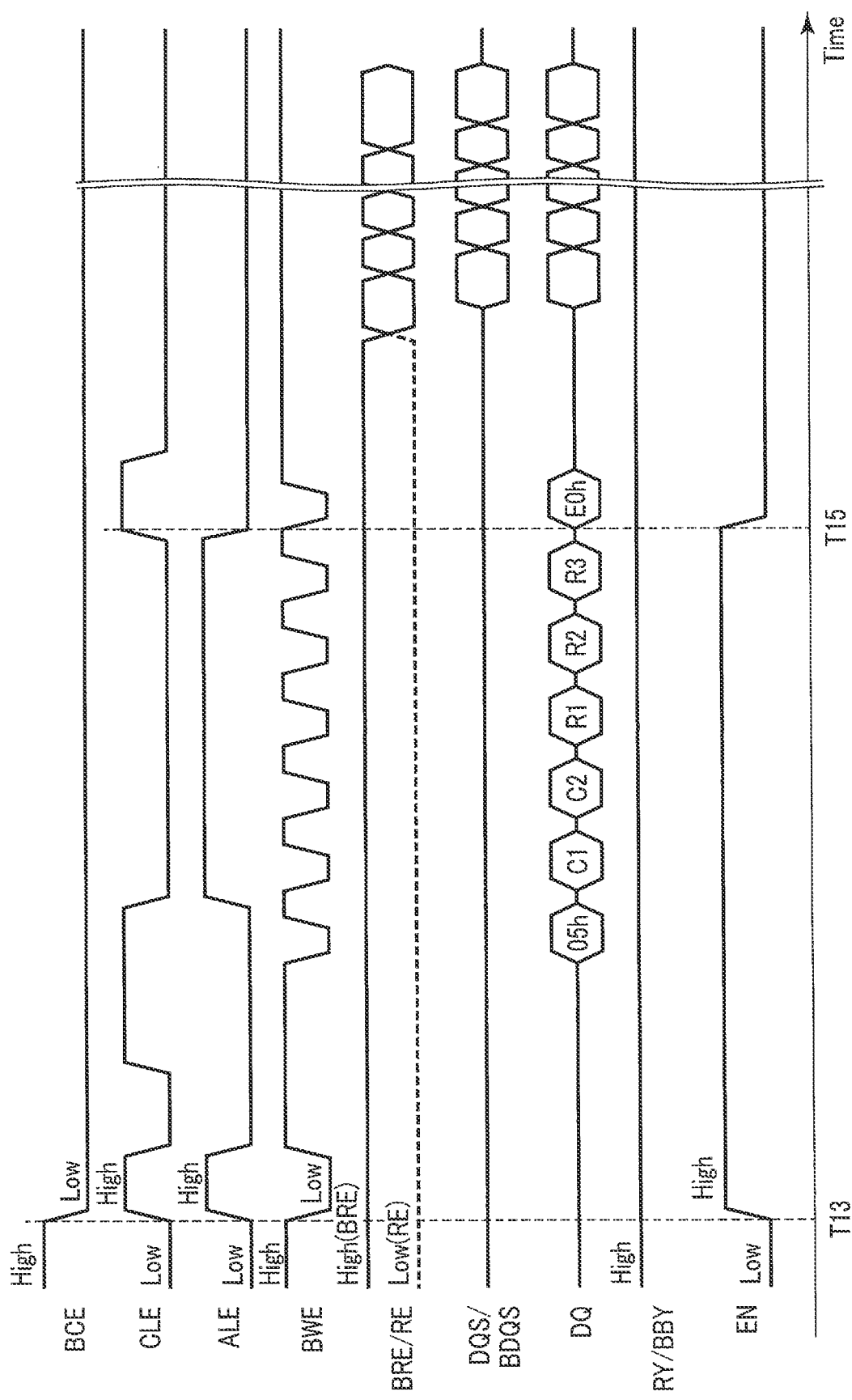
FIG. 23 is a timing chart showing a read operation example of the memory system according to the third embodiment.

Similarly, as shown in FIG. 23, the method of raising signal EN of write operation example 5 may be applied to read operation example 3 described in FIG. 12.

Figure 24:
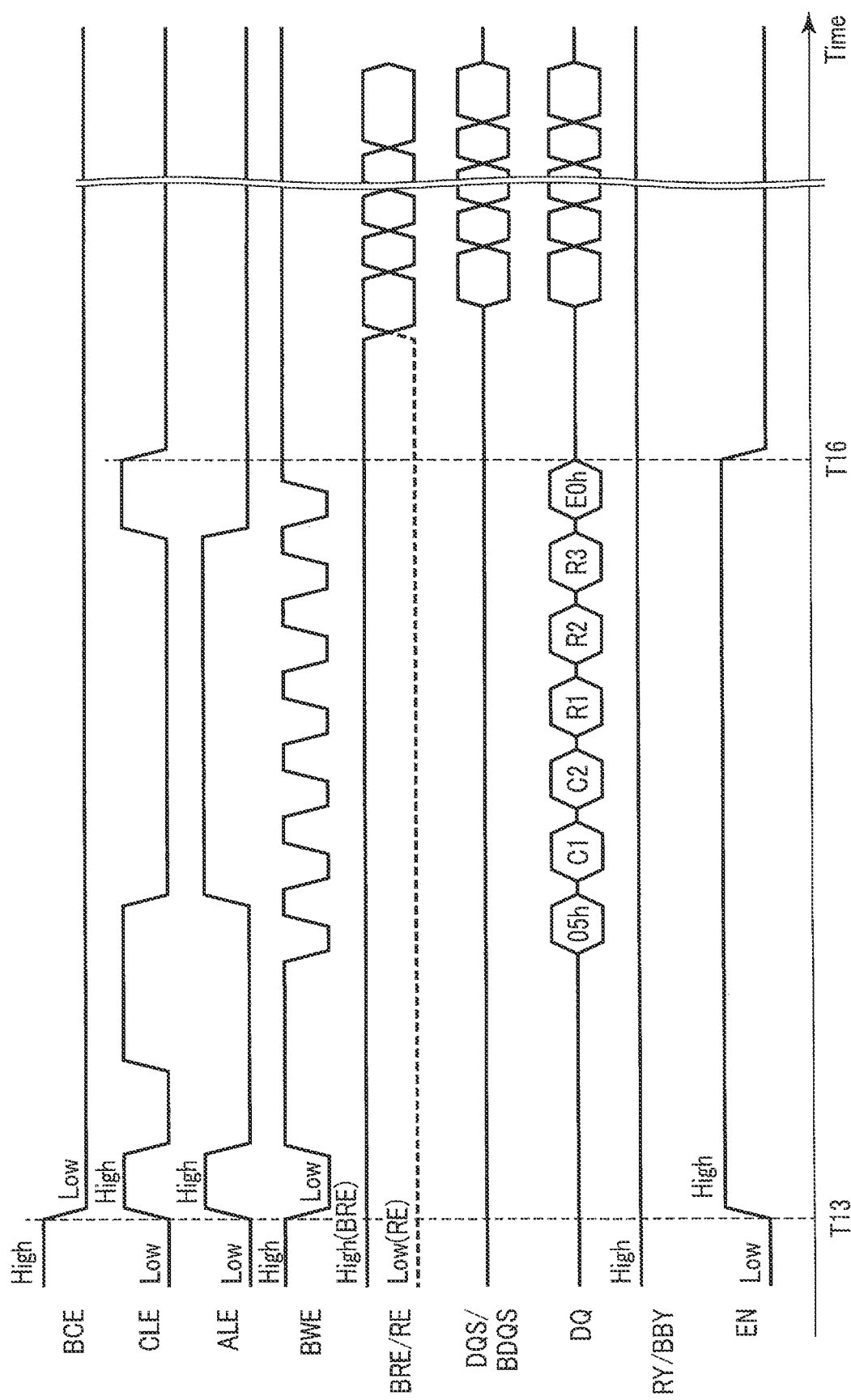
FIG. 24 is a timing chart showing a read operation example of the memory system according to the third embodiment.

Similarly, as shown in FIG. 24, the method of raising signal EN of write operation example 5 may be applied to read operation example 3 described with reference to FIG. 13.

Figure 25:
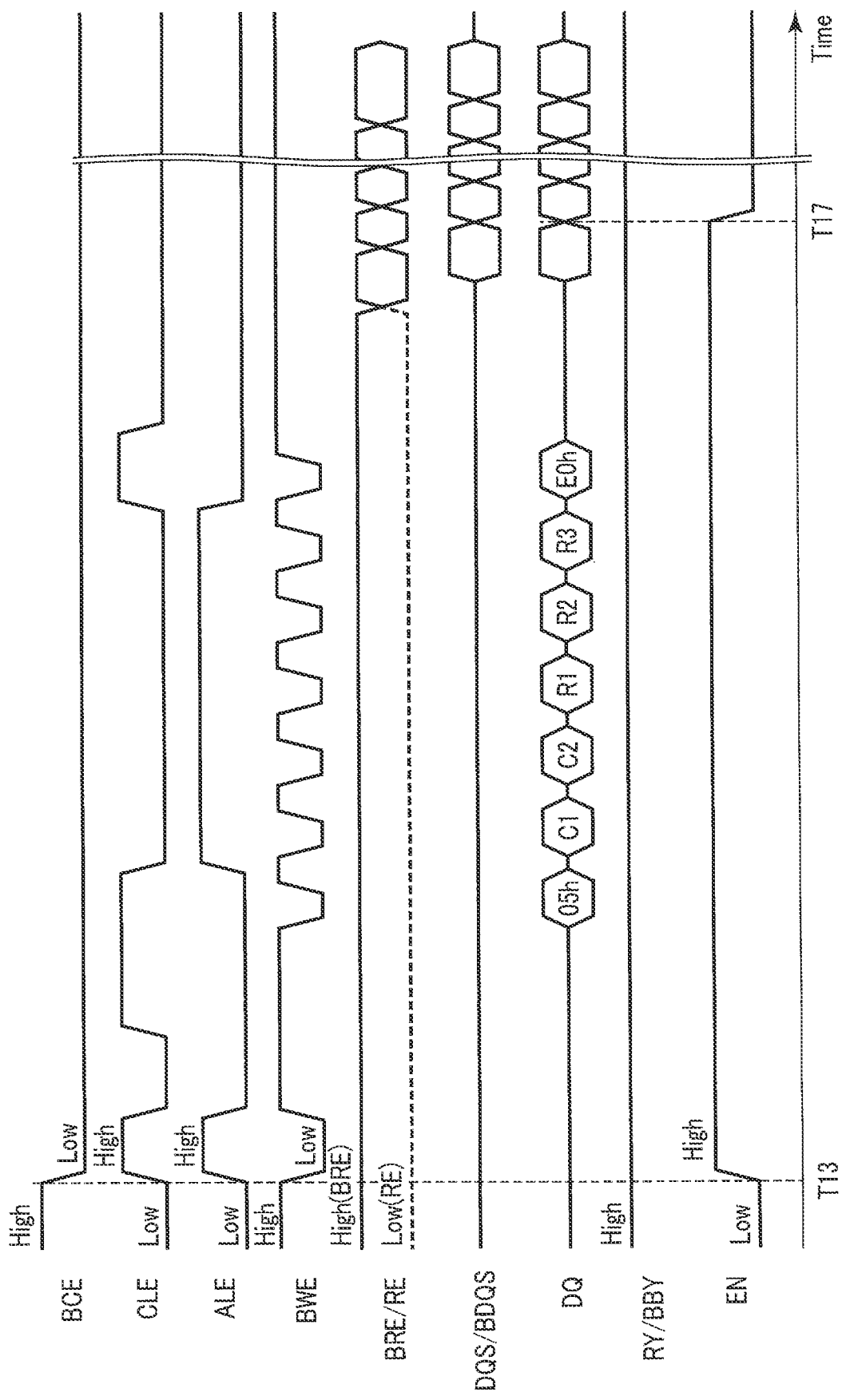
FIG. 25 is a timing chart showing a read operation example of the memory system according to the third embodiment.

Similarly, as shown in FIG. 25, the method of raising signal EN of write operation example 5 may be applied to read operation example 3 described in FIG. 14.

Figure 26:
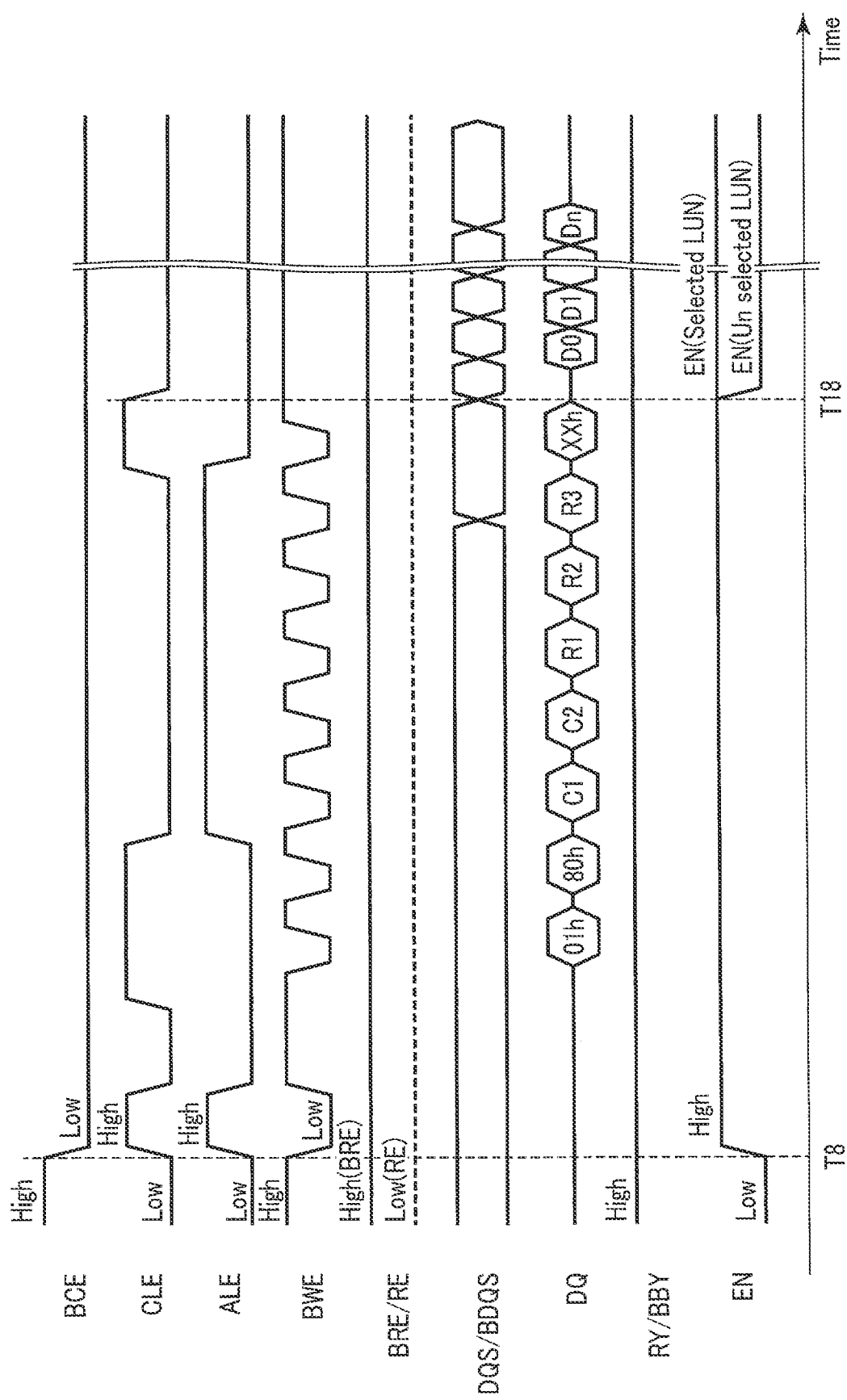
FIG. 26 is a timing chart showing a write operation example of the memory system according to the third embodiment.

Similarly, as shown in FIG. 26, the method of raising signal EN of write operation example 5 may be applied to write operation example 4 described in FIG. 15.

Similarly, as shown in FIG. 27, the method of raising signal EN of write operation example 5 may be applied to read operation example 4 described with reference to FIG. 16.

<3-3>Effects

According to the above-described embodiment, the same effects as those of the second embodiment can be obtained.

<3-4>Modification of Third Embodiment

Next, a configuration of the input/output interface 101 of a memory system according to a modification of the third embodiment will be specifically described with reference to FIG. 28. The input/output interface 101 of the memory system according to the modification of the third embodiment further performs input/output of an input/output signal DQ based on the inversion signal /BWE of the write enable signal BWE, in comparison to the input/output interface 101 of the memory system according to modification 2 of the second embodiment.

Specifically, NAND operation circuit 101g1 outputs an operation result to NAND operation circuit 101h based on signals CLE, ALE, and /BWE. NAND operation circuit 101g1 generates a "low"-level signal only when signals CLE, ALE, and /BWE are all at the "high" level.

<4>Fourth Embodiment

The fourth embodiment will be described. In the fourth embodiment, another configuration of the input/output interface will be described. The basic configuration and basic operation of the memory device according to the fourth embodiment are the same as those of the memory devices according to the above-described first to third embodiments. Thus, descriptions of matters described in the first to third embodiments and matters inferable from the first to third embodiments will be omitted.

<4-1>Configuration of Input/Output Interface

As shown in FIG. 29, the input/output interface 101 of the memory system 1 according to the first embodiment may be combined with the input/output interface 101 of the memory system 1 according to the second embodiment.

Furthermore, as shown in FIG. 29, the switch circuit 101q enables selection of which of signal EN of the input/output interface 101 of the memory system 1 according to the first embodiment and signal EN of the input/output interface 101 of the memory system 1 according to the second embodiment is to be used. For example, selection of an output signal is enabled by signal MS being generated by a "Set Feature" operation or the like, and being input to the switch circuit 101q. The "Set Feature" operation is an operation for changing the operation mode or the like of the LUN 100.

<4-2>Operation

Here, a mode selection operation of the memory system according to the present embodiment will be described with reference to FIG. 30.

Figure 30:
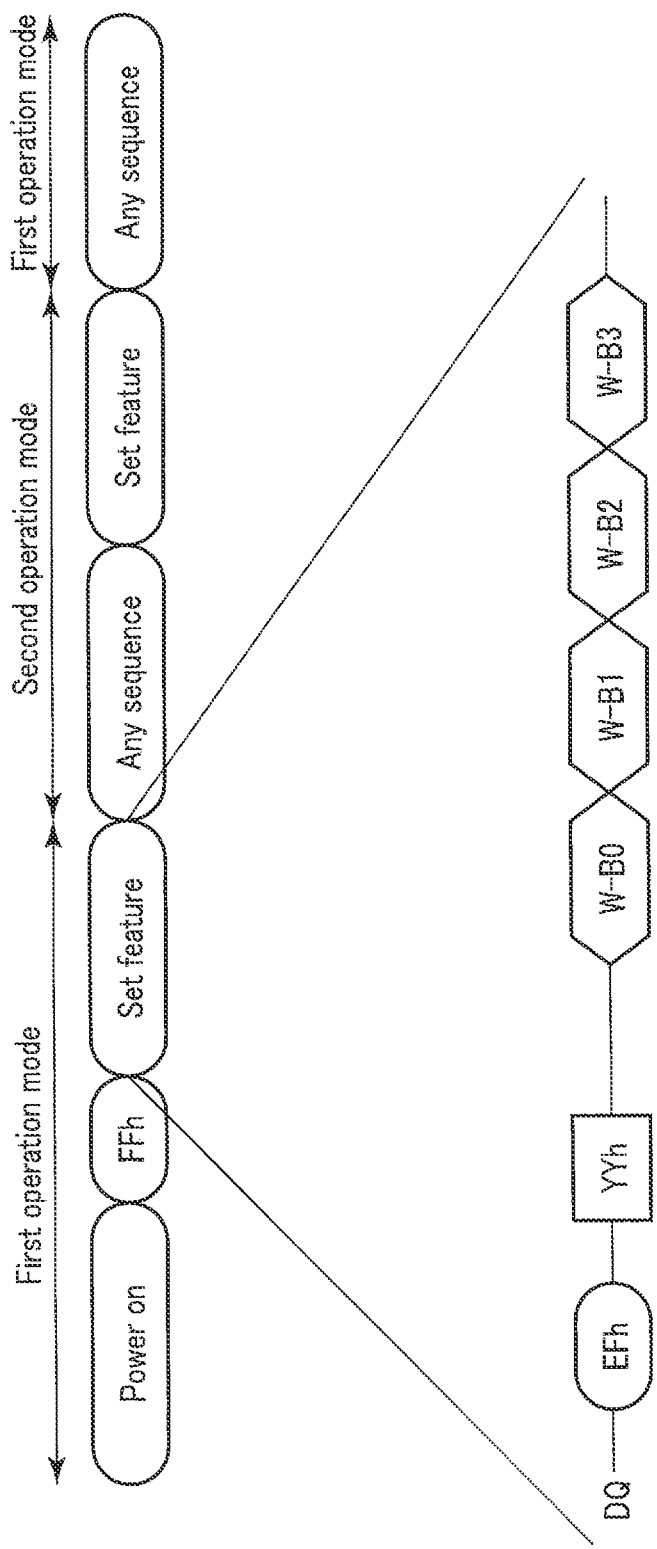
FIG. 30 is a diagram showing the mode selection operation of the memory system according to the fourth embodiment.

As shown in FIG. 30, when the memory system 1 is powered on, the LUN 100 is set in a first operation mode.

Then, the memory controller 20 issues an initialization command "FFh". Subsequently, the memory controller 20 performs the "Set Feature" operation.

Specifically, the memory controller 20 sequentially issues commands "EFh" and "YYh" concerning the "Set Feature" operation to the LUN 100, and then issues information (W-B0 to W-B3) concerning a change of the operation mode.

Upon receipt of the commands "EFh" and "YYh" and the information (W-B0 to W-B3), the LUN 100 changes the operation mode. For example, in the present embodiment, the operation mode is changed to a second operation mode.

Here, an operation of the switch circuit 101q of when the first operation mode is changed to the second operation mode will be briefly described. As shown in FIG. 29, for example, in the first operation mode, the switch circuit 101q is sometimes controlled so that the output signal of OR circuit 101b is selected and output as signal EN. By switching the first operation mode to the second operation mode, the switch circuit 101q is controlled so that the output signal of OR circuit 101j is selected and output as signal EN.

Thereafter, the LUN 100 operates in the second operation mode unless the operation mode is changed by the "Set Feature" operation.

When it is desired to operate the LUN 100 in the first operation mode, the operation mode needs to be changed again by the "Set Feature" operation.

<4-3>Effects

As described above, by using the switch circuit 101q, the first and second embodiments can be appropriately combined, thereby enabling an appropriate operation.

<4-4>Modification 1 of Fourth Embodiment

Figure 31:
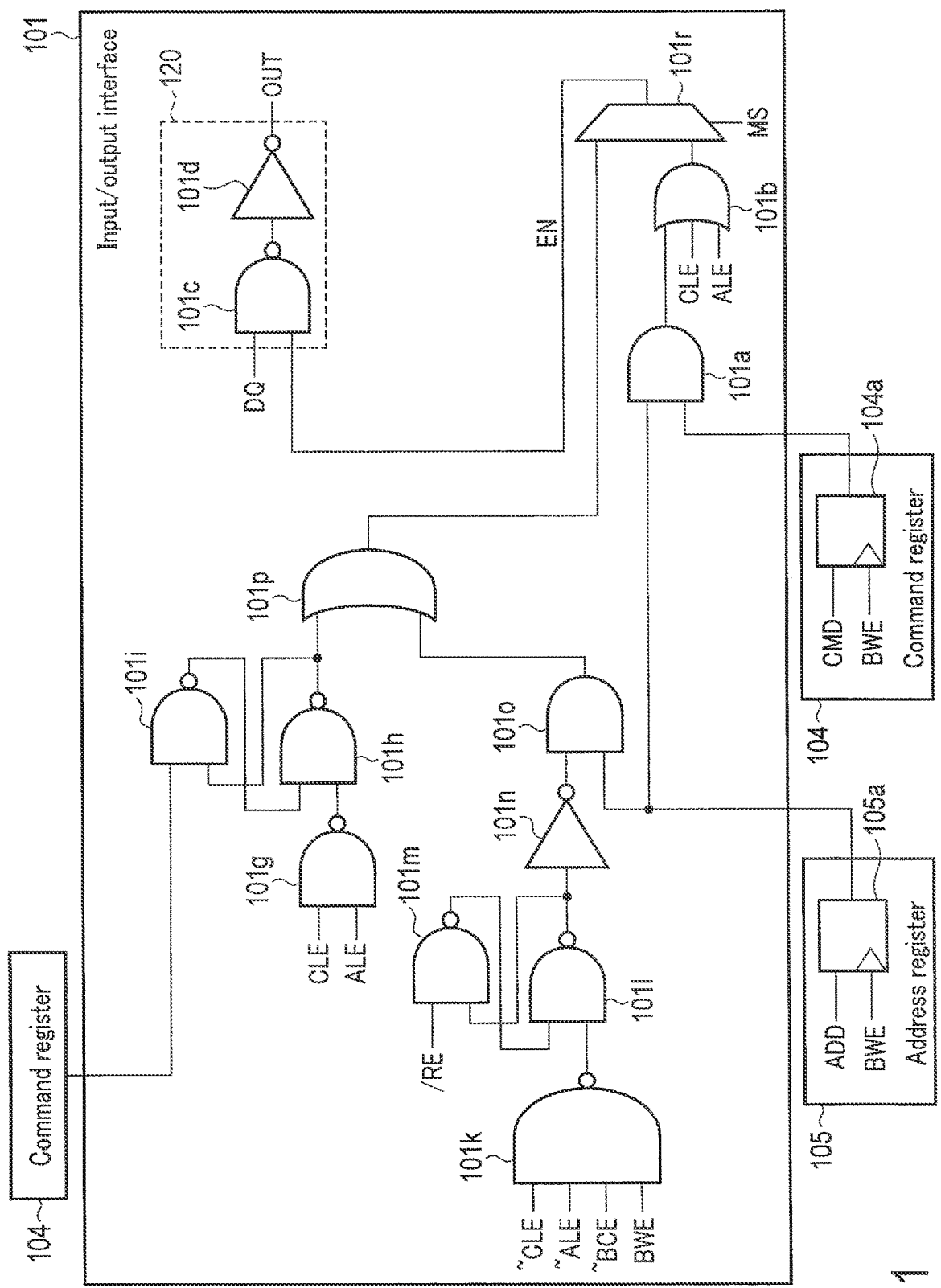
FIG. 31 is a circuit diagram of the input/output interface of the memory system according to modification 1 of the fourth embodiment.

As shown in FIG. 31, the input/output interface 101 of the memory system 1 according to the first embodiment may be combined with the input/output interface 101 of the memory system 1 according to modification 2 of the second embodiment.

Furthermore, as shown in FIG. 31, the switch circuit 101r enables selection of which of the signal of the input/output interface 101 of the memory system 1 according to the first embodiment and the signal of the input/output interface 101 of the memory system 1 according to modification 2 of the second embodiment is to be used. For example, selection of an output signal is enabled by signal MS being generated by a "Set Feature" operation or the like, and being input to the switch circuit 101r. The "Set Feature" operation is the same as the operation described with reference to FIG. 30.

<4-5>Modification 2 of Fourth Embodiment

Figure 32:
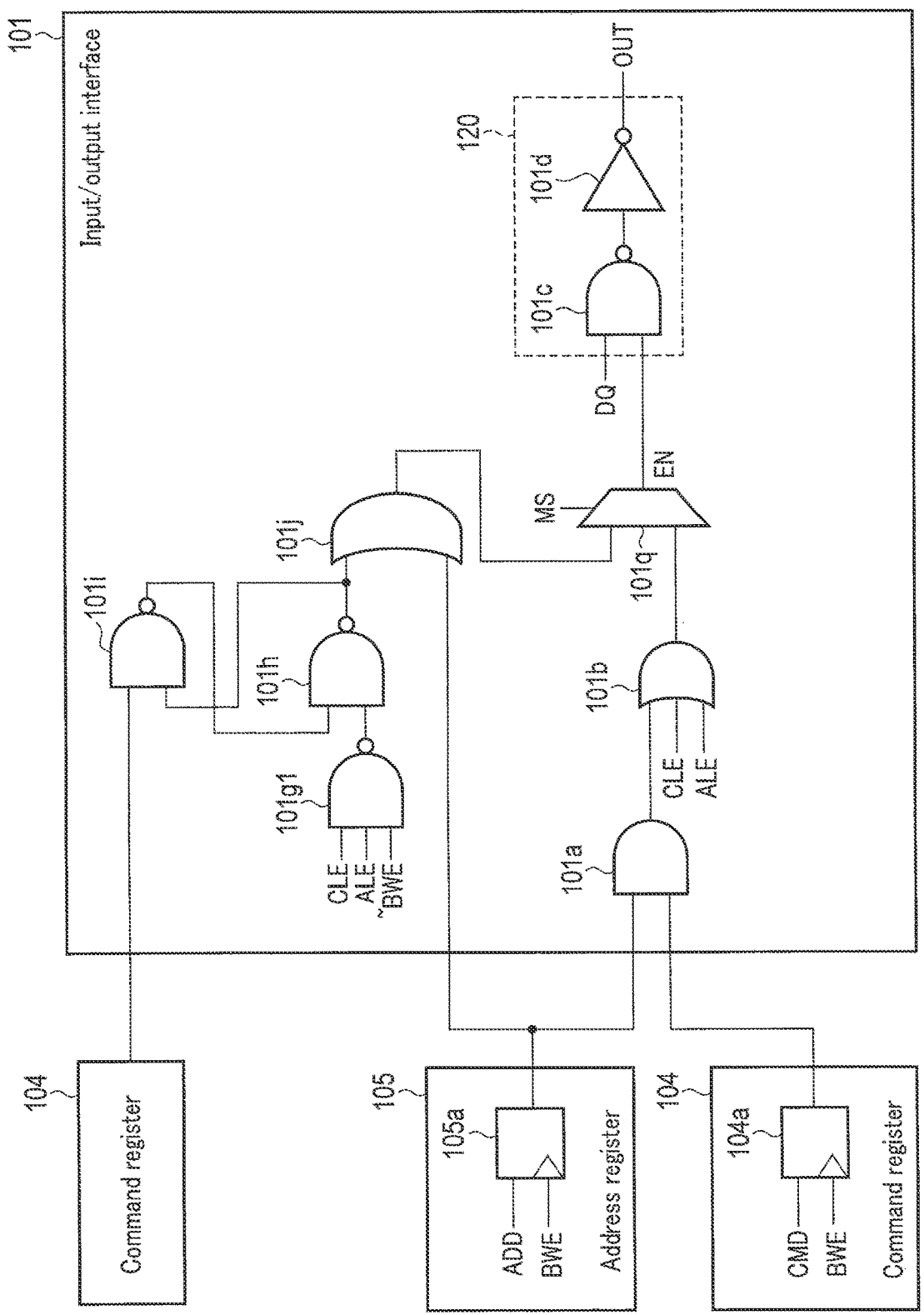
FIG. 32 is a circuit diagram of the input/output interface of the memory system according to modification 2 of the fourth embodiment.

As shown in FIG. 32, the input/output interface 101 of the memory system 1 according to the first embodiment may be combined with the input/output interface 101 of the memory system 1 according to the third embodiment.

Furthermore, as shown in FIG. 32, the switch circuit 101q enables selection of which of the signal of the input/output interface 101 of the memory system 1 according to the first embodiment and the signal of the input/output interface 101 of the memory system 1 according to the third embodiment is to be used. For example, selection of an output signal is enabled by signal MS being generated by a "Set Feature" operation or the like, and being input to the switch circuit 101q. The "Set Feature" operation is the same as the operation described with reference to FIG. 30.

<4-6>Modification 3 of Fourth Embodiment

As shown in FIG. 33, the input/output interface 101 of the memory system 1 according to the first embodiment may be combined with the input/output interface 101 of the memory system 1 according to the modification of the third embodiment.

Furthermore, as shown in FIG. 33, the switch circuit 101r enables selection of which of the signal of the input/output interface 101 of the memory system 1 according to the first embodiment and the signal of the input/output interface 101 of the memory system 1 according to the modification of the third embodiment is to be used. For example, selection of an output signal is enabled by signal MS being generated by a "Set Feature" operation or the like, and being input to the switch circuit 101r. The "Set Feature" operation is the same as the operation described with reference to FIG. 30.

<5>Fifth Embodiment

The fifth embodiment will be described. In the fifth embodiment, another configuration of the input/output interface will be described. The basic configuration and basic operation of the memory device according to the fifth embodiment are the same as those of the memory devices according to the above-described first and second embodiments. Thus, descriptions of matters described in the first and second embodiments and matters inferable from the first and second embodiments will be omitted.

<5-1>Configuration of Input/Output Interface

Next, a configuration of the input/output interface 101 will be specifically described with reference to FIG. 34.

As shown in FIG. 34, the input/output interface 101 performs input/output of an input/output signal DQ based on the inversion signal /BWP of the write protect signal BWP or the signal from the address register 105.

The OR operation circuit 101s generates signal EN based on signal /BWP and the signal from the address register 105. The OR operation circuit 101s outputs "low"-level signal EN only when signal /BWP and the signal from the address register 105 are both at the "low" level. In other words, the OR operation circuit 101s outputs "high"-level signal EN when at least one of signal /BWP or the signal from the address register 105 is at the "high" level.

The receiver 120 receives an input/output signal DQ in the LUN 100 based on signal EN and the input/output signal DQ. The receiver 120 receives an input/output signal DQ in the LUN 100 only when signal EN and the input/output signal DQ are both at the "high" level.

<5-2>Operation

<5-2-1>Write Operation Example 6

Figure 35:
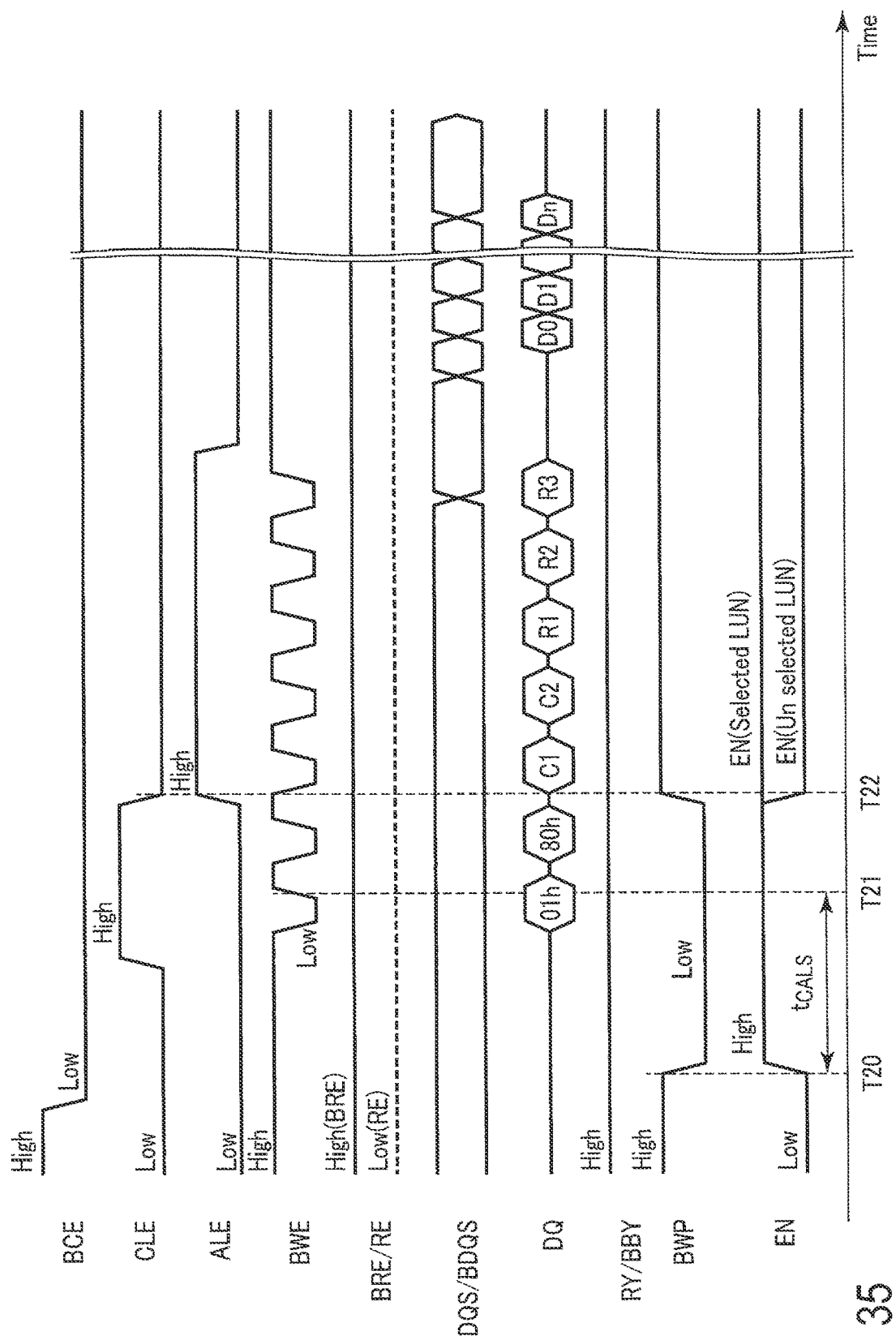
FIG. 35 is a timing chart showing a write operation example of the memory system according to the fifth embodiment.

Write operation example 6 of the memory system 1 according to the present embodiment will be described with reference to FIG. 35. Here, a command sequence in memory group GP0 will be described.

At time T20, the memory controller 20 asserts the write protect signal BWP ("low" level). While the write protect signal BWP is being asserted, signal EN is maintained at the "high" level.

At time T21, which is period $t_{CALS}$ after time T20, the memory controller 20 issues write commands "01h" and "80h".

After the address of the LUN 100 is determined, the memory controller 20 negates the write protect signal BWP ("high" level) at time T22. When the write protect signal BWP is negated, signal EN in each non-selected LUN 100 is brought to the "low" level. On the other hand, in the selected LUN 100, since the signal in the address register 105 is maintained "high", signal EN is maintained at the "high" level.

The other operations are the same as those described with reference to FIG. 8.

As described above, in the present embodiment, signal EN is controlled using the write protect signal BWP. On the other hand, when this operation is realized, a write protect operation cannot be performed. However, by using the "Set Feature" operation or the like, switching between the mode for operating the present embodiment and the mode for using the write protect operation can be performed as appropriate.

<5-2-2>Write Operation Example 7

Figure 37:
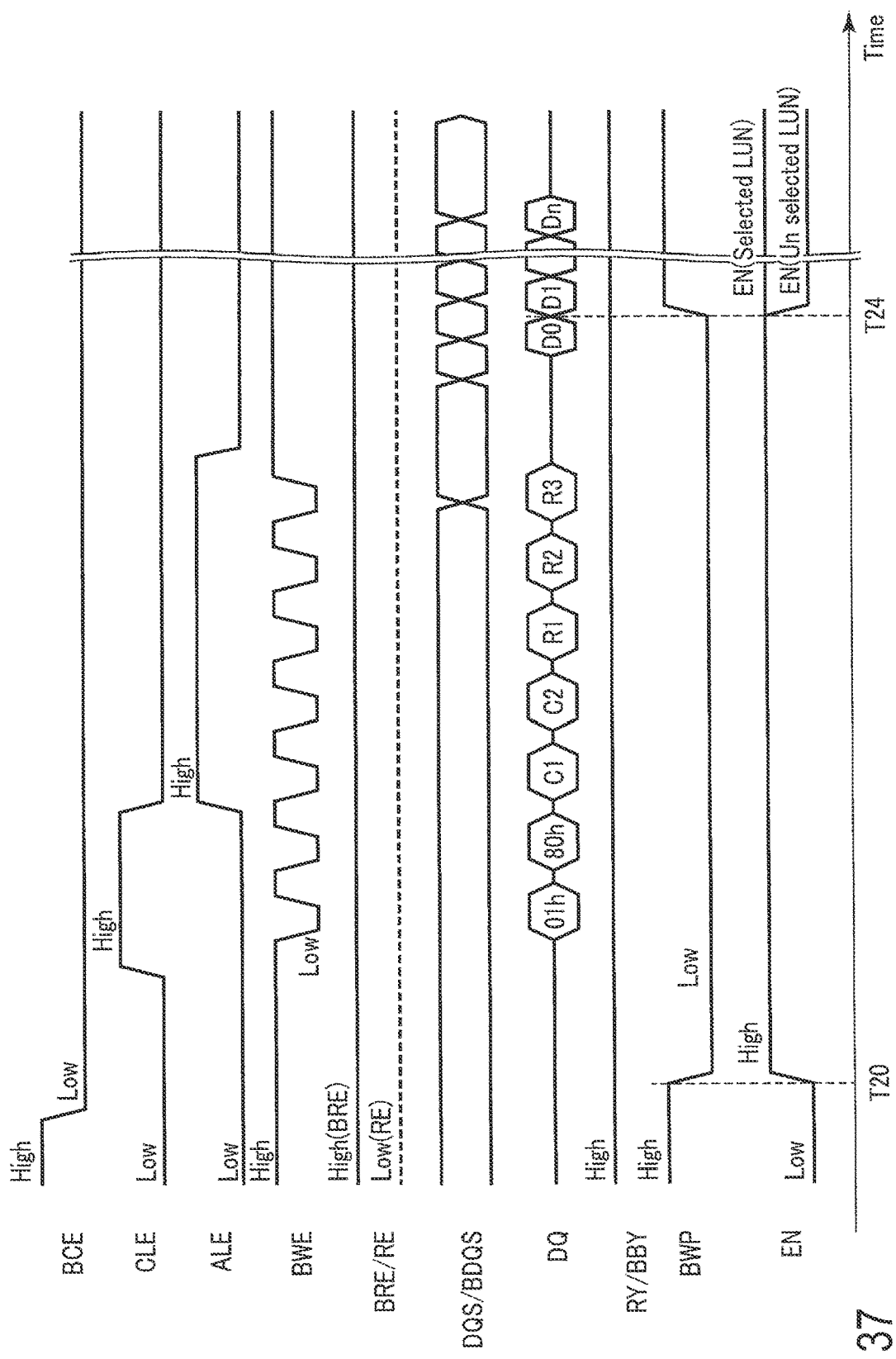
FIG. 37 is a timing chart showing a write operation example of the memory system according to the fifth embodiment.

Write operation example 7 of the memory system 1 according to the present embodiment will be described with reference to FIGS. 36 and 37. Here, a command sequence in memory group GP0 will be described.

Since the method of raising signal EN in write operation example 7 is the same as that in write operation example 6, the description thereof will be omitted. Here, the timing of lowering signal EN in each non-selected LUN 100 will be described.

For example, a selected LUN address is included in row address R3. After the address of the LUN 100 is determined, the memory controller 20 negates the write protect signal BWP ("high" level) at time T23. When the write protect signal BWP is negated, signal EN in each non-selected LUN 100 is brought to the "low" level. On the other hand, in the selected LUN 100, since the signal in the address register 105 is maintained "high", signal EN is maintained at the "high" level.

As shown in FIG. 36, signal EN in each non-selected LUN 100 may be brought to the "low" level immediately after receipt of row address R3. As shown in FIG. 37, signal EN in each non-selected LUN 100 may be brought to the "low" level at timings before and after input/output of data.

<5-2-3>Read Operation Example 5

Read operation example 5 of the memory system 1 according to the present embodiment will be described with reference to FIG. 38. Here, a command sequence in memory group GP0 will be described.

At time T25, the memory controller 20 asserts the write protect signal BWP. While the write protect signal BWP is being asserted, signal EN is maintained at the "high" level.

At time T26, which is period $t_{CALS}$ after time T25, read command "05h" is issued.

After it is determined that the operation is a read operation, the memory controller 20 negates the write protect signal BWP ("high" level) at time T27. When the write protect signal BWP is negated, signal EN in the selected LUN 100 is brought to the "low" level.

<5-2-4>Read Operation Example 6

Figure 41:
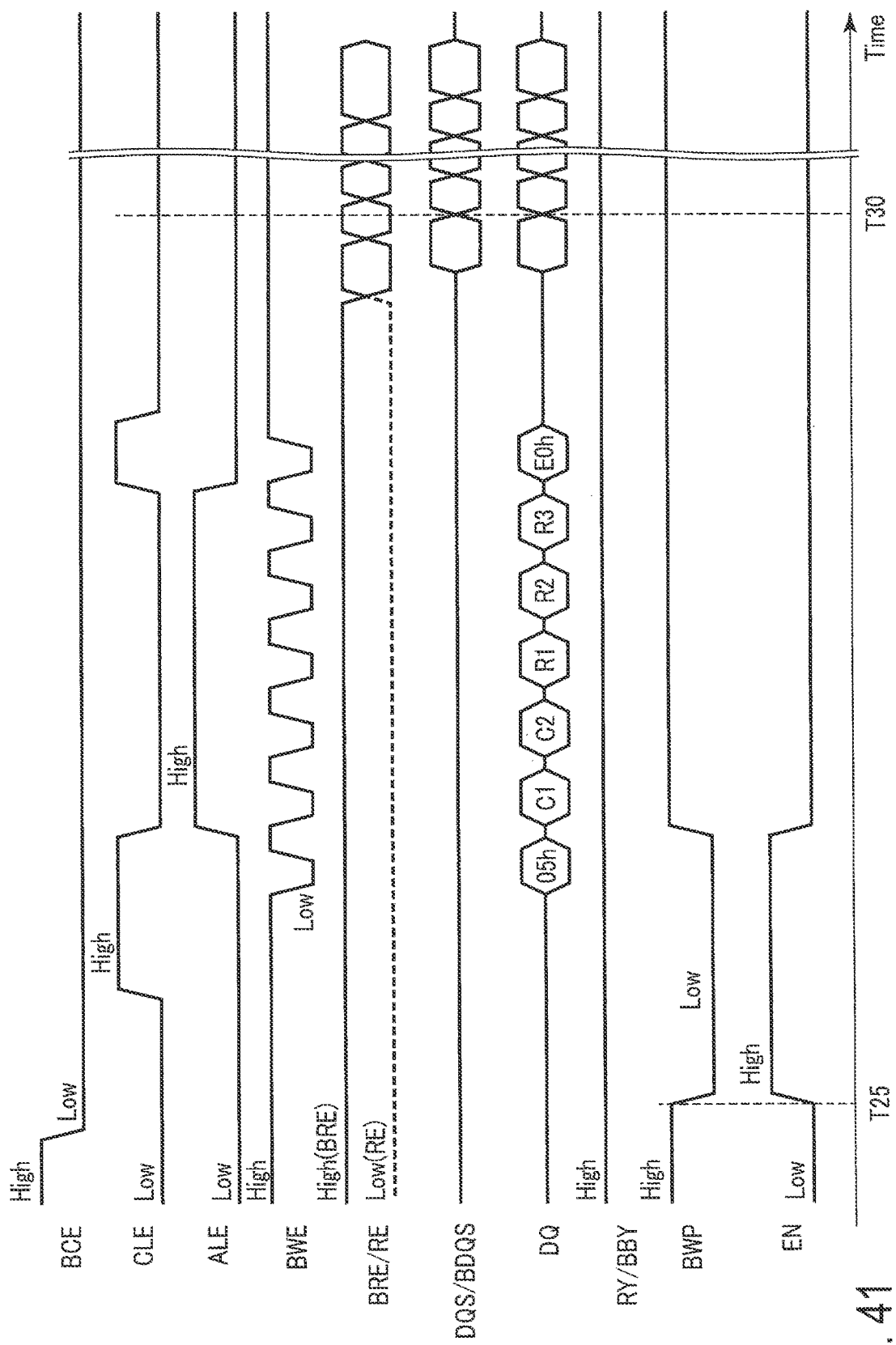
FIG. 41 is a timing chart showing a read operation example of the memory system according to the fifth embodiment.

Read operation example 6 of the memory system 1 according to the present embodiment will be described with reference to FIGS. 39 to 41. Here, a command sequence in memory group GP0 will be described.

Since the method of raising signal EN in read operation example 6 is the same as that in read operation example 5, the description thereof will be omitted. Here, the timing of lowering signal EN in the LUN 100 will be described.

After it is determined that the operation is a read operation, the memory controller 20 negates the write protect signal BWP ("high" level) at time T28. When the write protect signal BWP is negated, signal EN in the selected LUN 100 is brought to the "low" level.

As shown in FIG. 39, signal EN in the LUN 100 may be brought to the "low" level immediately after receipt of row address R3. Alternatively, as shown in FIG. 40, signal EN in the LUN 100 may be brought to the "low" level immediately after receipt of command "E0h". Alternatively, as shown in FIG. 41, signal EN in the LUN 100 may be brought to the "low" level at timings before and after input/output of data.

<5-3>Effects

According to the above-described embodiment, the same effects as those of the second embodiment can be obtained.

<5-4>Modification of Fifth Embodiment

In the fifth embodiment, signal EN is controlled using the write protect signal BWP. However, signal NP dedicated to control of signal EN may be adopted. In this case, as shown in FIG. 34, signal NP is input to the OR operation circuit 101s instead of signal /BWP. This signal NP is input from the memory controller 20 to the NAND flash memory 10.

<5-4-1>Write Operation Example 8

Write operation example 8 of the memory system 1 according to the present embodiment will be described with reference to FIG. 42. Here, a command sequence in memory group GP0 will be described.

At time T20, the memory controller 20 asserts signal NP ("high" level). While signal NP is being asserted, signal EN is maintained at the "high" level.

At time T21, which is period $t_{CALS}$ after time T20, the memory controller 20 issues write commands "01h" and "80h".

After the address of the LUN 100 is determined, the memory controller 20 negates signal NP ("low" level) at time T22. When signal NP is negated, signal EN in each non-selected LUN 100 is brought to the "low" level. On the other hand, in the selected LUN 100, since the signal in the address register 105 is maintained at "high", signal EN is maintained at the "high" level.

The other operations are the same as those described with reference to FIG. 8.

As described above, in the present embodiment, signal EN is controlled using signal NP.

<5-4-2>Write Operation Example 9

Write operation example 9 of the memory system 1 according to the present embodiment will be described with reference to FIGS. 43 and 44. Here, a command sequence in memory group GP0 will be described.

Since the method of raising signal EN in write operation example 9 is the same as that in write operation example 8, the description thereof will be omitted. Here, the timing of lowering signal EN in each non-selected LUN 100 will be described.

For example, a selected LUN address is included in row address R3. After the address of the LUN 100 is determined, the memory controller 20 negates signal NP at time T23. When signal NP is negated, signal EN in each non-selected LUN 100 is brought to the "low" level. On the other hand, in the selected LUN 100, since the signal in the address register 105 is maintained at "high", signal EN is maintained at the "high" level.

As shown in FIG. 43, signal EN in each non-selected LUN 100 may be brought to the "low" level immediately after receipt of row address R3. As shown in FIG. 44, signal EN in the non-selected LUN 100 may be brought to the "low" level at timings before and after input/output of data.

<5-4-3>Read Operation Example 7

Read operation example 7 of the memory system 1 according to the present embodiment will be described with reference to FIG. 45. Here, a command sequence in memory group GP0 will be described.

At time T25, the memory controller 20 asserts signal NP. While signal NP is being asserted, signal EN is maintained at the "high" level.

At time T26, which is period $t_{CALS}$ after time T25, read command "05h" is issued.

After it is determined that the operation is a read operation, the memory controller 20 negates signal NP at time T27. When signal NP is negated, signal EN in the selected LUN 100 is brought to the "low" level.

<5-4-4>Read Operation Example 8

Read operation example 8 of the memory system 1 according to the present embodiment will be described with reference to FIGS. 46 to 48. Here, a command sequence in memory group GP0 will be described.

Since the method of raising signal EN in read operation example 8 is the same as that in read operation example 7, the description thereof will be omitted. Here, the timing of lowering signal EN in the LUN 100 will be described.

After it is determined that the operation is a read operation, the memory controller 20 negates signal NP at time T28. When signal NP is negated, signal EN in the selected LUN 100 is brought to the "low" level.

Figure 46:
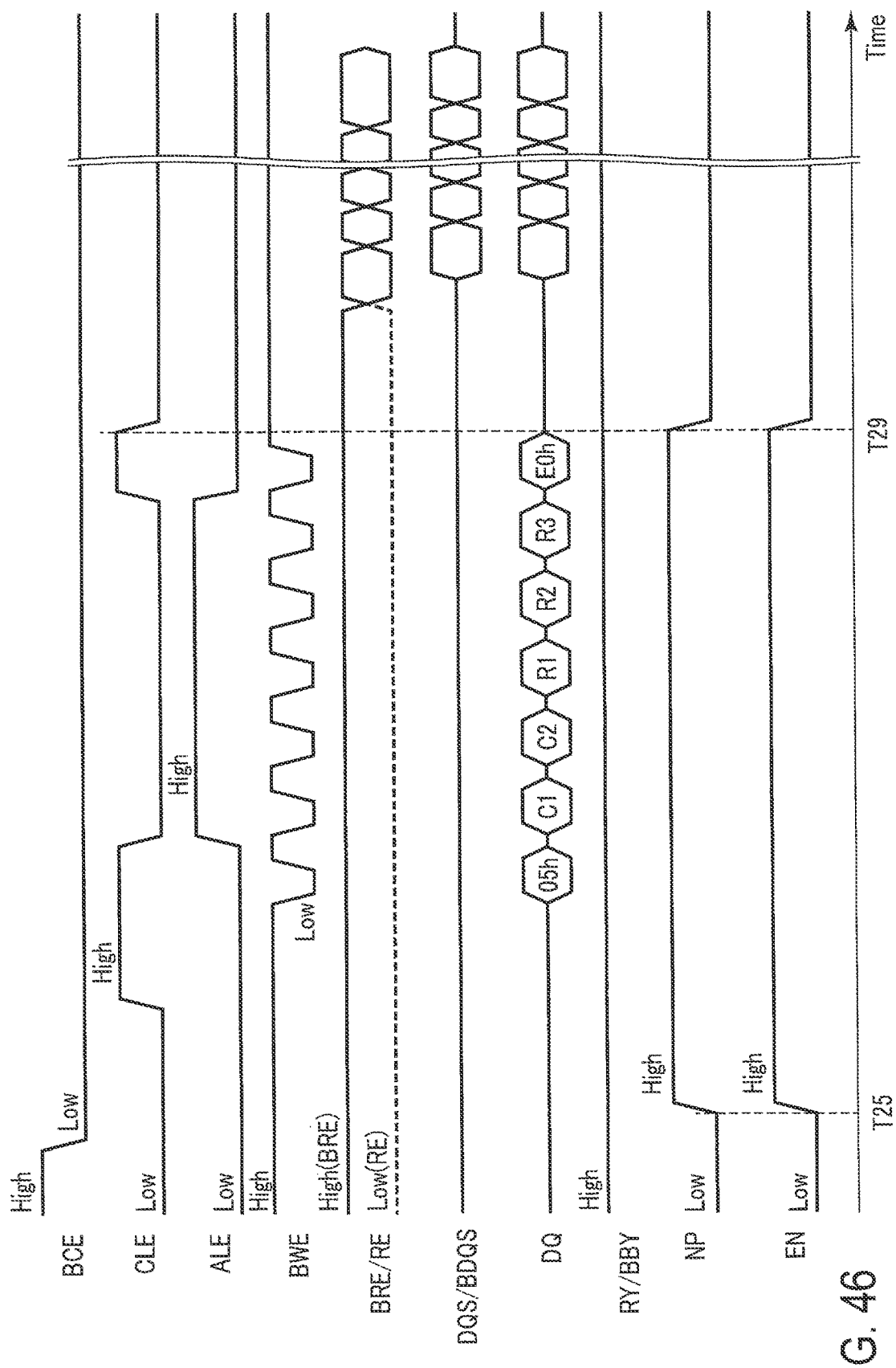
FIG. 46 is a timing chart showing a read operation example of the memory system according to the modification of the fifth embodiment.

As shown in FIG. 46, signal EN in the LUN 100 may be brought to the "low" level immediately after receipt of row address R3. Alternatively, as shown in FIG. 47, signal EN in the LUN 100 may be brought to the "low" level immediately after receipt of command "E0h". Alternatively, as shown in FIG. 48, signal EN in the LUN 100 may be brought to the "low" level at timings before and after input/output of data.

<6>Sixth Embodiment

The sixth embodiment will be described. In the sixth embodiment, another configuration of the input/output interface will be described. The basic configuration and basic operation of the memory device according to the sixth embodiment are the same as those of the memory devices according to the above-described first and fifth embodiments. Thus, descriptions of matters described in the first and fifth embodiments and matters inferable from the first and fifth embodiments will be omitted.

<6-1>Configuration of Input/Output Interface

As shown in FIG. 49, the input/output interface 101 of the memory system 1 according to the first embodiment may be combined with the input/output interface 101 of the memory system 1 according to the fifth embodiment.

Furthermore, as shown in FIG. 49, the switch circuit 101*t* enables selection of which of signal EN of the input/output interface 101 of the memory system 1 according to the first embodiment and signal EN of the input/output interface 101 of the memory system 1 according to the fifth embodiment is to be used. For example, selection of an output signal is enabled by signal MS being generated by a "Set Feature" operation or the like, and being input to the switch circuit 101*t*. The "Set Feature" operation is the same as the operation described with reference to FIG. 30.

<7>Seventh Embodiment

The seventh embodiment will be described. In the seventh embodiment, another configuration of the receiver will be described. The basic configuration and basic operation of the memory device according to the seventh embodiment are the same as those of the memory devices according to the above-described first to sixth embodiments. Thus, descriptions of matters described in the first to sixth embodiments and matters inferable from the first to sixth embodiments will be omitted. The receiver to be described below can be applied to each of the above-described embodiments.

<7-1>Configuration of Receiver

Figure 50:
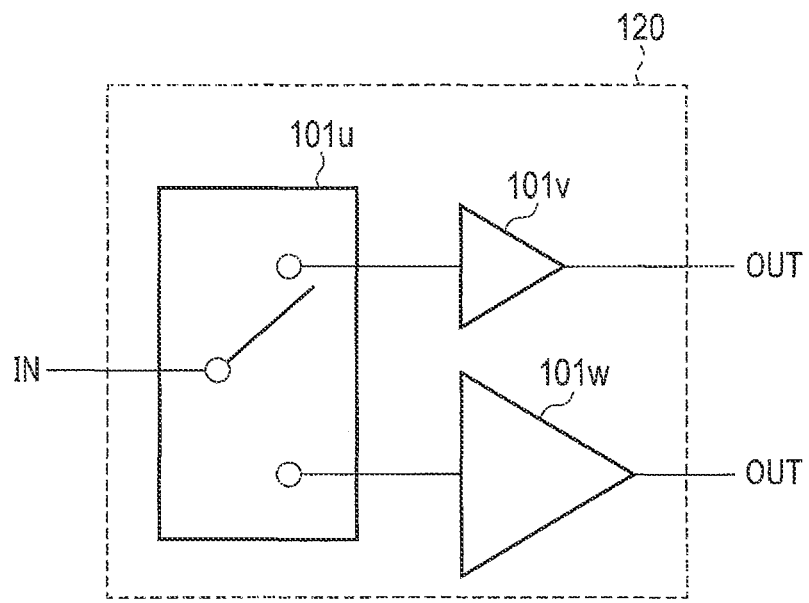
FIG. 50 is a circuit diagram showing the receiver of the memory system according to the seventh embodiment.

Another example of the receiver 120 will be described with reference to FIG. 50.

For example, from the standpoint of reducing power consumption, it is preferable to suppress the current consumption during standby (when data is not exchanged). Therefore, in the present embodiment, the receiver 120 includes: a first receiver 101*v* which cannot operate at high speed but has low current consumption; a second receiver 101*w* which can operate at high speed but has high current consumption; and a switch circuit 101*u* which selects coupling of the first receiver 101*v* and the second receiver 101*w*.

When signal EN is at the "low" level, the switch circuit 101*u* couples the data input/output lines to the first receiver 101*v*, whereas when signal EN is at the "high" level, the switch circuit 101*u* couples the data input/output lines to the second receiver 101*w*.

<7-2>Configuration of First Receiver

A circuit example of the first receiver 101*v* will be described with reference to FIG. 51.

Figure 51:
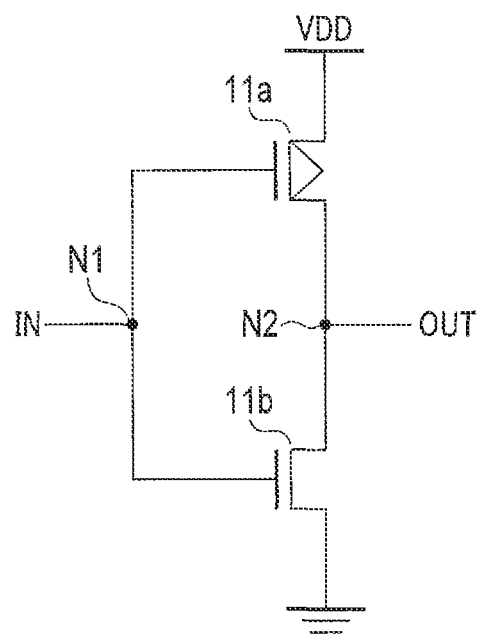
FIG. 51 is a circuit diagram showing the first receiver of the memory system according to the seventh embodiment.

As shown in FIG. 51, the first receiver 101*v* includes an inverter including a PMOS transistor 11*a* and an NMOS transistor 11*b*.

The PMOS transistor 11*a* has a source to which a source voltage VDD is applied, a drain coupled to the output terminal (node N2), and a gate coupled to the input terminal (node N1). The NMOS transistor 11*b* has a drain coupled to the output terminal (node N2), a source coupled to the ground potential, and a gate coupled to the input terminal (node N1).

That is, the first receiver 101*v* outputs a "high"-level signal from the output terminal when the input signal is at the "low" level, and outputs a "low"-level signal from the output terminal when the input signal is at the "high" level.

<7-3>Configuration of Second Receiver

A circuit example of the second receiver 101*w* will be described with reference to FIG. 52.

Figure 52:
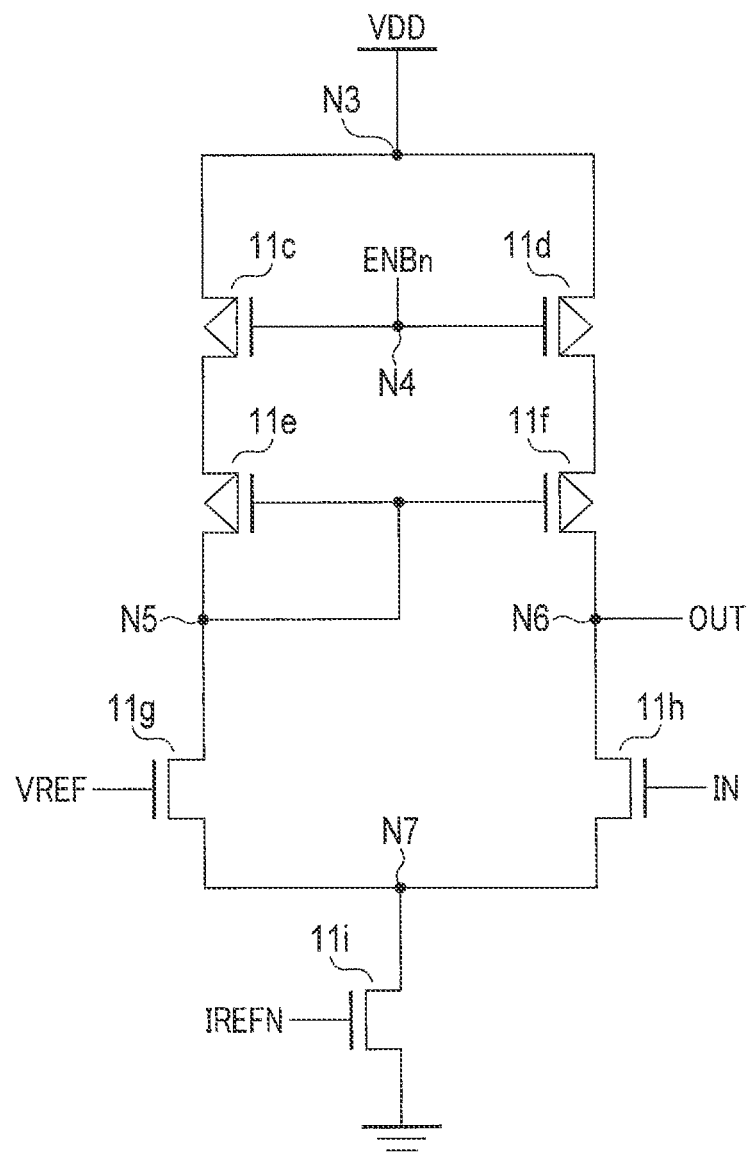
FIG. 52 is a circuit diagram showing the second receiver of the memory system according to the seventh embodiment.

As shown in FIG. 52, the second receiver 101*w* includes a mirror circuit including PMOS transistors 11*c*, 11*d*, 11*e*, and 11*f*, and NMOS transistors 11*g*, 11*h*, and 11*i*.

PMOS transistor 11*c* has a source to which the source voltage VDD is applied, and a gate to which signal ENBn (an inversion signal of signal EN) is input. PMOS transistor 11*c* allows current to flow therethrough when signal ENBn is at the "low" level.

PMOS transistor 11*e* has a source coupled to the drain of PMOS transistor 11*c*, and a drain and a gate coupled to each other.

PMOS transistor 11*d* has a source to which the source voltage VDD is applied, and a gate to which signal ENBn is input. PMOS transistor 11*d* allows current to flow therethrough when signal ENBn is at the "low" level.

PMOS transistor 11*f* has a source coupled to the drain of PMOS transistor 11*d*, a drain coupled to the output terminal (node N6), and a gate coupled to node N5. The same current as that flowing in PMOS transistor 11*e* flows in PMOS transistor 11*f*.

NMOS transistor 11*g* has a drain coupled to node N5, a source coupled to node N7, and a gate to which reference voltage VREF is applied. NMOS transistor 11*g* allows the reference voltage to flow therethrough.

NMOS transistor 11*h* has a drain coupled to the output terminal (node N6), a source coupled to node N7, and a gate coupled to the input terminal.

NMOS transistor 11*i* has a drain coupled to node N7, a source coupled to the ground potential, and a gate to which reference voltage IREFN is applied. NMOS transistor 11*i* functions as a constant current source.

That is, the first receiver 101*w* outputs a "high"-level signal from the output terminal when signal ENBn is at the "low" level, and the input signal is at the "low" level, and outputs a "low"-level signal from the output terminal when signal ENBn is at the "low" level, and the input signal is at the "high" level.

<8>Additional Notes

FIG. 53 shows the conditions for raising signal EN (for activating all the LUNs 100) in each of the above-described embodiments.

In the above-described embodiments, various timings of lowering signal EN are described, but the timing is not limited to the above-described ones, and can be changed as appropriate. Specifically, signal EN may be lowered at any timing before or after data input/output is started. The consumption of unnecessary current by the non-selected LUNs or that by the LUNs at the time of the read operation can be thereby suppressed.

Furthermore, in each embodiment relating to the present invention:

(1) Regarding the read operation,
the voltage applied to a selected word line in an A level read operation is, for example, in the range from 0V to 0.55V. The range of the voltage is not limited to this, and may be any one of the range from 0.1V to 0.24V, the range from 0.21V to 0.31V, the range from 0.31V to 0.4V, the range from 0.4V to 0.5V, or the range from 0.5V to 0.55V.

The voltage applied to a selected word line in a B level read operation is, for example, in the range from 1.5V to 2.3V. The range of the voltage is not limited to this, and may be any one of the range from 1.65V to 1.8V, the range from 1.8V to 1.95V, the range from 1.95V to 2.1V, or the range from 2.1V to 2.3V.

The voltage applied to a selected word line in a C level read operation is, for example, in the range from 3.0V to 4.0V. The range of the voltage is not limited to this, and may be any one of the range from 3.0V to 3.2V, the range from 3.2V to 3.4V, the range from 3.4V to 3.5V, the range from 3.5V to 3.6V, or the range from 3.6V to 4.0V.

The read operation time (tR) may be, for example, in the range from 25 µs to 38 µs, the range from 38 µs to 70 µs, or the range from 70 µs to 80 µs.

(2) The write operation includes the program operation and the verify operation as described above. In the write operation, The voltage first applied to a selected word line in the program operation is, for example, in the range from 13.7V to 14.3V. The range of the voltage is not limited to this, and may be either the range from 13.7V to 14.0V or the range from 14.0V to 14.6V.

The voltage first applied to a selected word line when writing an odd-numbered word line may differ from the voltage first applied to a selected word line when writing an even-numbered word line.

When the incremental step pulse program (ISPP) method is used for the program operation, the voltage may be stepped up by approximately 0.5V, for example.

The voltage applied to a non-selected word line is, for example, in the range from 6.0V to 7.3V. The range of the voltage is not limited to this, and may be the range from 7.3V to 8.4V, or not greater than 6.0V.

The applied pass voltage may be changed depending on whether the non-selected word line is an odd-number word line or an even-number word line.

The time (tProg) for the write operation may be, for example, in the range from 1700 µs to 1800 µs, the range from 1800 µs to 1900 µs, or the range from 1900 µs to 2000 µs.

(3) In the erase operation,
the voltage first applied to a well, which is formed in an upper part of the semiconductor substrate and above which the memory cell is provided is, for example, in the range from 12V to 13.6V. The range of the voltage is not limited to this, and may be, for example, in the range from 13.6V to 14.8V, the range from 14.8V to 19.0V, the range from 19.0V to 19.8V, or the range from 19.8V to 21V. The erase operation time (tErase) may be, for example, in the range from 3000 µs to 4000 µs, the range from 4000 µs to 5000 µs, or the range from 4000 µs to 9000 µs.

(4) The structure of the memory cell includes
a charge accumulation layer provided on the semiconductor substrate (silicon substrate) via a tunnel insulation film having a thickness in the range from 4 to 10 nm. The charge accumulation layer may have a stacked structure of an insulation film of SiN or SiON having a thickness in the range from 2 to 3 nm and polysilicon having a thickness in the range from 3 to 8 nm. The polysilicon may include a metal such as Ru. An insulation film in provided on the charge accumulation layer. This insulation film includes a silicon dioxide film having a thickness in the range from 4 to 10 nm, which is interposed between a lower High-k film having a thickness in the range from 3 to 10 nm and a higher High-k film having a thickness in the range from 4 to 10 nm, for example. An example of the High-k film is HfO. The thickness of the silicon dioxide film may be greater than that of the High-k film. On the insulation film, a control electrode having a thickness in the range from 30 nm to 70 nm is formed via a material having a thickness in the range from 3 to 10 nm. The material for adjusting the work function is a metal-oxide film such as TaO and a metal-nitride film such as TaN. For example, W may be used for the control electrode.

In addition, an air gap may be formed between memory cells.

Embodiments of the present invention have been described above; however, the present invention is not limited to the above-described embodiments, and can be variously modified in practice without departing from the spirit of the invention. Furthermore, the above-described embodiments include inventions at various stages, and various inventions are extracted by appropriately combining the disclosed structural elements. For example, even if some structural elements are deleted from the disclosed structural elements, the resultant structure can be extracted as an invention as long as a predetermined effect can be obtained.

What is claimed is:

1. A memory device, comprising:
   a memory cell array configured to store data;
   a data input and output interface to which a command, an address, and data to be written into the memory cell array are input from an external controller, and from which data read from the memory cell array is output to the external controller;
   a transmitter connected to the data input and output interface and configured to be driven with an enable signal; and
   a control circuit configured to cause the memory cell array to perform a read operation in response to receipt of a read command while a first control signal is being asserted and receipt of a read address subsequent to the read command while a second control signal is being asserted,
   wherein the enable signal is brought into a first level upon a concurrent assertion of the first control signal and the second control signal before receipt of the read command, and is maintained at the first level at least after the read command is received, and wherein the first level is different from a level of the enable signal after the read command is received.

2. The memory device according to claim 1, further comprising:

a command register configured to store a command; and an address register configured to store an address, wherein the first control signal comprises a signal for causing the command register to store the command, and wherein the second control signal comprises a signal for causing the address register to store the address.

3. The memory device according to claim 2, wherein the enable signal is brought into the first level based on a first logical operation result, the first logical operation being a logical operation between a command and a second logical operation result, and the second logical operation result being a logical operation between the first control signal and the second control signal.

4. The memory device according to claim 3, wherein the logical operation of the first logical operation result is a Reset and Set flip flop, and wherein the logical operation of the second logical operation result is a NAND gate.

5. The memory device according to claim 1, wherein the transmitter outputs the data read from the memory cell array via the data input and output interface.

6. The memory device according to claim 5, wherein the data read from the memory cell array are transmitted via the data input and output interface along with a data strobe signal.

7. The memory device according to claim 6, wherein the enable signal is brought into the first level upon toggle of a third control signal while the first control signal and the second control signal are concurrently asserted.

8. The memory device according to claim 7, further comprising:

a command register configured to store a command; and an address register configured to store an address, wherein the first control signal comprises a signal for causing the command register to store a command, wherein the second control signal comprises a signal for causing the address register to store an address, and wherein the third control signal comprises a signal for causing the memory device to take a command or data therein.

9. The memory device according to claim 1, wherein the control circuit performs the read operation in response to receipt of the read command and the read address subsequent thereto along with a falling edge or a rising edge of a third command signal.

10. A memory device, comprising:

a memory cell array configured to store data;

a data input and output interface to which a command, an address, and data to be written into the memory cell array are input from an external controller, and from which data read from the memory cell array is output to the external controller;

a receiver connected to the data input and output interface and configured to be driven with an enable signal; and a control circuit configured to cause the memory cell array to perform a write operation in response to receipt of a write command while a first control signal is being asserted, receipt of a write address subsequent to the write command while a second control signal is being asserted, and receipt of the data to be written into the memory cell array subsequent to the write address while neither of the first control signal and the second control signal is being asserted, wherein the enable signal is brought into a first level upon a concurrent assertion of the first control signal and the second control signal before receipt of the write command, and is maintained at the first level at least after the write command is received.

11. The memory device according to claim 10, further comprising:

a command register configured to store a command; and an address register configured to store an address, wherein the first control signal comprises a signal for causing the command register to store the command, and wherein the second control signal comprises a signal for causing the address register to store the address.

12. The memory device according to claim 11, wherein the enable signal is brought into the first level based on a first logical operation result, the first logical operation being a logical operation between a command and a second logical operation result, and the second logical operation result being a logical operation between the first control signal and the second control signal.

13. The memory device according to claim 12, wherein the logical operation of the first logical operation result is a Reset and Set flip flop, and wherein the logical operation of the second logical operation result is a NAND gate.

14. The memory device according to claim 10, wherein the receiver receives the data to be written into the memory cell array via the data input and output interface.

15. The memory device according to claim 14, wherein the data to be written into the memory cell array are received via the data input and output interface along with a data strobe signal.

16. The memory device according to claim 15, wherein the enable signal is brought into the first level upon toggle of a third control signal while the first control signal and the second control signal are concurrently asserted.

17. The memory device according to claim 16, further comprising:

a command register configured to store a command; and an address register configured to store an address, wherein the first control signal comprises a signal for causing the command register to store a command, wherein the second control signal comprises a signal for causing the address register to store an address, and wherein the third control signal comprises a signal for causing the memory device to take a command or data therein.

18. The memory device according to claim 10, wherein the first level is different from a level of the enable signal after the write command is received.

19. The memory device according to claim 18, wherein the control circuit performs the write operation in response to receipt of the write command and the write address subsequent thereto along with a falling edge or a rising edge of a third command signal.

20. A memory device, comprising:

a memory cell array configured to store data;

a data input and output interface to which a command, an address, and data to be written into the memory cell array are input from an external controller, and from which data read from the memory cell array is output to the external controller;

a transmitter connected to the data input and output interface and configured to be driven with an enable signal;
a control circuit configured to cause the memory cell array to perform a read operation in response to receipt of a read command while a first control signal is being asserted and receipt of a read address subsequent to the read command while a second control signal is being asserted;
a command register configured to store a command; and
an address register configured to store an address,
wherein:
the enable signal is brought into a first level upon a concurrent assertion of the first control signal and the second control signal before receipt of the read command, and is maintained at the first level at least after the read command is received,
the first level is different from a level of the enable signal after the read command is received,
the first control signal comprises a signal for causing the command register to store a command, and
the second control signal comprises a signal for causing the address register to store an address.

* * * * *